US012787205B2

(12) United States Patent
Crisp et al.

(10) Patent No.: US 12,787,205 B2
(45) Date of Patent: Nov. 3, 2026

(54) MULTI-RACK-UNIT-DEVICE RACK COUPLING SYSTEM

(71) Applicant: Dell Products L.P., Round Rock, TX (US)

(72) Inventors: Richard Andrew Crisp, Austin, TX (US); Corey Dean Hartman, Hutto, TX (US); Matthew Bryan Gilbert, Bend, OR (US); Kevin Warren Mundt, Austin, TX (US); Peter Kaltenbach, Austin, TX (US); Kevin Keller, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 310 days.

(21) Appl. No.: 18/419,986

(22) Filed: Jan. 23, 2024

(65) Prior Publication Data

US 2025/0240907 A1 Jul. 24, 2025

(51) Int. Cl.

*H05K 7/14* (2006.01)
*H05K 7/18* (2006.01)

(52) U.S. Cl.

CPC ......... *H05K 7/1489* (2013.01); *H05K 7/1405* (2013.01); *H05K 7/18* (2013.01)

(58) Field of Classification Search

CPC .. H05K 7/1489; H05K 7/1487; H05K 7/1492; H05K 5/0221; H05K 5/023; H05K 7/1488; H05K 7/1409; H05K 7/1411; H05K 7/20172; H05K 5/03; H05K 7/18; H05K 7/183; H05K 7/1401; H05K 7/16; H05K 7/1485; H05K 5/0208; H05K 7/14; H05K 7/1417; H05K 7/1405; H05K 7/1425; H05K 5/0204; H05K 7/1415; H05K 7/1408; H05K 7/1421; H05K 7/1427; H05K 7/1439; G06F 1/187; G06F 1/181; G06F 1/185; G06F 1/184

See application file for complete search history.

(56) References Cited

U.S. PATENT DOCUMENTS 6,181,549 B1 * 1/2001 Mills .................... H05K 7/1489 292/228
6,574,100 B1 * 6/2003 Anderson ............... G06F 1/181 312/236

(Continued)

*Primary Examiner* — Gage Crum
(74) *Attorney, Agent, or Firm* — Joseph Mencher

(57) ABSTRACT

A multi-rack-unit-device rack coupling system includes a rack defining first and second 1RU device housings located immediately adjacent each other. A first multi-rack-unit-device rack coupling subsystem is coupled to the rack adjacent the first 1RU device housing, and includes a first moveable device securing member that engages a multi-RU device to secure the multi-RU device to the rack when the multi-RU device is moved into the first and second 1RU device housings. A second multi-rack-unit-device rack coupling subsystem is coupled to the rack adjacent the second 1RU device housing, and includes a second moveable device securing member that, in response to engagement with the multi-RU device when the multi-RU device is moved into the first and second 1RU device housings, moves in order to allow the multi-RU device to be secured to the rack via the first moveable device securing member on the first multi-rack-unit-device rack coupling subsystem.

20 Claims, 49 Drawing Sheets

(56) References Cited

U.S. PATENT DOCUMENTS

| | | | | |
|---|---|---|---|---|
| 6,669,029 | B1 * | 12/2003 | Beane | H05K 7/183 108/108 |
| 8,737,078 | B2 * | 5/2014 | Zhang | G06F 1/181 361/725 |
| 9,010,887 | B1 * | 4/2015 | Shao | H05K 7/1489 312/319.1 |
| 9,894,796 | B1 * | 2/2018 | Christenson | H05K 7/1489 |
| 11,576,277 | B2 * | 2/2023 | Chen | H05K 7/1489 |
| 11,659,680 | B2 * | 5/2023 | Lu | H05K 7/1489 361/679.02 |
| 11,665,840 | B1 * | 5/2023 | O'Donnell | H05K 7/1409 361/801 |
| 12,408,285 | B2 * | 9/2025 | Clark | E05C 5/02 |
| 2007/0158280 | A1 * | 7/2007 | Cox | H05K 7/1488 211/26 |
| 2010/0140195 | A1 * | 6/2010 | Henderson | H05K 7/1489 211/13.1 |
| 2010/0200523 | A1 * | 8/2010 | Henderson | H05K 7/18 211/26 |
| 2012/0300410 | A1 * | 11/2012 | Peng | H05K 7/1489 361/727 |
| 2014/0138336 | A1 * | 5/2014 | Wanatabe | H05K 7/18 211/183 |
| 2014/0144858 | A1 * | 5/2014 | Yokosawa | H05K 7/183 211/182 |
| 2016/0291645 | A1 * | 10/2016 | Alvarado | G06F 1/183 |
| 2022/0386500 | A1 * | 12/2022 | Klaba | H05K 7/1489 |

* cited by examiner

MULTI-RACK-UNIT-DEVICE RACK COUPLING SYSTEM

BACKGROUND

The present disclosure relates generally to information handling systems, and more particularly to coupling information handling systems with multi-rack-unit heights to a rack.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices (e.g., switch devices), and/or storage systems are sometimes housed in racks. Conventional racks such as Electronic Industries Alliance 310 D (EIA-310-D) racks have been provided with a 19-inch width for housing "19-inch" server devices, networking devices, and storage systems, but new racks are being introduced with larger widths in order to accommodate larger server devices, networking devices, and storage systems. For example, the Open Compute Project (OCP) has introduced the Open Rack version 3 (ORv3) that is provided with a 21-inch width that is capable of housing "21-inch" server devices, networking devices, and storage systems. However, as users transition to such larger racks, the use of 19-inch server devices, networking devices, and storage systems will continue. Conventional adapter systems exist that allow a single 19-inch width server device to be housed in a 21-inch width rack, but such conventional adapters are complex and cumbersome to deploy and result in relatively large amounts of packaging waste, particularly when utilized with a relatively large number of server devices. For example, for any Rack Unit (RU) slot in a conventional ORv3 rack that will house a device having a 19 inch width, ORv3 rails must be provided on the ORv3 rack for that RU slot, a conversion shelf must be mounted to those ORv3 rails, and a device rail system must then be mounted to that conversion shelf in order to allow a single 19-inch server device to be coupled to the ORv3 rack.

Furthermore, may be desirable to house devices with different "Rack Unit" (RU) heights (e.g., 1RU, 2RU, 3RU, 4RU, and higher RU height devices) in any of the racks discussed above, and the coupling of such different RU height devices to a rack can raise issues. For example, 1RU height devices ("1RU devices") are conventionally coupled to 1RU height housings ("1RU housings) in racks via the use of 1RU rack rails that each mount to opposite sides of the rack adjacent a 1RU housing, and that each receive device rails on a 1RU device, with the 1RU rack rails including static securing hooks that engage securing subsystems (also called "slam latches") on their 1RU device to secure that 1RU device to the rack when it is fully positioned in the rack (i.e., when the device rails on that 1RU device are fully received by the 1RU rack rails on the rack).

When 2RU height devices ("2RU devices") are to be housed in the rack, they must utilize a pair of adjacent 1RU housings on the rack that will typically each include respective 1RU rack rails mounted adjacent them on the rack. However, the securing subsystem on conventional 2RU devices is only configured to engage a single static securing hook like those included on the 1RU rack rails discussed above, and thus the static securing hook on one of the 1RU rack rails provided adjacent the pair of 1RU housings on the rack that will be utilized by the 2RU device will engage a surface of the 2RU device and prevent it from being moved fully into the rack to allow it to be secured to the rack by the other of the 1RU rack rails provided adjacent the pair of 1RU housings on the rack that will be utilized by the 2RU device.

One conventional solution to such issues include the removal of one of the respective 1RU rack rails that are provided adjacent the pair of 1RU housings in the rack that will be utilized by the 2RU device, which allows the 2RU device to be moved fully into the adjacent pair of 1RU housings and secured to the rack (e.g., via engagement of its securing subsystem and the static securing hook on the 1RU rack rails that remain in the rack adjacent the pair of 1RU housings) without interference from the statis securing hook on the 1RU rack rails that were removed from the rack. However, such solutions are time consuming, aesthetically unpleasing (e.g., they result in the introduction of "gaps" in the rack rails provided on the rack), and can result in loss or misplacement of the 1RU rack rails that are removed from the rack. Another conventional solution to such issues includes the provisioning of 2RU rack rails that may replace the respective 1RU rack rails provided adjacent each of the pair of 1RU housings in the rack that will be utilized by the 2RU device, as such 2RU rack rails are provided with only a single static securing hook for securing the 2RU device to the rack. However, the need to have different rack rails for each RU height device that will be used in the rack is costly, and the need to swap out different RU height rack rails for different RU devices is time consuming.

Accordingly, it would be desirable to provide a multi-rack-unit-device rack coupling system that addresses the issues discussed above.

SUMMARY

According to one embodiment, a multi-rack-unit-device rack coupling subsystem includes a base; a rack coupling subsystem that is provided on the base and that is configured to couple the base to a rack; a securing member aperture defined by the base; and a moveable device securing member that extends from the base via the securing member aperture, wherein the moveable device securing member is configured, when the base is coupled to the rack adjacent a first 1 Rack Unit (1RU) device housing that is defined by the rack immediately adjacent a second 1RU device housing that is defined by the rack, to: engage a 1RU device to secure the 1RU device to the rack when the 1RU device is moved into the first 1RU device housing; engage a multi-Rack Unit (multi-RU) device to secure the multi-RU device to the rack when the multi-RU device is moved into the first 1RU device housing and the second 1RU device housing with a securing subsystem on the multi-RU device located in the first 1RU device housing; and move, in response to engagement with the multi-RU device when the multi-RU device is moved into the first 1RU device housing and the second 1RU device housing with the securing subsystem on the multi-RU device located in the second 1RU device housing, such that moveable device securing member no longer extends from the base via the securing member aperture and allows the multi-RU device to be secured to the rack.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
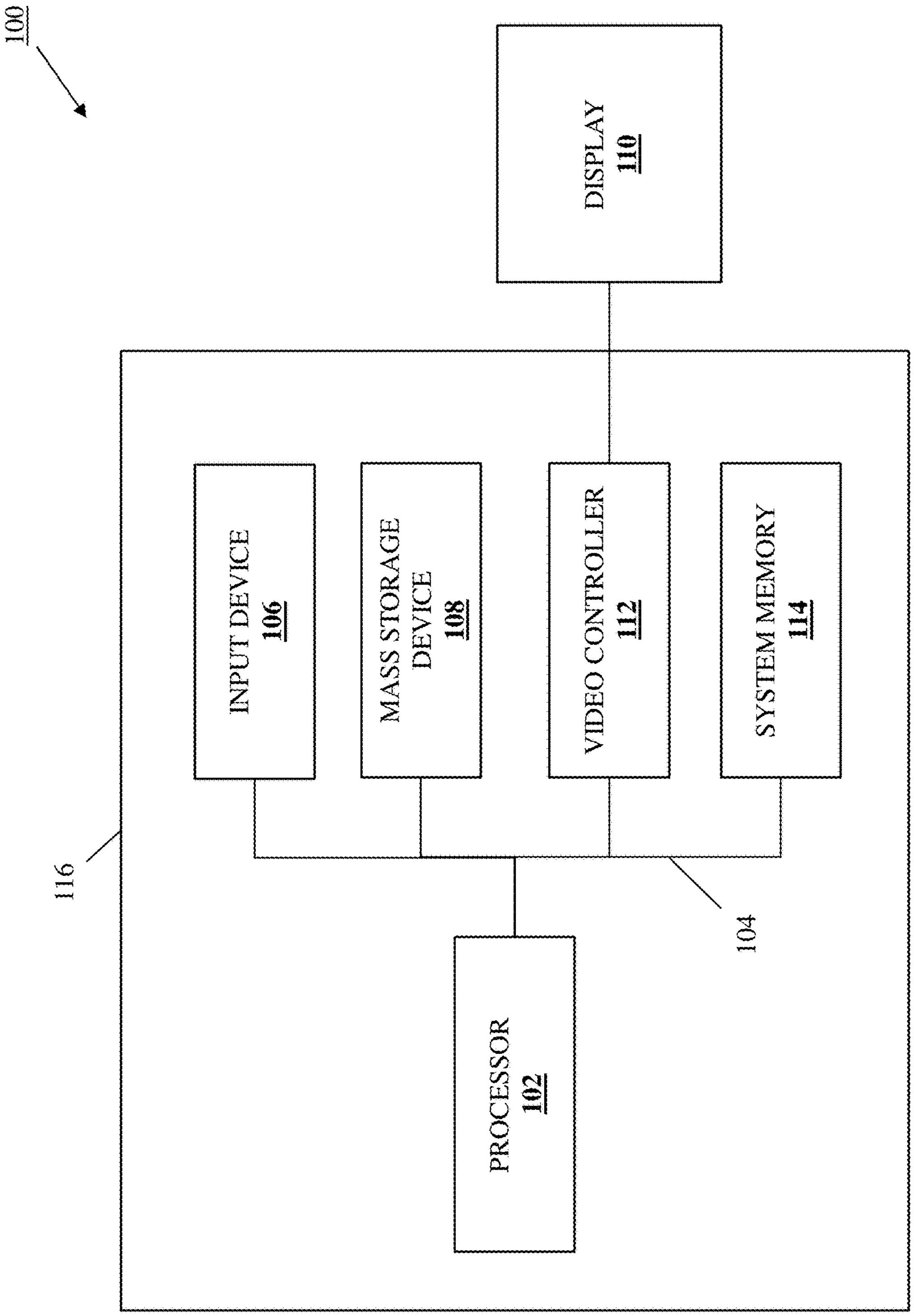
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
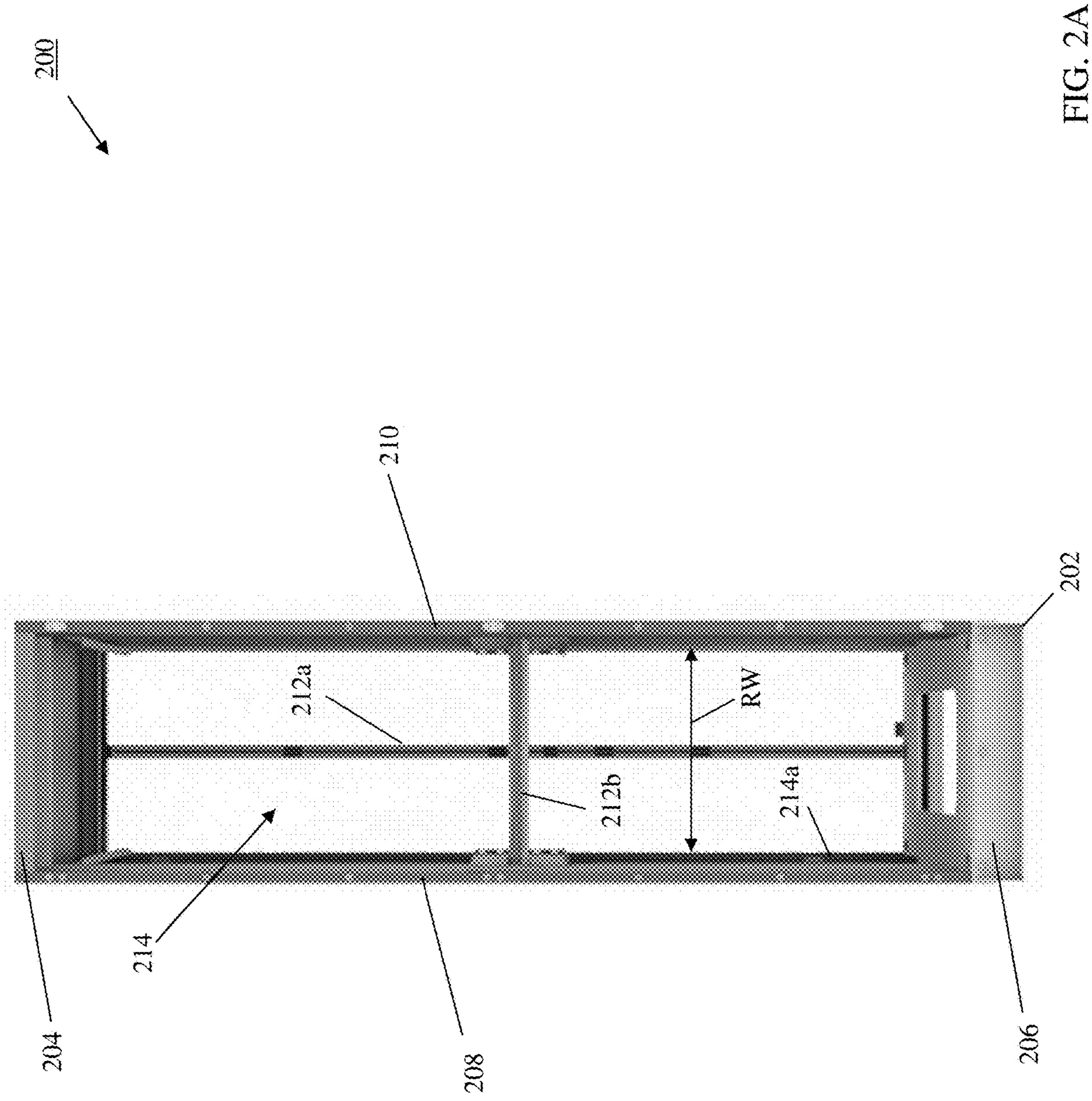
FIG. 2A is a front perspective view illustrating an embodiment of a rack that may be used with the multi-device rack width adapter system of the present disclosure.
Figure 2B:
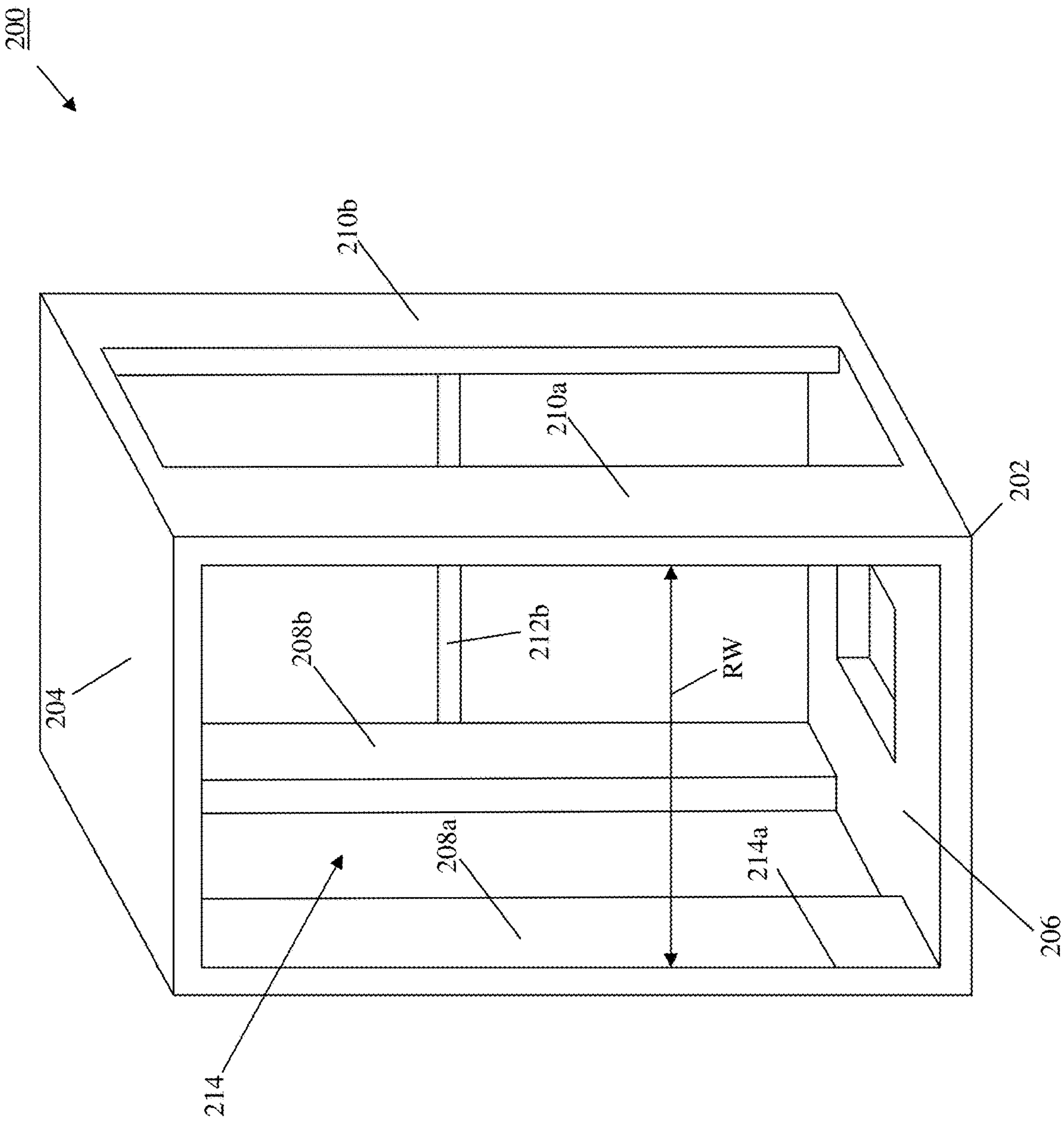
FIG. 2B is a perspective view illustrating an embodiment of the rack of FIG. 2A.

Referring now to FIGS. 2A and 2B, an embodiment of a rack 200 is illustrated that may be used with the multi-device rack width adapter system of the present disclosure. In the embodiments illustrated and described below, the rack 200 is provided by an Open Compute Project (OCP) Open Rack version 3 (ORv3) rack having dimensions defined in the ORv3 Base Specification that may include a rack width 21 inches that is configured to house “21-inch” server devices, networking devices, and/or storage systems as described below. However, while a specific rack including a specific width is illustrated and described below, one of skill in the art in possession of the present disclosure will appreciate how other racks having other widths may be utilized with the multi-device rack width adapter system of the present disclosure to adapt those racks to house devices that are dimensioned to be housed in conventional racks (e.g., that are configured to house “19-inch” server devices, networking devices, and/or storage systems) while remaining within the scope of the present disclosure as well.

With reference to FIGS. 2A and 2B, the rack 200 includes a base 202 having a top wall 204, a bottom wall 206 that is located opposite the base 202 from the top wall 204, a first side 208 that extends between the top wall 204 and the bottom wall 206 and that is provided by a plurality of vertical supports 208*a* and 208*b* in the illustrated example, and a second side 210 that is located opposite the base 202 from the first side 208, that extends between the top wall 204 and the bottom wall 206, and that is provided by a plurality of vertical supports 210*a* and 210*b* in the illustrated example. In the illustrated embodiment, a bus bar 212*a* and bus bar support 212*b* are included on a rear of the base 202 and extend between the top wall 204, the bottom wall 206, the first side 208, and the second side 210. A rack housing 214 is defined between the top wall 204, the bottom wall 206, the sides 208 and 210 (i.e., the vertical supports 208*a*/208*b* and 210*a*/210*b*), and the bus bar 212*a* and bus bar support 212*b*, with a rack housing entrance 214*a* defined by a "front" surface of the top wall 204, the bottom wall 206, and the vertical supports 208*a* and 210*a* that is located opposite the base 202 from the bus bar 212*a* and bus bar support 212*b*.

As illustrated, the base 202 of the rack 200 defines a rack width RW between the first side 208 and the second side 210 of the base 202. As described below, the rack width RW may be configured to house "21-inch" devices that one of skill in the art in possession of the present disclosure will recognize may be configured to be housed in racks like the ORv3 rack described above, but one of skill in the art in possession of the present disclosure will appreciate how the actually measurement of the width of such devices or racks may vary. In an embodiment, the devices that will be housed in the rack 200 may be provided by the IHS 100 discussed above with reference to FIG. 1, and/or may include some or all of the components of the IHS 100, and in specific examples may be provided by server devices, networking devices (e.g., switch devices), storage systems, and/or other rack-housed computing devices that would be apparent to one of skill in the art in possession of the present disclosure. However, while illustrated and discussed as being provided by particular computing devices, one of skill in the art in possession of the present disclosure will recognize that that rack 200 may be configured to house other devices while remaining within the scope of the present disclosure as well. As such, while a specific rack is illustrated and described herein, one of skill in the art in possession of the present disclosure will recognize that the multi-device rack width adapter system of the present disclosure may be utilized with a variety of racks while remaining within the scope of the present disclosure as well.

Figure 3:
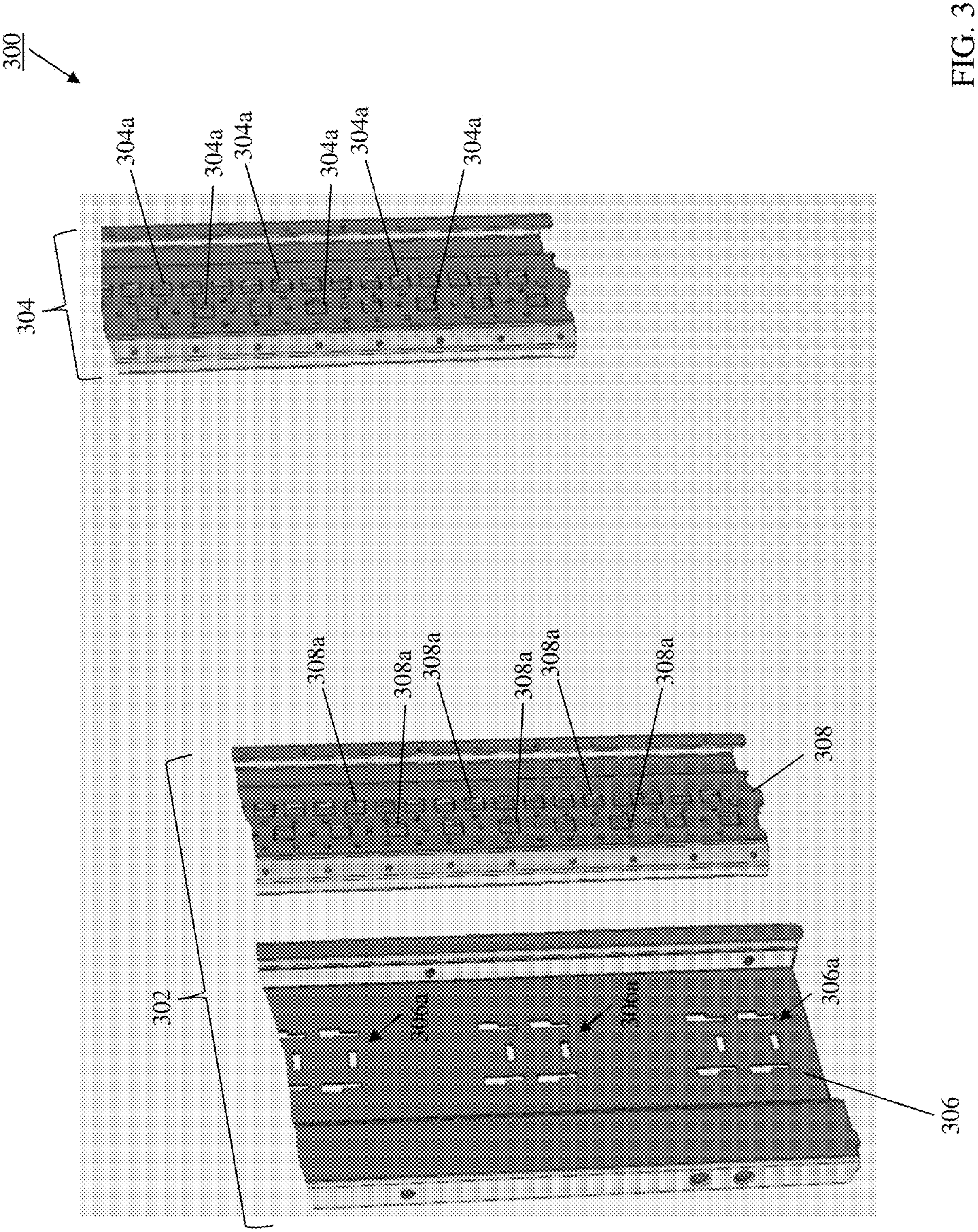
FIG. 3 is a perspective view illustrating an embodiment of supports that are included on the rack of FIGS. 2A and 2B.

Referring now to FIG. 3, an embodiment of a side 300 of a rack is illustrated that may provide each of the first side 208 and the second side 210 of the rack 200 discussed above with reference to FIG. 2. In the illustrated embodiment, the side 300 of the rack illustrated in FIG. 3 includes a vertical support 302 that may provide either of the vertical supports 208*a* or 210*a* discussed above with reference to FIG. 2, and a vertical support 304 that may provide either of the vertical supports 208*b* or 210*b* discussed above with reference to FIG. 2, and one of skill in the art in possession of the present disclosure will appreciate how the portion of the side 300 that is visible in FIG. 3 and described below (i.e., located on the vertical supports 208*a*/208*b* or 210*a*/210*b*) faces the rack housing 214 discussed above with reference to FIG. 2.

In the illustrated embodiment, the vertical support 302 includes a cable management beam 302*a* that defines a plurality of cable management element mounting apertures 306*a* that one of skill in the art in possession of the present disclosure will appreciate are configured to mount respective cable management elements to the cable management beam 306 in order to allow for the routing of cables on the rack 200 as described in further detail below. The vertical support 302 also includes an adapter system mounting beam 308 that defines a plurality of adapter system mounting apertures 308*a*, and the vertical support 304 defines a plurality of adapter system mounting apertures 304*a* that, as discussed below, are configured to mount the multi-device rack width adapter system of the present disclosure to the rack 200. As will be appreciated by one of skill in the art in possession of the present disclosure, a pair of the sides 300 may provide the first side 208 and the second side 210 of the rack 200 discussed above with reference to FIG. 2 and may be used to mount respective multi-device rack width adapter subsystems in the rack housing 214 as described in further detail below.

As will be appreciated by one of skill in the art in possession of the present disclosure, the adapter system mounting apertures 308*a* on the adapter system mounting beam 308 of the vertical support 302 and the adapter system mounting apertures 304*a* on the vertical support 304 may be provided as defined by the ORv3 Base Specification discussed above, and thus may be configured to couple "21-inch" devices to the rack 200 discussed above with reference to FIG. 2. In other words, the multi-device rack width adapter system of the present disclosure may be configured to couple to a conventional rack like the ORv3 rack described above that is configured to house "21-inch" devices in order to adapt that conventional rack to house "19-inch" devices. However, while a specific rack 200 with sides 300 has been illustrated and described, one of skill in the art in possession of the present disclosure will recognize that racks utilized with the multi-device rack width adapter system of the present disclosure may include a variety of components and/or component configurations for providing conventional rack functionality, as well as the multi-device rack width adapter functionality discussed below, while remaining within the scope of the present disclosure as well.

Figure 4A:
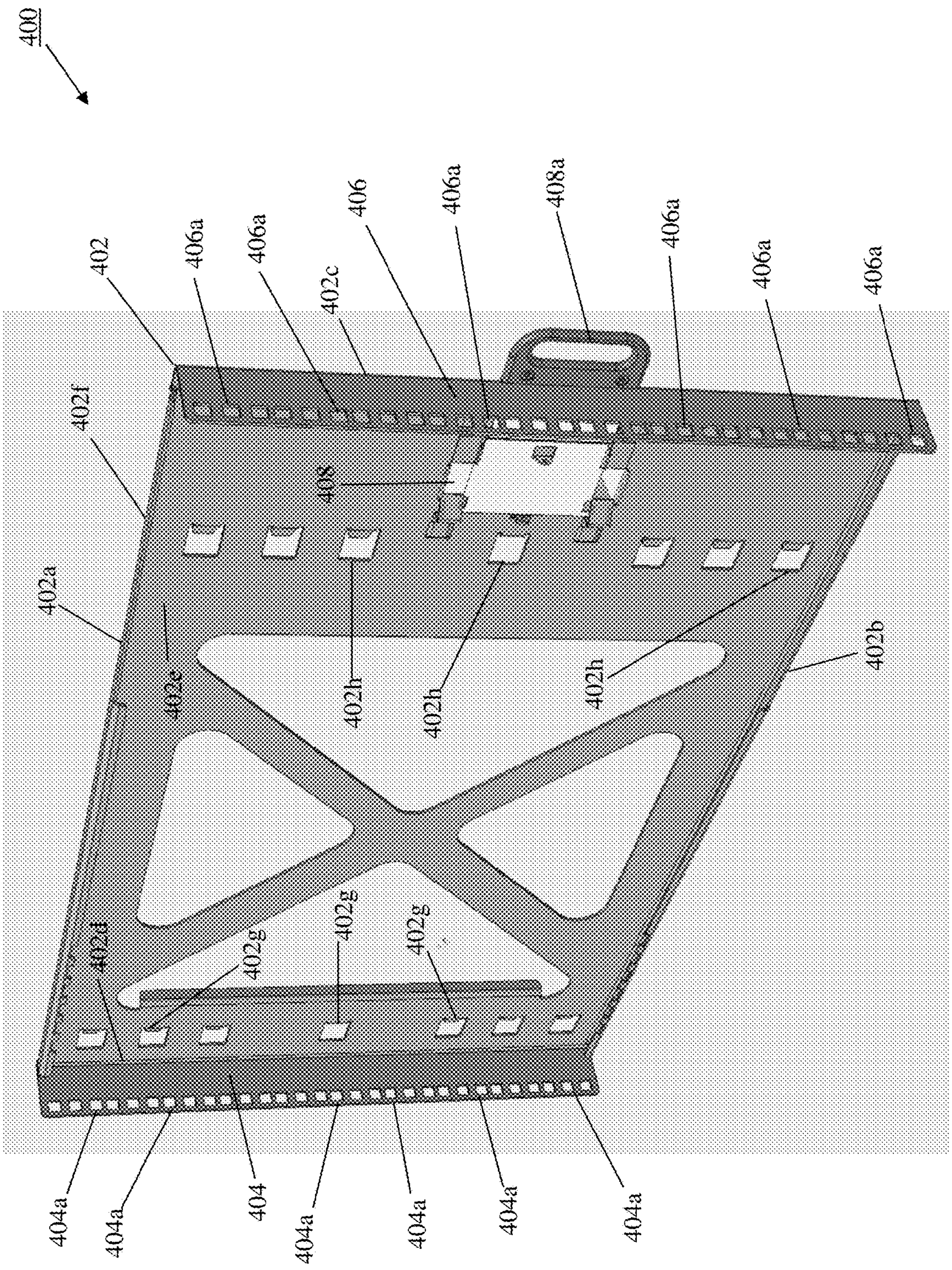
FIG. 4A is a perspective view illustrating an embodiment of a multi-device rack width adapter base that may be included in the multi-device rack width adapter system of the present disclosure.
Figure 4B:
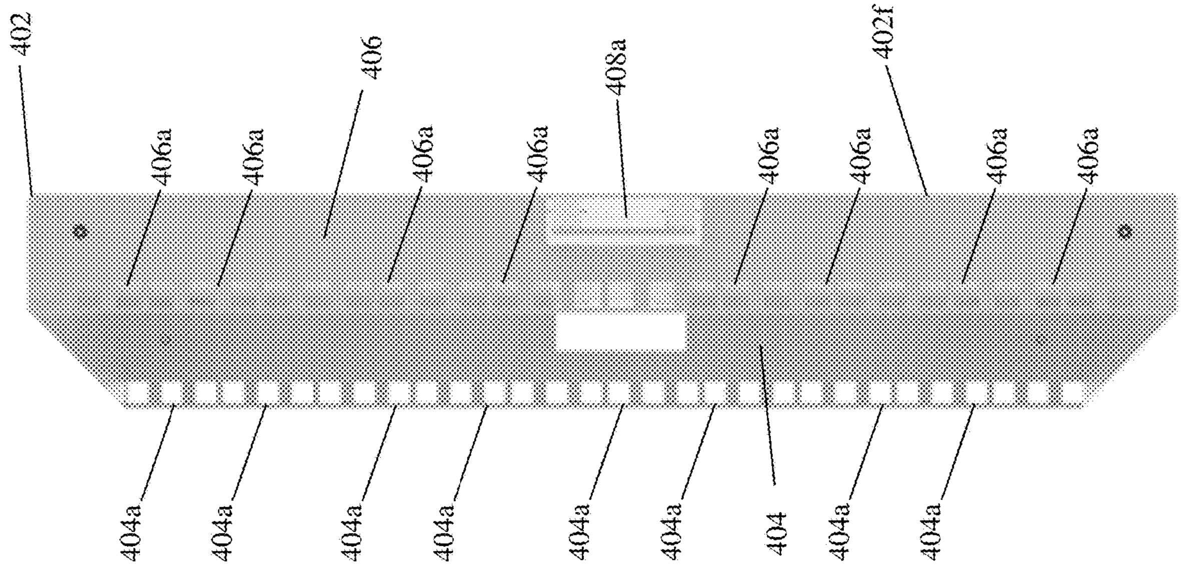
FIG. 4B is a perspective view illustrating an embodiment of the multi-device rack width adapter base of FIG. 3A.

Referring now to FIGS. 4A and 4B, an embodiment of a multi-device rack width adapter base 400 is illustrated that may be included in one of a pair of multi-device rack width adapter subsystems that provide the multi-device rack width adapter system of the present disclosure. In the illustrated embodiment, the multi-device rack width adapter base 400 includes a base 402 having a top edge 402*a*, a bottom edge 402*b* located opposite the base 402 from the top edge 402*a*, a front edge 402*c* that extends between the top edge 402*a* and the bottom edge 402*b*, a rear edge 402*d* that is located opposite the base 402 from the front edge 402*c* and that extends between the top edge 402*a* and the bottom edge 402*b*, and a pair of surfaces 402*e* and 402*f* that are located opposite the base 402 from each other and that each extend between the top edge 402*a*, the bottom edge 402*b*, the front edge 402*c*, and the rear edge 402*d*. Furthermore, the base 402 includes a plurality of rear rack mounting elements 402*g* in a spaced-apart orientation from each other between the top edge 402*a* and the bottom edge 402*b* of the base 402 and adjacent the rear edge 402*d* of the base 402, and a plurality of front rack mounting elements 402*h* in a spaced-apart orientation from each other between the top edge 402*a* and the bottom edge 402*b* of the base 402 and adjacent the front edge 402*c* of the base 402.

In the illustrated embodiment, a rear device coupling flange 404 extends substantially perpendicularly from the rear edge 402*d* of the base 402 along the length of the base 402, and defines a plurality of device coupling apertures 404*a* along its length. Similarly, a front device coupling flange 406 extends substantially perpendicularly from the front edge 402*d* of the base 402 along a length of the base 402, and defines a plurality of device coupling apertures 406*a* along its length. As will be appreciated by one of skill in the art in possession of the present disclosure, the rear device coupling flange 404 and the front device coupling flange 406, as well as the respective device coupling apertures 404*a* and 406*a* defined thereon, may be dimensioned similarly as provided on the conventional 19-inch EIA-310-D racks described above (e.g., including the conventional 19 inch width rack "square hole" mounting aperture configuration illustrated in FIG. 4A).

In one example, the "depth" of the multi-device rack width adapter base 400 as measured between the rear device coupling flange 404 and the front device coupling flange 406 may be provided to mount particular depth adapter rails to the multi-device rack width adapter base 400 that may be configured to couple to devices having a variety of depths. Furthermore, the rear device coupling flange 404 and the front device coupling flange 406 may be dimensioned such that, when a pair of the multi-device rack width adapter bases 400 are mounted to the rack 200 discussed above and adapter rails are mounted to the rear device coupling flange 404 and the front device coupling flange 406, "19-inch" devices may be coupled those adapter rails. As such, the device coupling apertures 404*a* and 406*a* defined by the rear device coupling flange 404 and the front device coupling flange 406 may be dimensioned to mount to a variety of adapter rails that would be apparent to one of skill in the art in possession of the present disclosure.

In the illustrated embodiment, a rack connection subsystem 408 may be included on the base 402 adjacent the front edge 402*c*, and one of skill in the art in possession of the present disclosure will appreciate how the rack connection subsystem 408 may include any of a variety of rack connection elements that are configured to engage the rack 200 discussed above with reference to FIG. 2 in order to connect the multi-device rack width adapter base 400 to the rack 200, as well as a handle 408*a* that may be configured to actuate the rack connection elements to allow the multi-device rack width adapter base 400 to be disconnected from the rack 200 following its connected to the rack 200 using the rack connection elements.

Figure 5A:
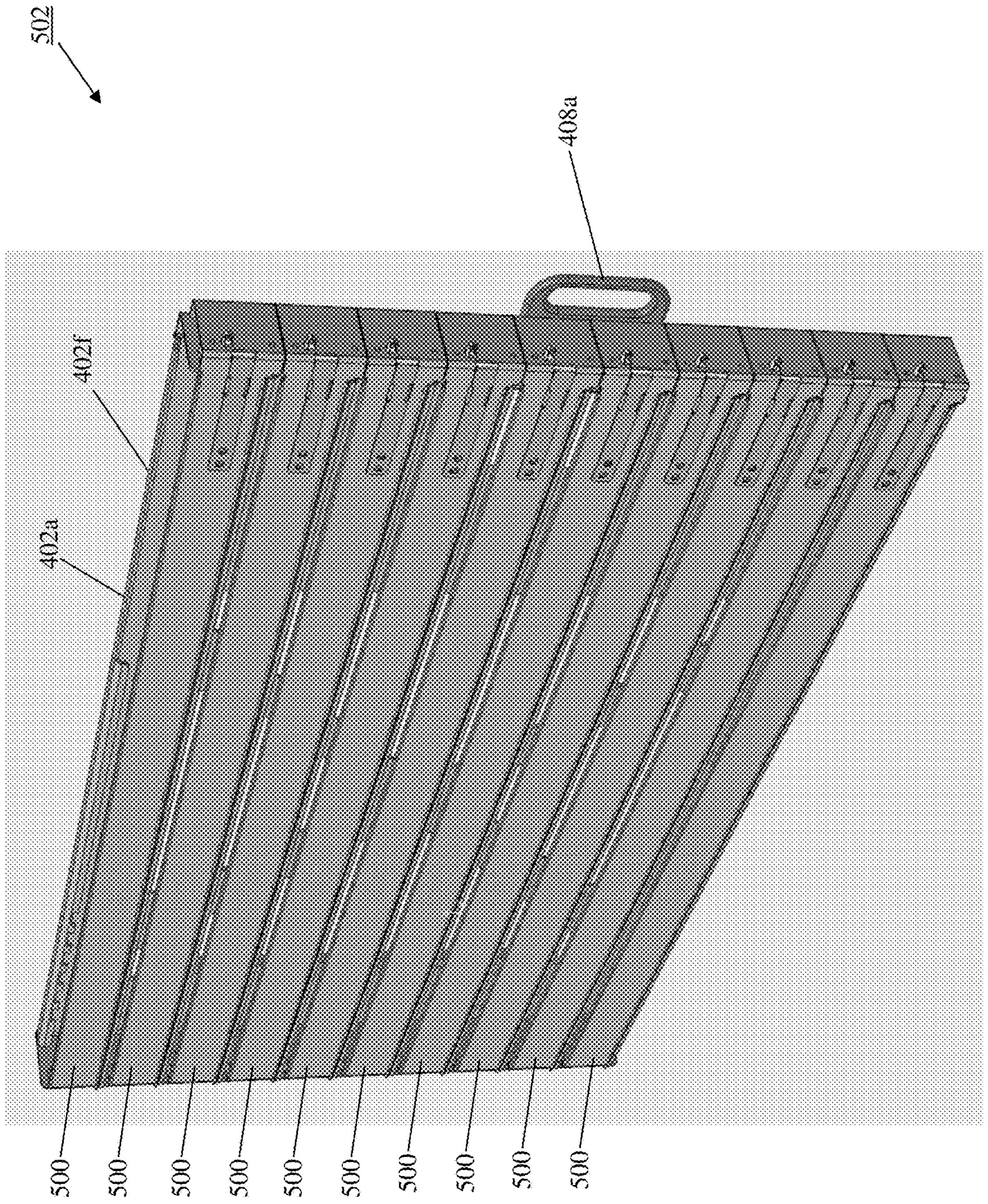
FIG. 5A is a front perspective view illustrating an embodiment of a plurality of single-device adapter rails coupled to the multi-device rack width adapter base of FIGS. 4A and 4B to provide a multi-device rack width adapter subsystem that may be included in the multi-device rack width adapter system of the present disclosure.
Figure 5B:
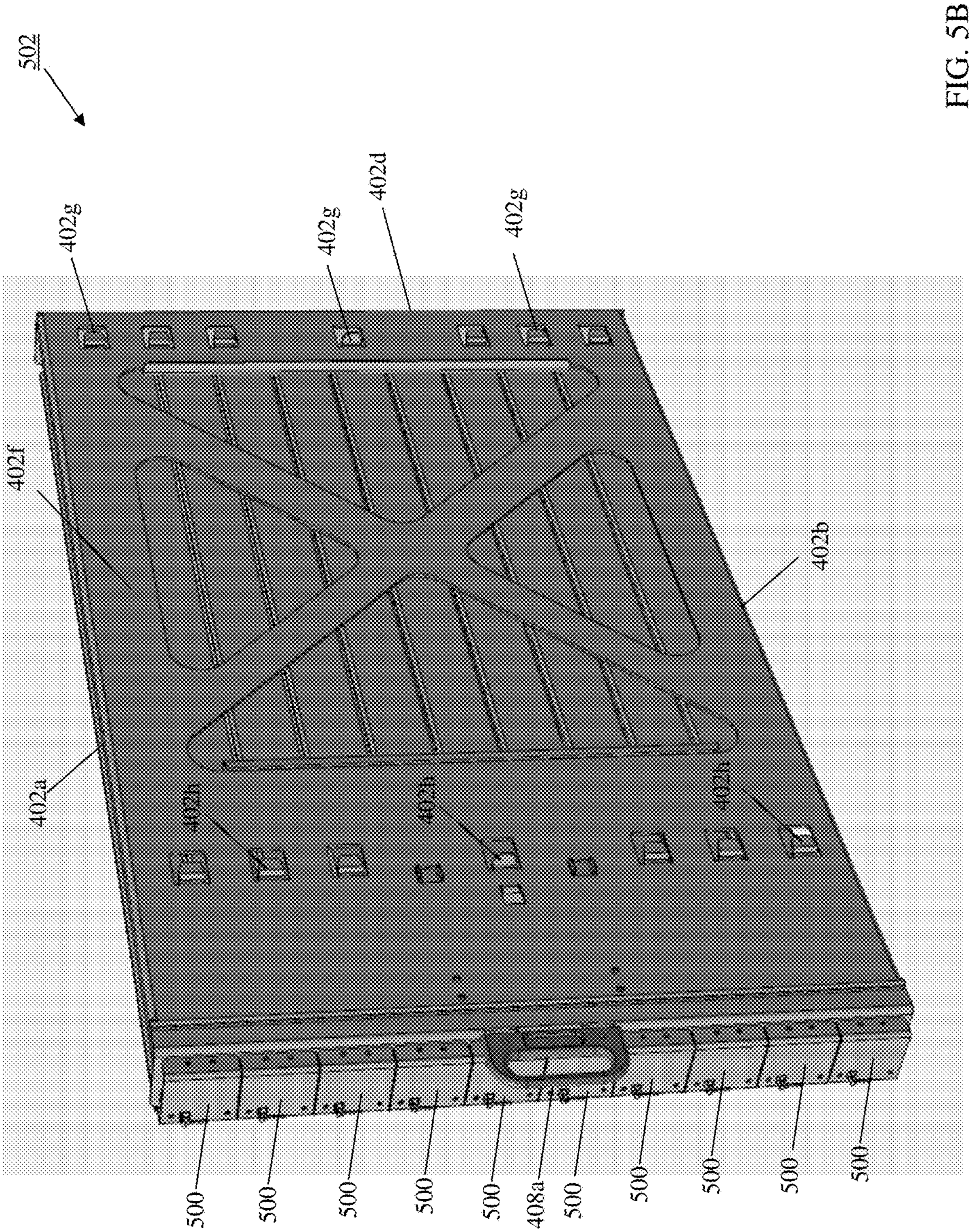
FIG. 5B is a rear perspective view illustrating an embodiment of the multi-device rack width adapter subsystem of FIG. 5A.
Figure 5C:
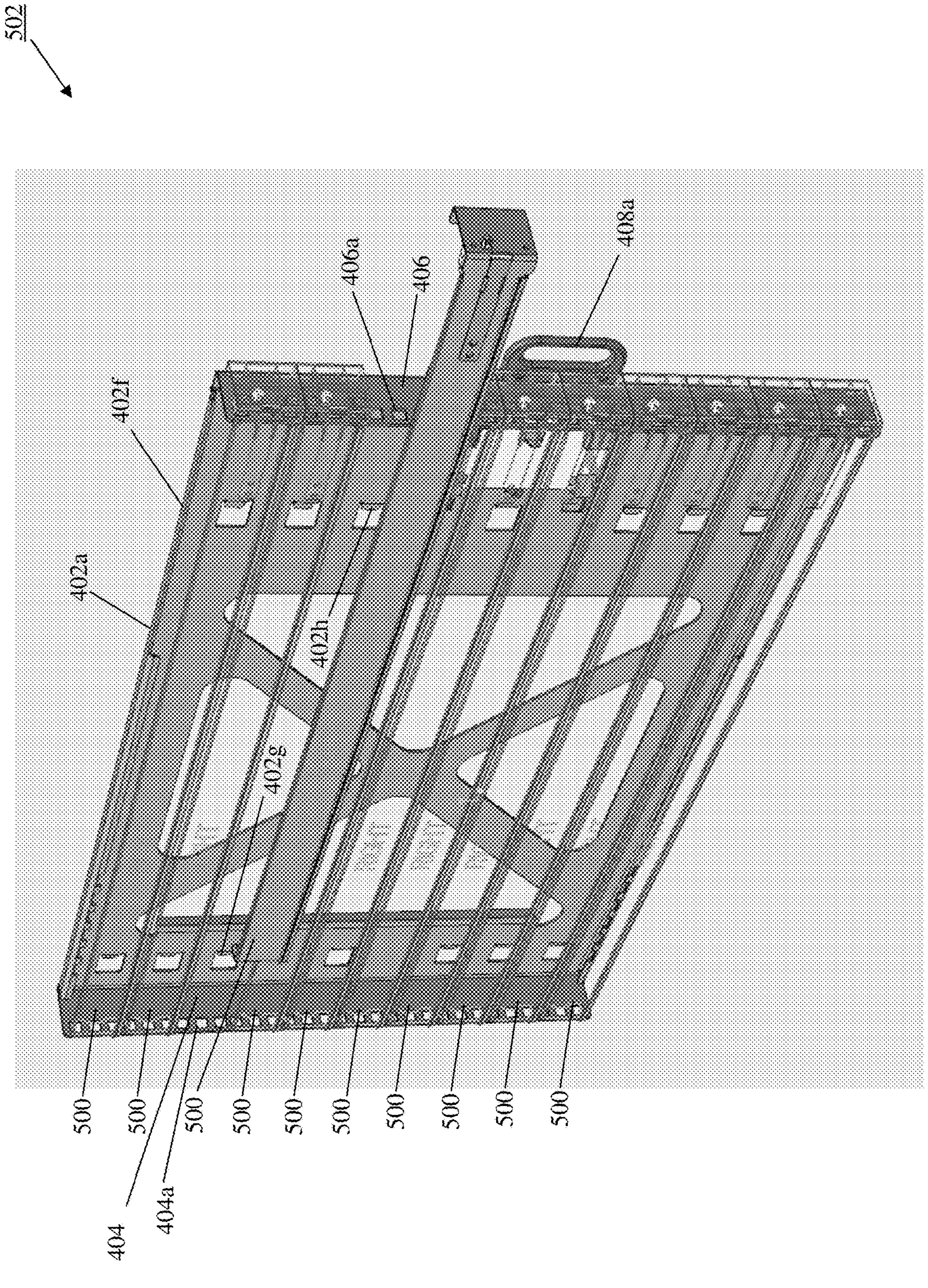
FIG. 5C is a perspective view illustrating an embodiment of one of the plurality of single-device adapter rails disconnected from the multi-device rack width adapter subsystem of FIGS. 5A and 5B.

With reference to FIGS. 5A, 5B, and 5C, an embodiment of single-device adapter rails 500 are illustrated mounted to the multi-device rack width adapter base 400 discussed above with reference to FIGS. 4A and 4B in order to provide a multi-device rack width adapter subsystem 502. One of skill in the art in possession of the present disclosure will recognize that the single-device adapter rails 500 are illustrated herein as being provided by 1RU adapter rails, but will recognize that 2RU (or larger) adapter rails (or combinations of different sized adapter rails) may be provided on the multi-device rack width adapter subsystem 502 while remaining within the scope of the present disclosure as well.

As will be appreciated by one of skill in the art in possession of the present disclosure, each of the ten single-device adapter rails 500 illustrated in FIGS. 5A-5C may be mounted to the multi-device rack width adapter base 400 using a subset of the device coupling apertures 404*a* and 406*a* on the rear device coupling flange 404 and the front device coupling flange 406, respectively (e.g., via a "snap-fit" or other toolless engagement of that single-device adapter rail 500 and the subset of the device coupling apertures 404*a* and 406*a* on the rear device coupling flange 404 and the front device coupling flange 406). Furthermore, FIG. 5C illustrates how any of the single-device adapter rails 500 may be removed from the multi-device rack width adapter base 400 separately (e.g., by disengaging the "snap-fit" or other toolless engagement of that single-device adapter rail 500 and the subset of the device coupling apertures 404*a* and 406*a* on the rear device coupling flange 404 and the front device coupling flange 406).

Figure 5D:
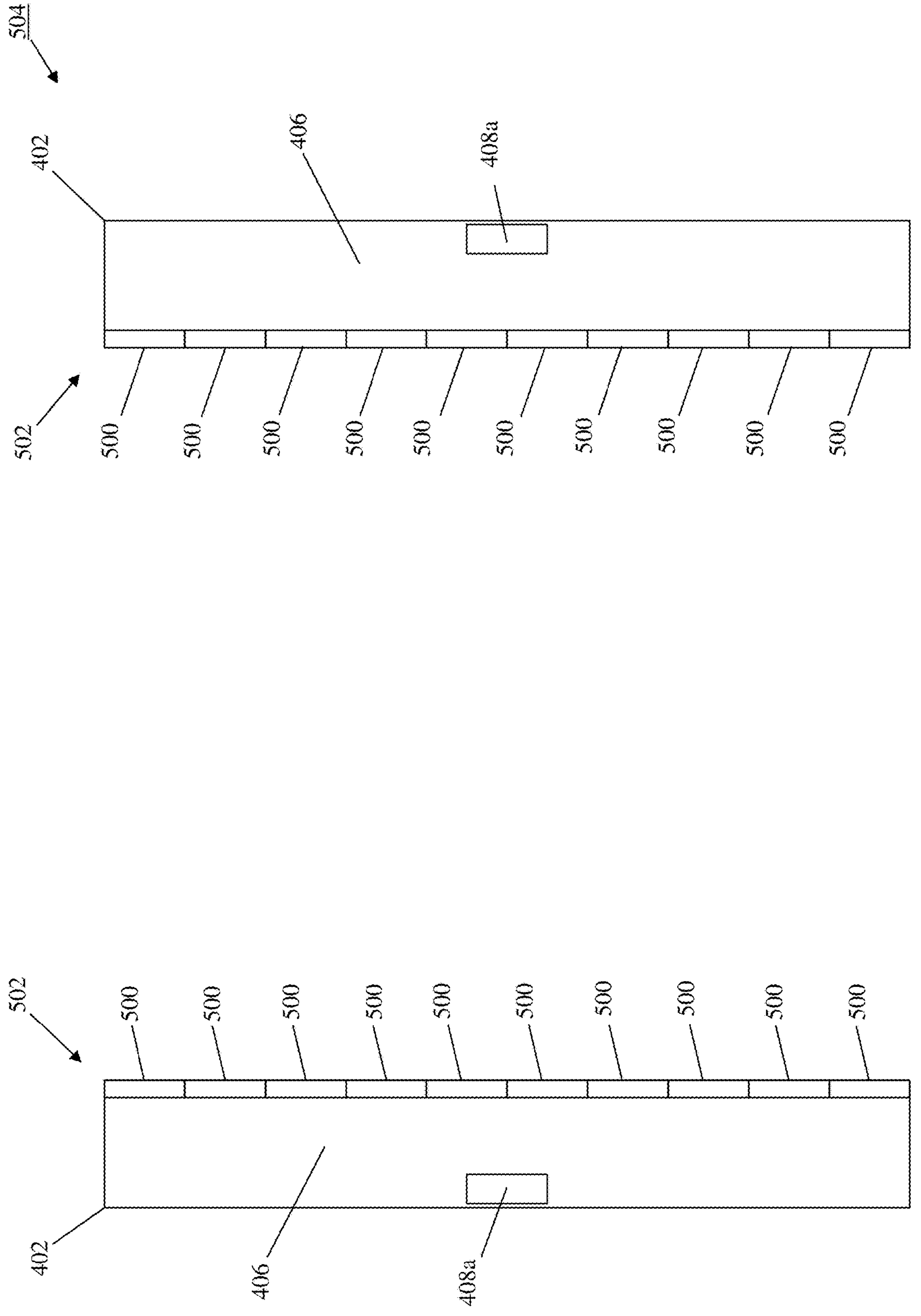
FIG. 5D is a front view illustrating an embodiment a pair of the multi-device rack width adapter subsystems of FIGS. 5A and 5B that provide the multi-device rack width adapter system of the present disclosure.

As will be appreciated by one of skill in the art in possession of the present disclosure, each of the single-device adapter rails 500 illustrated in FIGS. 5A and 5B may be configured to receive a corresponding device rail that may be mounted to a device, discussed in further detail below. With reference to FIG. 5D, to provide a specific example that is discussed in further detail below, a multi-device rack width adapter system provider may provide pairs of the multi-device rack width adapter subsystems 502 to a user, with each of the plurality of single-device adapter rails 500 (e.g., 10 single-device adapter rails) mounted thereto and provided by proprietary adapter rails that are configured to receive proprietary device rails mounted to devices. As will be appreciated by one of skill in the art in possession of the present disclosure, this allows the user to mount any pair of the multi-device rack width adapter subsystems 502 to the rack 200 discussed above with reference to FIG. 2 to immediately enable devices having the proprietary device rails discussed above to be coupled to that rack 200, while also allowing the user to remove any one pair of corresponding single-device adapter rails 500 on the respective pair of the multi-device rack width adapter subsystems 502 and replace them with another pair of adapter rails that are configured to receive another type of device rails mounted to a device if desired.

However, while the multi-device rack width adapter base 400 is illustrated and primary described herein as utilizing the single-device adapter rails 500 described above, other embodiments of the present disclosure may provide multi-device adapter rail systems that include a plurality of adapter rails that are each configured to receive a corresponding device rail that may be mounted to a device. For example, with reference to FIG. 6, a multi-device adapter rail system 600 is illustrated mounted to the multi-device rack width adapter base 400 to provide a multi-device rack width adapter subsystem 602, with that multi-device adapter rail system 600 including ten adapter rails 600*a* that are each configured to receive a corresponding device rail that may be mounted to a device. As will be appreciated by one of skill in the art in possession of the present disclosure, the multi-device adapter rail system 600 may be mounted to the multi-device rack width adapter base 400 using any number of the device coupling apertures 404*a* and 406*a* on the rear device coupling flange 404 and the front device coupling flange 406, respectively (e.g., via a "snap-fit" or other toolless engagement of that multi-device adapter rail system 600 and the subset of the device coupling apertures 404*a* and 406*a* on the rear device coupling flange 404 and the front device coupling flange 406).

Figure 6:
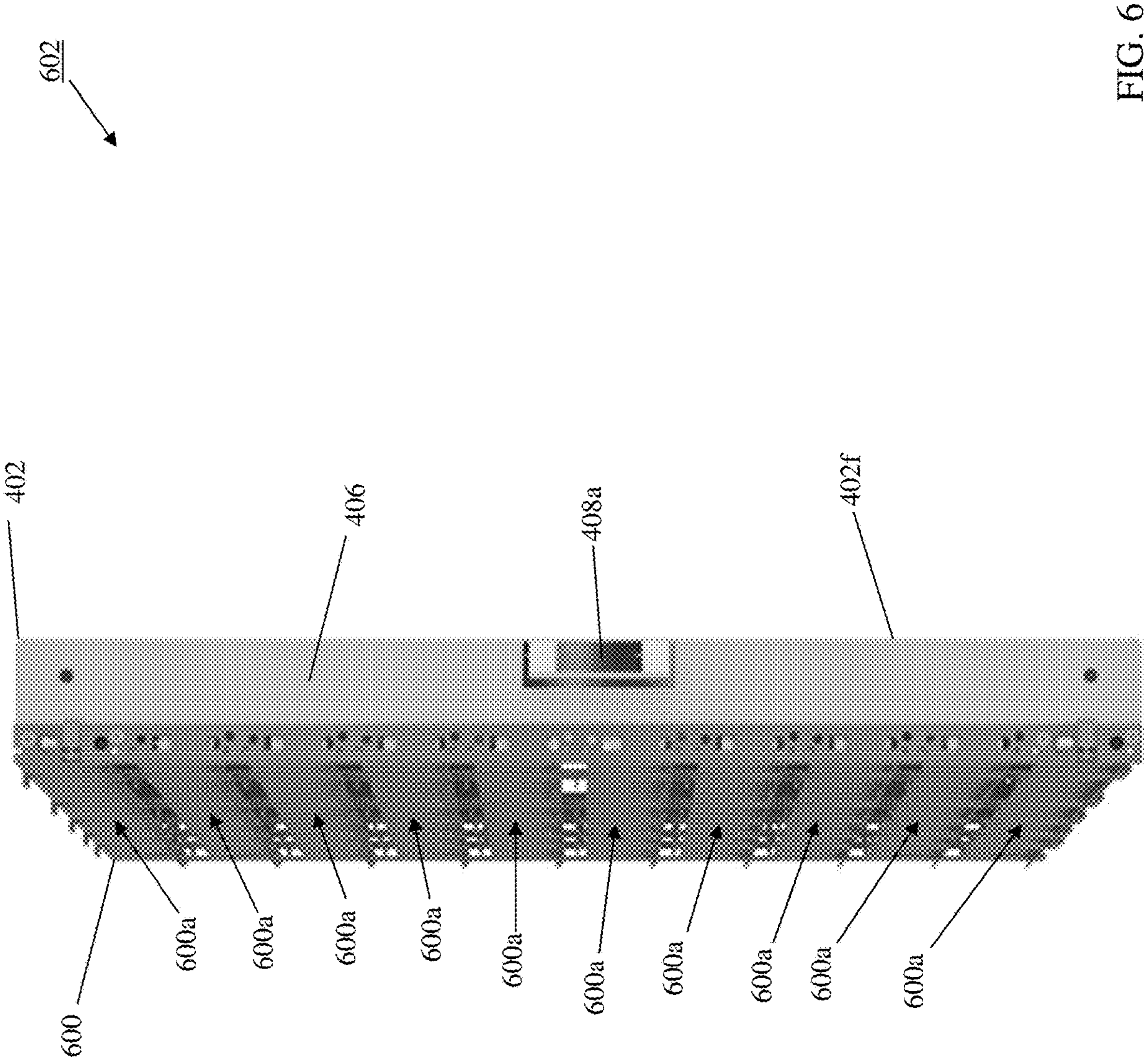
FIG. 6 is a perspective view illustrating an embodiment of a multi-device rail system coupled to the multi-device rack width adapter base of FIGS. 4A and 4B to provide a multi-device rack width adapter subsystem that may be included in the multi-device rack width adapter system of the present disclosure.

As will also be appreciated by one of skill in the art in possession of the present disclosure, each of the adapter rails 600*a* illustrated in FIG. 6 may be configured to receive a corresponding device rail that may be mounted to a device. Similarly as described above, a multi-device rack width adapter system provider may provide pairs of the multi-device rack width adapter subsystems 602 to a user, with the multi-device adapter rail system 600 mounted thereto as illustrated in FIG. 6 and provided by proprietary adapter rails that are configured to receive proprietary device rails mounted to devices. As will be appreciated by one of skill in the art in possession of the present disclosure, this allows the user to mount any pair of the multi-device rack width adapter subsystems 602 to the rack 200 discussed above with reference to FIG. 2 to immediately enable devices having the proprietary device rails discussed above to be coupled to that rack 200. However, one of skill in the art in possession of the present disclosure will appreciate how the adapter rail systems 600 on each multi-device rack width adapter subsystem 602 must be removed and replaced with pairs of adapter rails (and in some cases, one or more of the single-device adapter rails 500 discussed above) if devices with different types of device rails must be coupled to the rack 200.

Figure 7:
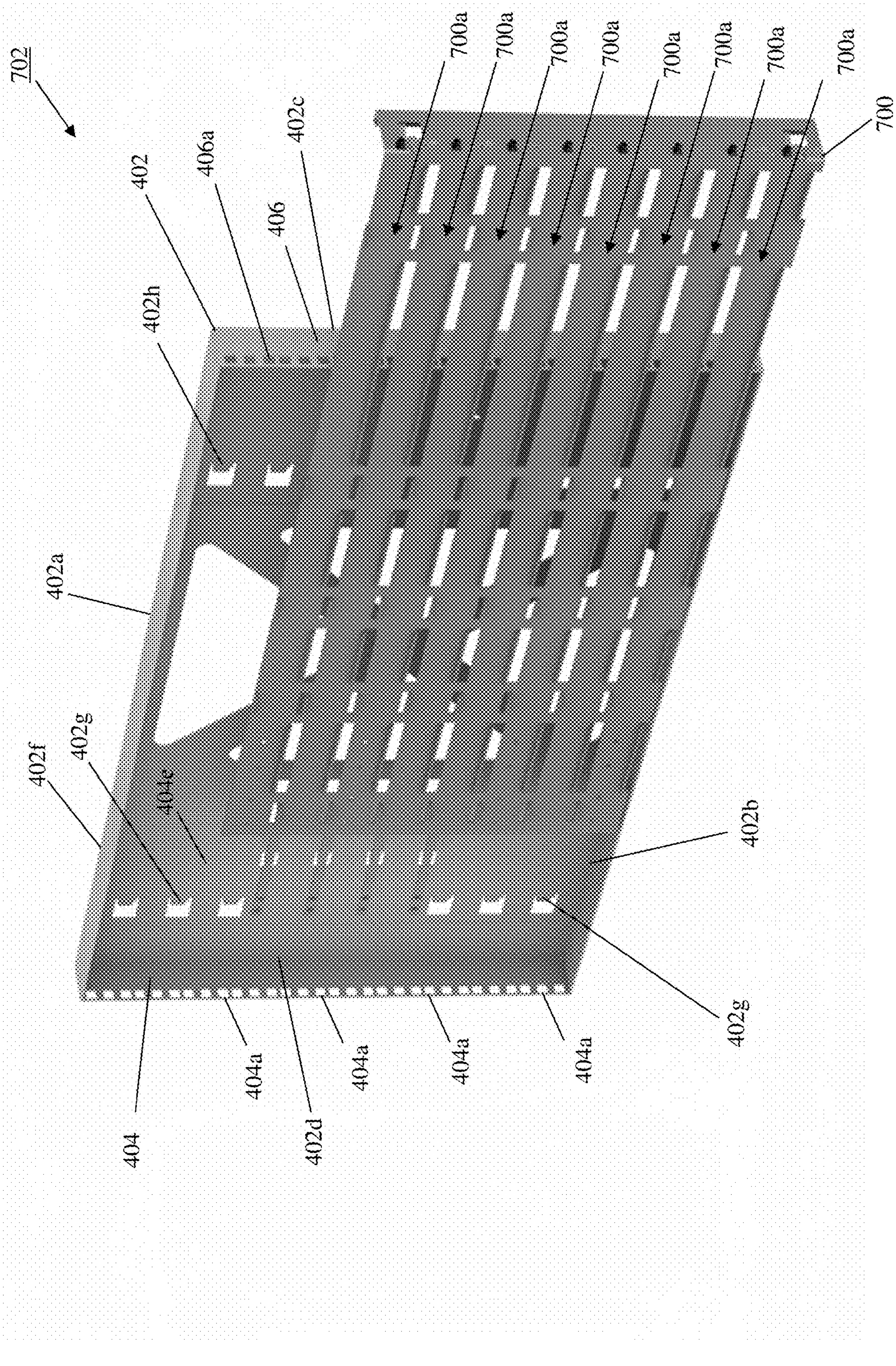
FIG. 7 is a perspective view illustrating an embodiment of a multi-device rail system being coupled to the multi-device rack width adapter base of FIGS. 4A and 4B to provide a multi-device rack width adapter subsystem that may be included in the multi-device rack width adapter system of the present disclosure.

In another example, with reference to FIG. 7, a multi-device adapter rail system 700 is illustrated being mounted to the multi-device rack width adapter base 400 to provide a multi-device rack width adapter subsystem 702, with that multi-device adapter rail system 700 including eight adapter rails 700*a* that are each configured to receive a corresponding device rail that may be mounted to a device. As will be appreciated by one of skill in the art in possession of the present disclosure, the multi-device adapter rail system 700 may be mounted to the multi-device rack width adapter base 400 using any number of the device coupling apertures 404*a* and 406*a* on the rear device coupling flange 404 and the front device coupling flange 406, respectively (e.g., via a "snap-fit" or other toolless engagement of that multi-device adapter rail system 700 and the subset of the device coupling apertures 404*a* and 406*a* on the rear device coupling flange 404 and the front device coupling flange 406).

As will be appreciated by one of skill in the art in possession of the present disclosure, each of the adapter rails 700*a* illustrated in FIG. 7 may be configured to receive a corresponding device rail that may be mounted to a device. Similarly as described above, a multi-device rack width adapter system provider may provide pairs of the multi-device rack width adapter subsystems 702 to a user, with the multi-device adapter rail system 700 mounted thereto and provided by proprietary adapter rails that are configured to receive proprietary device rails mounted to devices. As will be appreciated by one of skill in the art in possession of the present disclosure, this allows the user to mount any pair of the multi-device rack width adapter subsystems 702 to the rack 200 discussed above with reference to FIG. 2 to immediately enable devices having the proprietary device rails discussed above to be coupled to that rack 200, while also allowing the user to provide two pairs of adapter rails if devices with different types of device rails must be coupled to the rack 200 (or the single-device adapter rails 500 discussed above if additional devices with the corresponding proprietary device rails are to-be coupled to the rack). However, while a multi-device adapter rail system 700 that leaves two adapter rails mounting spaces on the multi-device rack width adapter base 400 to allow different types of adapter rails to be mounted to the multi-device rack width adapter base 400 has been illustrated and described, one of skill in the art in possession of the present disclosure will appreciate how adapter rail systems may be provided with any number of adapter rails while remaining within the scope of the present disclosure.

As such, while several examples of the provisioning of adapter rails on the multi-device rack width adapter base 400 have been illustrated and described, one of skill in the art in possession of the present disclosure will appreciate how any of a variety of adapter rails and/or adapter rail systems may be configured for a desired use (e.g., the coupling of some number of devices to a rack with proprietary devices rails, some number of devices to a rack with non-proprietary devices rails, etc.) and provided with the multi-device rack width adapter base 400 in order to enable that desired use while remaining within the scope of the present disclosure.

Figure 8:
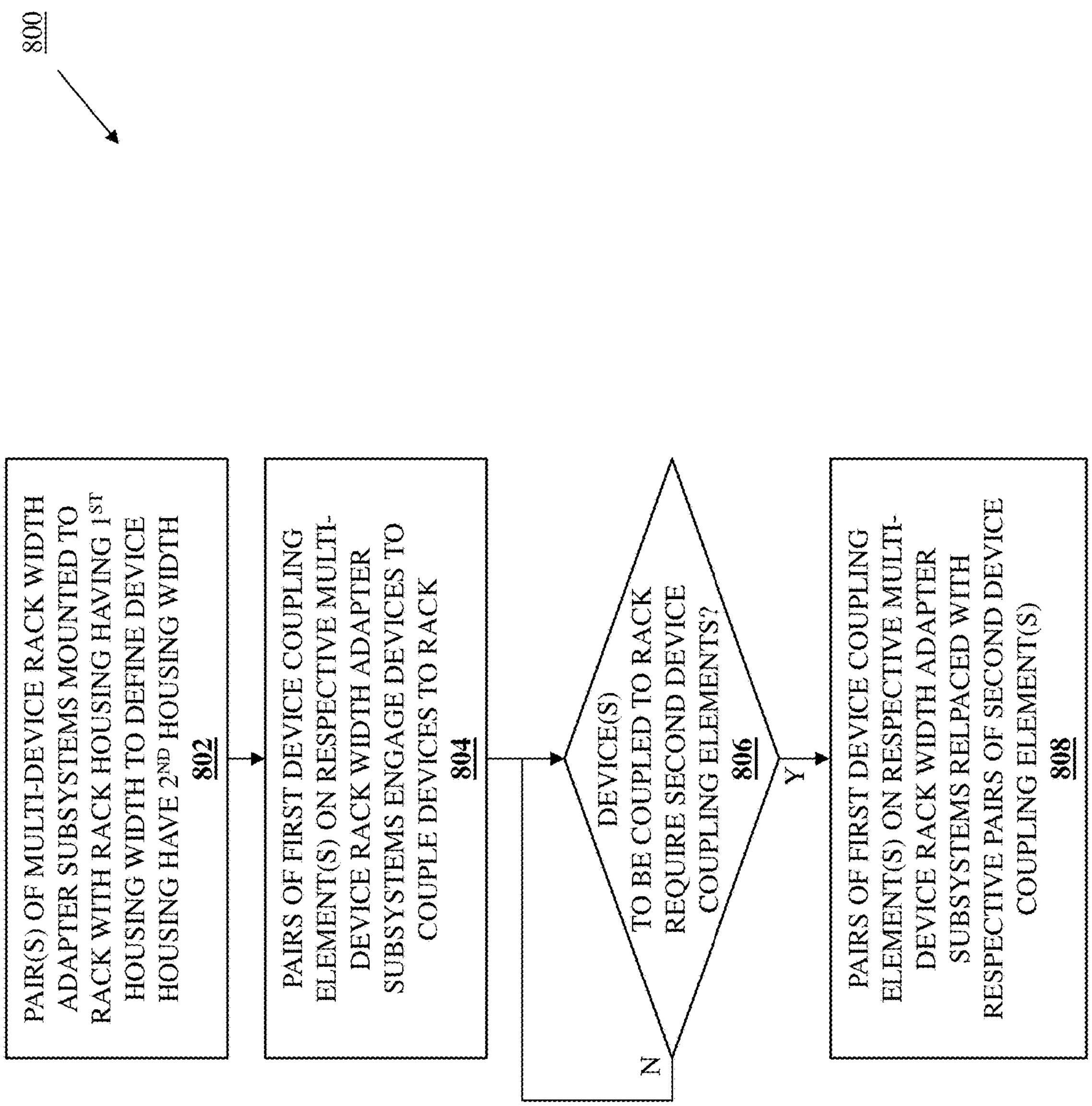
FIG. 8 is a flow chart illustrating an embodiment of a method for adapting a width of a rack to house devices.

Referring now to FIG. 8, an embodiment of a method 800 for adapting a width of a rack to house devices is illustrated. As discussed below, the systems and methods of the present disclosure provide a multi-device rack width adapter system that mounts to a rack having a rack housing with a first housing width, that defines device housings having a second housing width that is smaller than the first housing width, and that is configured to coupled multiple devices to the rack in those device housings. For example, the multi-device rack-width-adapted rack system of the present disclosure may include a multi-device rack width adapter system mounted to a rack having first and second sides defining a rack housing having a first housing width. The multi-device rack width adapter system includes a first multi-device rack width adapter subsystem in the rack housing mounted to the first side of the rack, a second multi-device rack width adapter subsystem in the rack housing mounted to the second side of the rack, and pairs of device coupling elements that each include a first device coupling element on the first multi-device rack width adapter subsystem and a second device coupling element on the second multi-device rack width adapter subsystem. Each pair of device coupling elements may couple a respective second device to the rack in a second device housing defined by that pair of device coupling elements with a second housing width that is smaller than the first housing width. As such, multiple devices that are configured to mount to relatively smaller width racks may be quickly and easily coupled to relatively larger width racks.

Figure 9:
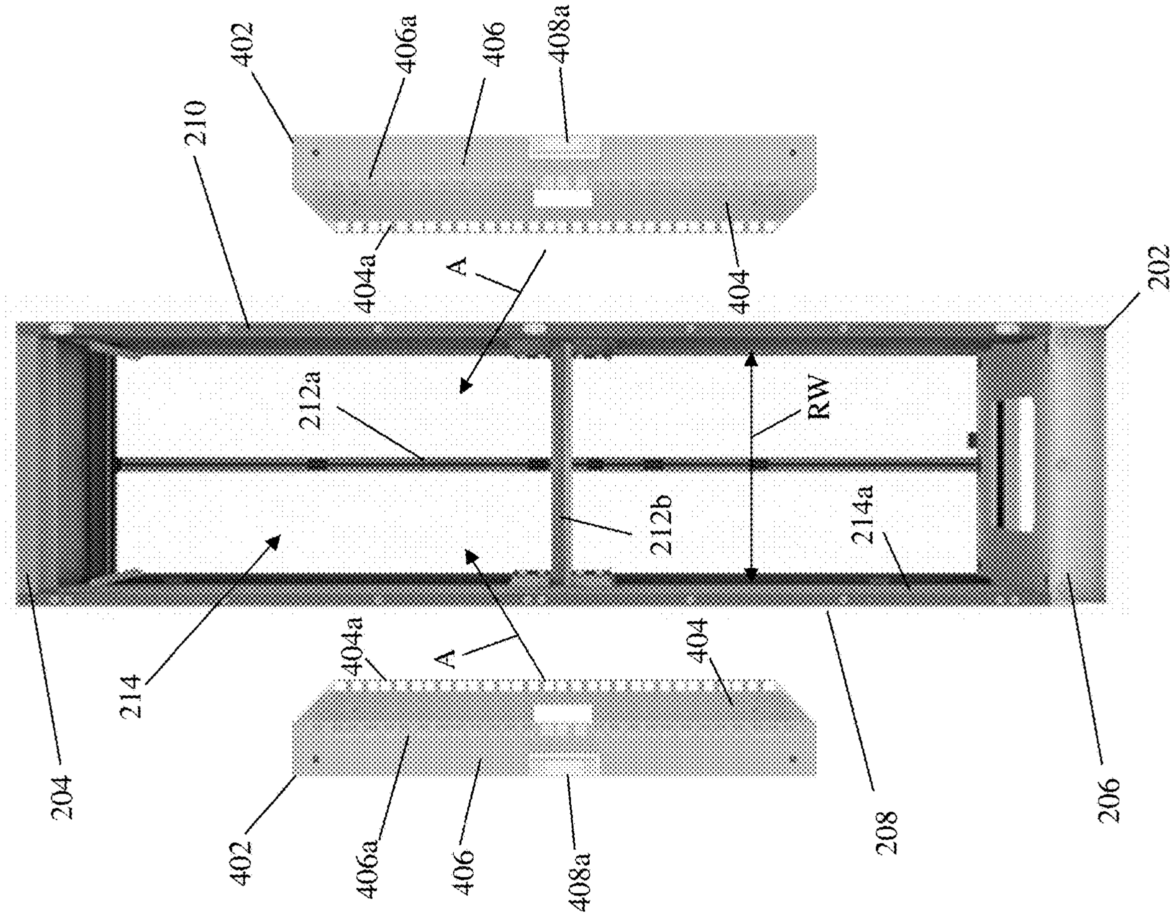
FIG. 9 is a front perspective view illustrating an embodiment of a pair of the multi-device rack width adapter bases of FIGS. 4A and 4B being coupled to the rack of FIGS. 2A, 2B, and 2C.

The method 800 begins at block 802 where one or more pairs of multi-device rack width adapter subsystems are mounted to a rack with a rack housing having a first housing width to defined device housings having a second housing width. With reference to FIG. 9, in an embodiment of block 802, a pair of the multi-device rack width adapter bases 400 discussed above with reference to FIGS. 4A and 4B may be positioned adjacent the rack mounting entrance 214*a* of the rack 200 such that a first of the pair of multi-device rack width adapter bases 400 is located adjacent the first side 208 of the rack 200, and a second of the pair of multi-device rack width adapter bases 400 is located adjacent the second side 210 of the rack 200. Each of the pair of multi-device rack width adapter bases 400 may then be moved in a direction A through the rack housing entrance 214*a* and into the rack housing 214, and may be mounted to the first side 208 and the second side 210 of the rack 200, respectively, in order to, for example, provide conventional EIA-310-D 19-inch width rack "square hole" mounting aperture to be provided in a 21-inch ORv3 rack.

One of skill in the art in possession of the present disclosure will recognize that the pair of multi-device rack width adapter bases 400 are illustrated in FIG. 9 as being coupled to the rack 200 without any adapter rails, but as discussed above the multi-device rack width adapter bases 400 may be coupled to the rack 200 as the multi-device rack width adapter subsystems 502 that may include any (and in some cases all) of the single-device adapter rails 500 discussed above with reference to FIGS. 5A-5D, as multi-device rack width adapter subsystems 602 that may include the multi-device adapter rail system 600 discussed above with reference to FIG. 6, as multi-device rack width adapter subsystems 702 that may include the multi-device adapter rail system 700 discussed above with reference to FIG. 7, and/or as any other multi-device rack width adapter subsystems that one of skill in the art in possession of the present disclosure would recognize as being provided according to the teachings of the present disclosure.

Figure 10A:
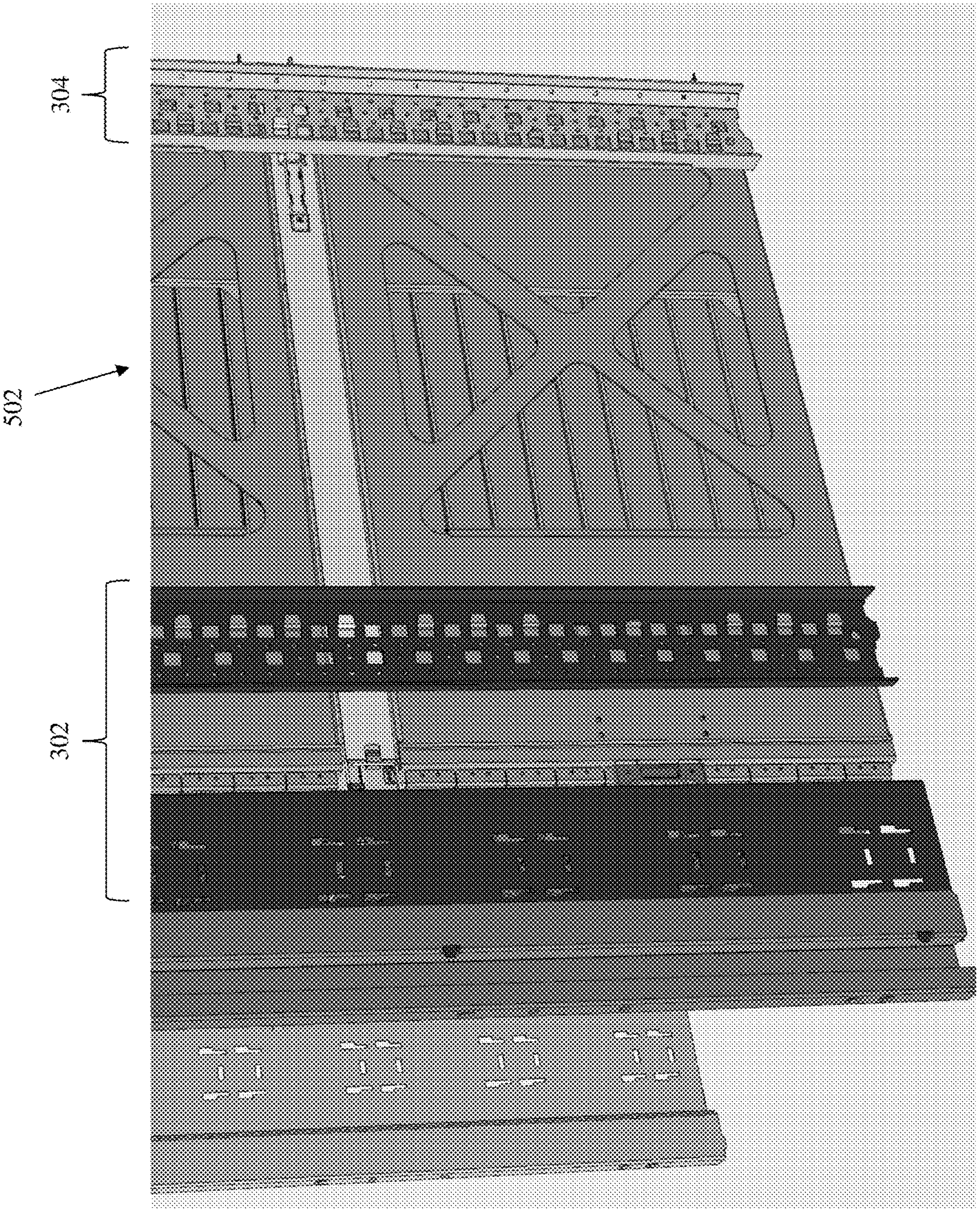
FIG. 10A is a perspective view illustrating an embodiment of the multi-device rack width adapter subsystem of FIGS. 5A and 5B coupled to the rack of FIGS. 2A, 2B, and 2C.
Figure 10B:
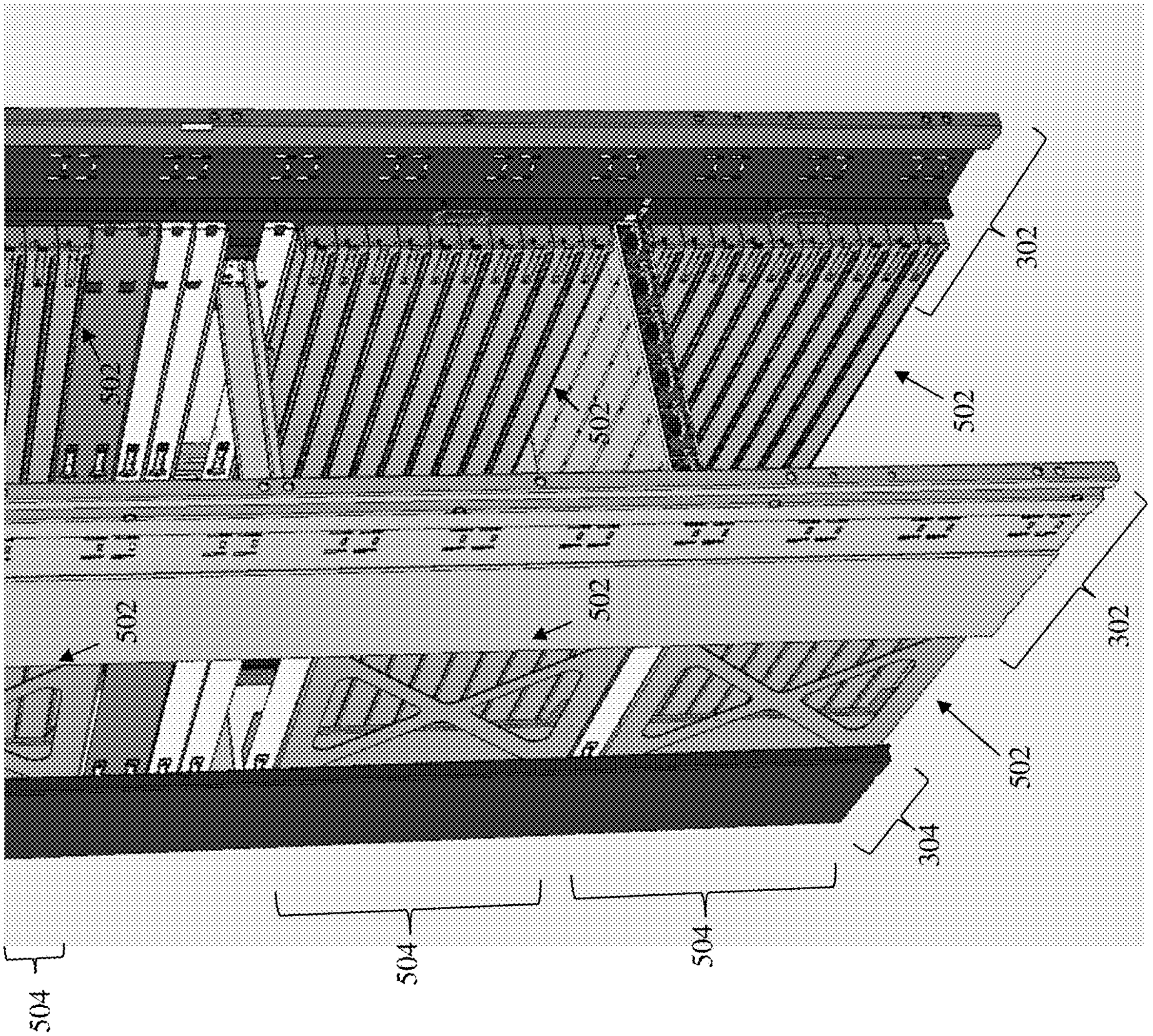
FIG. 10B is a perspective view illustrating an embodiment of a plurality of the multi-device rack width adapter systems of FIG. 5D coupled to the rack of FIGS. 2A, 2B, and 2C.
Figure 10C:
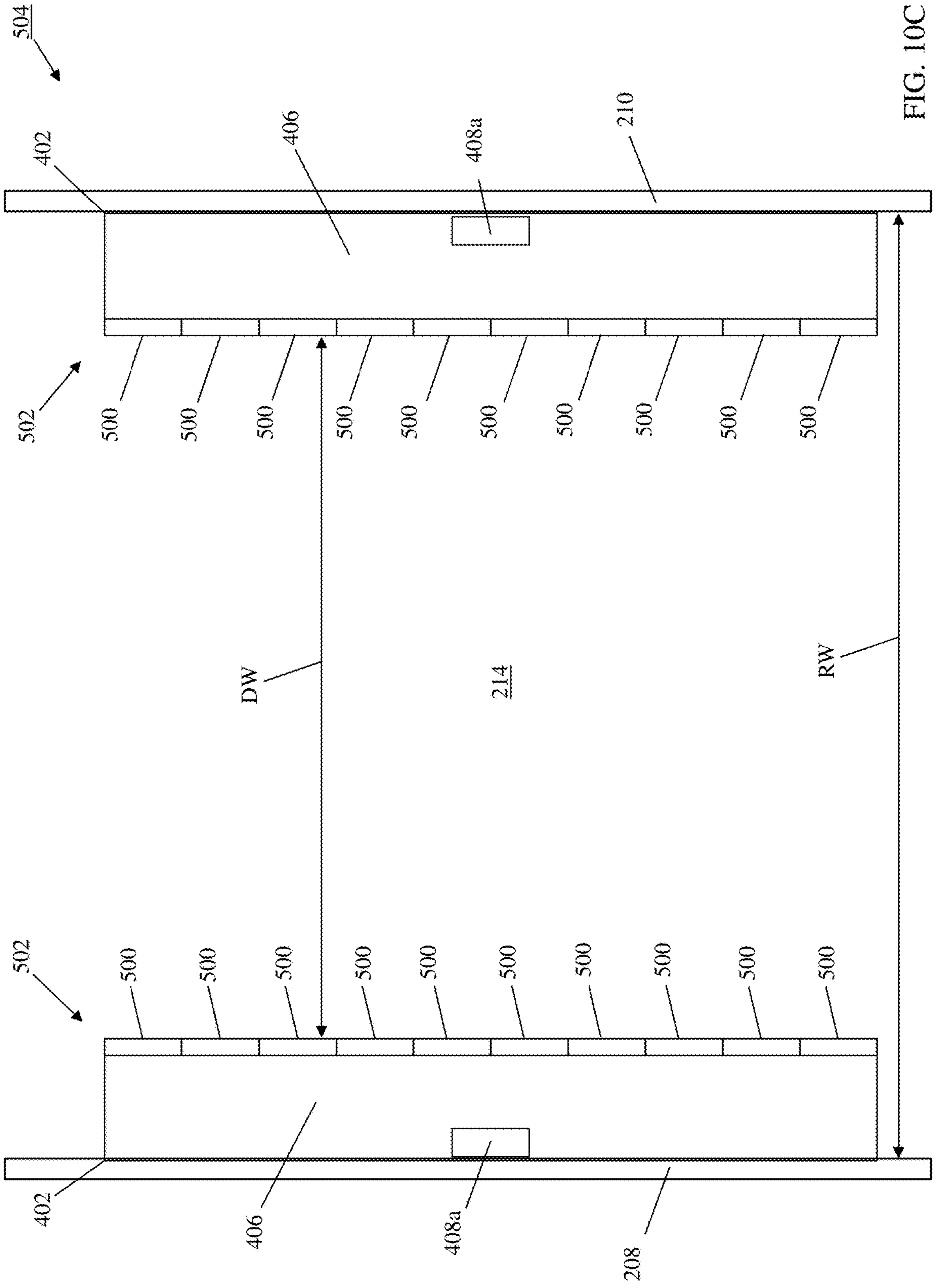
FIG. 10C is a front view illustrating an embodiment of a multi-device rack width adapter system of FIG. 5D coupled to the rack of FIGS. 2A, 2B, and 2C.

For example, with reference to FIGS. 10A, 10B, and 10C, the multi-device rack width adapter subsystems 502 provided by the multi-device rack width adapter bases 400 discussed above with reference to FIG. 9 and including all of the single-device adapter rails 500 discussed above with reference to FIGS. 5A-5D are illustrated mounted to the rack 200. With reference first to FIG. 10A, one of skill in the art in possession of the present disclosure will appreciate how the movement of the multi-device rack width adapter subsystem 502 into the rack housing 214 and adjacent the side 210 of the rack 200 allows at least some of the rear rack mounting elements 402*g* on the multi-device rack width adapter subsystem 502 to engage the adapter system mounting apertures 304*a* on the vertical support 304 of the side wall 202, and at least some of the front rack mounting elements 402*h* on the multi-device rack width adapter subsystem 502 to engage the adapter system mounting apertures 308*a* on the adapter system mounting beam 308 in the vertical support 302 of the side wall 202. Furthermore, one of skill in the art in possession of the present disclosure will appreciate how the multi-device rack width adapter subsystem 502 may then be secured to the side 210 of the rack 200 (e.g., via a "snap-fit" or other toolless engagement of that multi-device rack width adapter subsystem 502 and the side 210 of the rack 200, engagement of the rack connection subsystem 408 on the multi-device rack width adapter base 400 with the vertical support 302 adjacent the rack housing entrance 214*a*, and/or the engagement of other securing features that would be apparent to one of skill in the art in possession of the present disclosure).

With reference now to FIG. 10B, a plurality of pairs of multi-device rack width adapter subsystems 502, which each include all of the single-device adapter rails 500 discussed above with reference to FIGS. 5A-5D, are illustrated mounted to the rack 200, and one of skill in the art in possession of the present disclosure will appreciate how each of the multi-device rack width adapter subsystems 502 may be secured to the side wall 208 or 210 similarly as described above. Furthermore, as illustrated, different pairs of the multi-device rack width adapter subsystems 502 may be separated in the rack 200 to allow for the mounting of "21-inch" devices that correspond to the rack width RW (e.g., via rack rails on the rack 200 and the device rails on the device similarly as described above), with FIG. 10B illustrating a single such device positioned in a Rack Unit (RU) that was left open via the spacing of multi-device rack width adapter subsystems 502 on different multi-device rack width adapter systems 504. However, while a single RU has been illustrated and described as housing a "21-inch" device, as can be seen in FIG. 10B multiple RUs may be left open via the spacing of multi-device rack width adapter subsystems 502 on different multi-device rack width adapter systems 504 (e.g., the three "21-inch" 1RU spaces and one "21-inch" 2RU space illustrated in FIG. 10B) while remaining within the scope of the present disclosure as well.

With reference to FIG. 10C, a multi-device rack width adapter system 504 mounted to the rack 202 is illustrated that is provided by a pair of multi-device rack width adapter subsystems 502 mounted to the side walls 208 and 210, respectively, of the rack 202. As can be seen, the multi-device rack width adapter subsystem 504 is provided in the rack housing 214 with the rack width RW, and single-device adapter rails 500 on the pair of multi-device rack width adapter subsystems 502 provide a device housing having a device housing width DW that is less than the rack width RW (e.g., a device housing width DW of 19 inches that is configured to house "19-inch" devices vs. a rack housing width RW of 21 inches that is configured to house "21-inch" devices).

However, while the multi-device rack width adapter system 504 including the single-device adapter rails 500 is illustrated and described as being mounted to the rack 200, one of skill in the art in possession of the present disclosure with recognize how multi-device rack width adapter systems utilizing the multi-device rack width adapter subsystems 602 including the multi-device adapter rail system 600 discussed above with reference to FIG. 6, multi-device rack width adapter systems utilizing the multi-device rack width adapter subsystems 702 including the multi-device adapter rail system 700 discussed above with reference to FIG. 7, and/or any other multi-device rack width adapter systems provided according to the teachings of the present disclosure, may be mounted to the rack 200 in a similar manner while remaining within the scope of the present disclosure as well.

Figure 11:
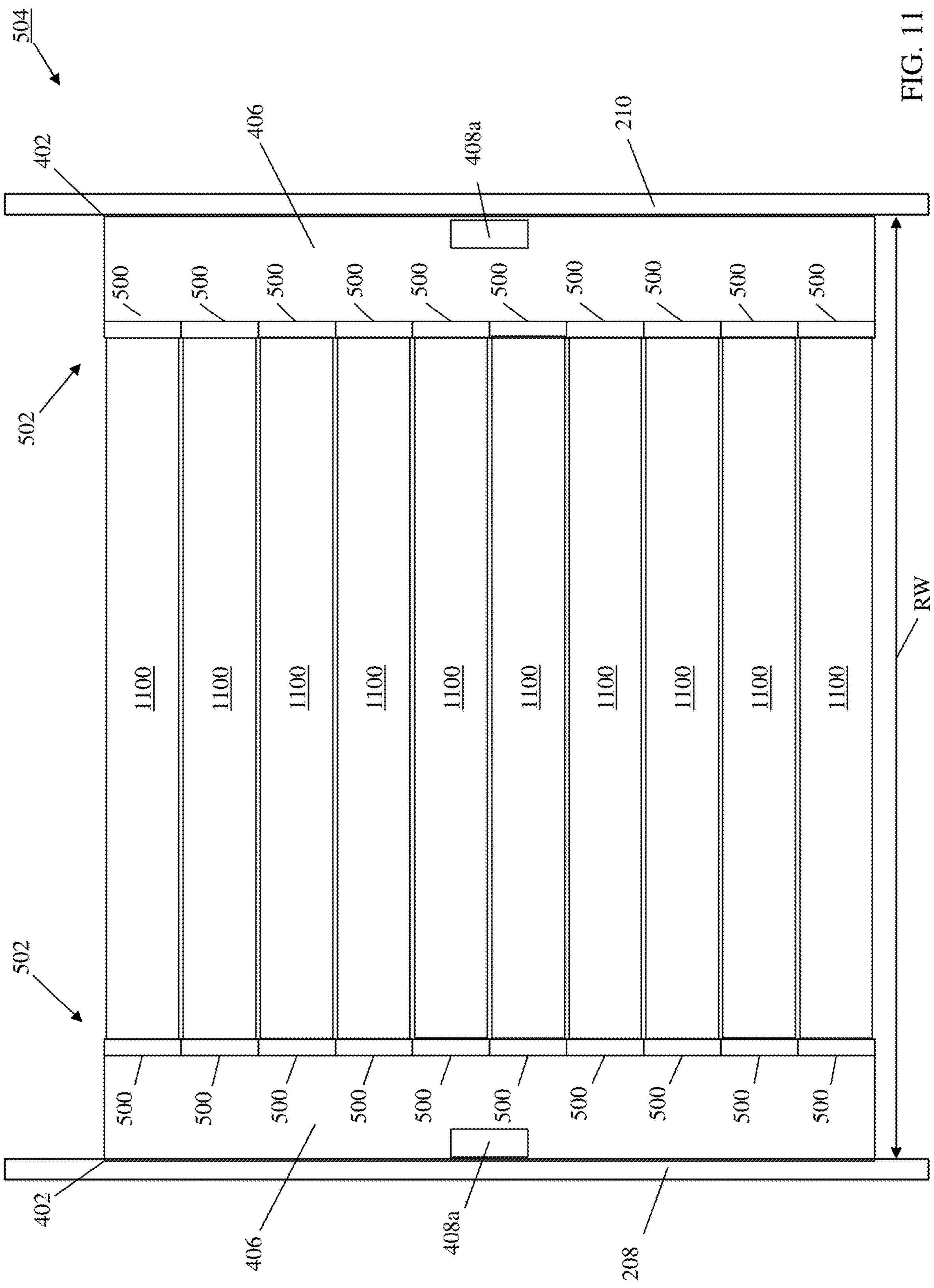
FIG. 11 is a front view illustrating an embodiment of a plurality of devices coupled to the multi-device rack width adapter system on the rack of FIG. 10C.

The method 800 then proceeds to block 804 where one or more pairs of device coupling elements on respective multi-device rack width adapter subsystems engage devices to couple the devices to the rack. With reference to FIG. 11, in an embodiment of block 804, each of a plurality of devices 1100 may be coupled to the rack 202 via respective pairs of device coupling elements provided by the single-device adapter rails 500 mounted on the respective multi-device rack width adapter subsystems 502 coupled to each of the first side 208 and the second side 210 of the rack 200. As described above, each device 1100 may include a pair of device rails (not illustrated in FIG. 11) on its opposing sides that each engage one of the pair of single-device adapter rails 500 discussed above to couple that device 1100 to the rack 200. As such, a plurality of devices 1100 that are configured to be housed in the device width DW (e.g., 19-inches) may be coupled to a rack 200 having a rack width RW (e.g., 21 inches) that is greater than the device width DW.

As discussed above, in specific examples, each of the multi-device rack width adapter systems 504 may be provided to a user with its pair of multi-device rack width adapter subsystems 502 having all ten single-device adapter rails 500 mounted thereto, which allows the user to quickly and easily mount those multi-device rack width adapter systems 504 to the rack 200, as well as quickly and easily couple devices that include corresponding device rails (which may be provided to the user with those device rails mounted thereto) to the rack 200 via those multi-device rack width adapter systems 504. As such, the time and effort needed to provide multiple devices having the device width DW in a rack having the rack width RW is substantially reduced relative to conventional rack width adapter systems that require a user to configure each 1RU device housing in the rack to adapt it for a smaller device.

The method 800 then proceeds to decision block 806 where the method 800 proceeds depending on whether one or more devices that are to-be coupled to the rack require second device coupling elements. As will be appreciated by one of skill in the art in possession of the present disclosure, in some situations a user may wish to couple a device to the rack 200 using device coupling elements that are different than those that are currently provided on the multi-device rack width adapter system 504. For example, as described above, each of the plurality of single-device adapter rails 500 may be provided by proprietary adapter rails that are configured to receive proprietary device rails mounted to devices, and a user adapting the rack width of the rack 200 to house devices having the device width DW may wish to couple those devices to the rack 200 using adapter rails/device rails other than those proprietary adapter rails/proprietary device rails. As such, at decision block 806, the method 800 may proceed depending on whether any of the device coupling elements on the multi-device rack width adapter system 504 must be replaced with other device coupling elements in order to couple a device to the rack 200. If, at decision block 806, no devices are to-be coupled to the rack that require second device coupling elements, the method 800 returns to decision block 806. As such, the method 800 may loop until device(s) are to-be coupled to the rack 200 that require the current adapter rails on the multi-device rack width adapter system 504 to be replaced.

If at decision block 806, devices are to-be coupled to the rack that require second device coupling elements, the method 800 proceeds to block 808 where one or more pairs of first device coupling elements on respective multi-device rack width adapter subsystems are replaced with respective pairs of second device coupling elements. As discussed above with reference to FIG. 5C, any of the single-device adapter rails 500 may be separately removed from the multi-device rack width adapter base 400. As such, in an embodiment of block 808 and in the event a device is to-be coupled to the rack 200 that requires adapter rails that are different to than the single-device adapter rails 500 (e.g., the device rails on that device are not compatible with the single-device adapter rails 500), the single-device adapter rails 500 on the respective multi-device rack width adapter subsystems 502 mounted to the first side 208 and the second side 210 of the rack 200 that define the device housing in which that device will be housed may be removed from those multi-device rack width adapter subsystems 502, and replaced with the required adapter rails (e.g., adapter rails that are compatible with the device rails on the device that is to-be coupled to the rack 200).

Figure 12:
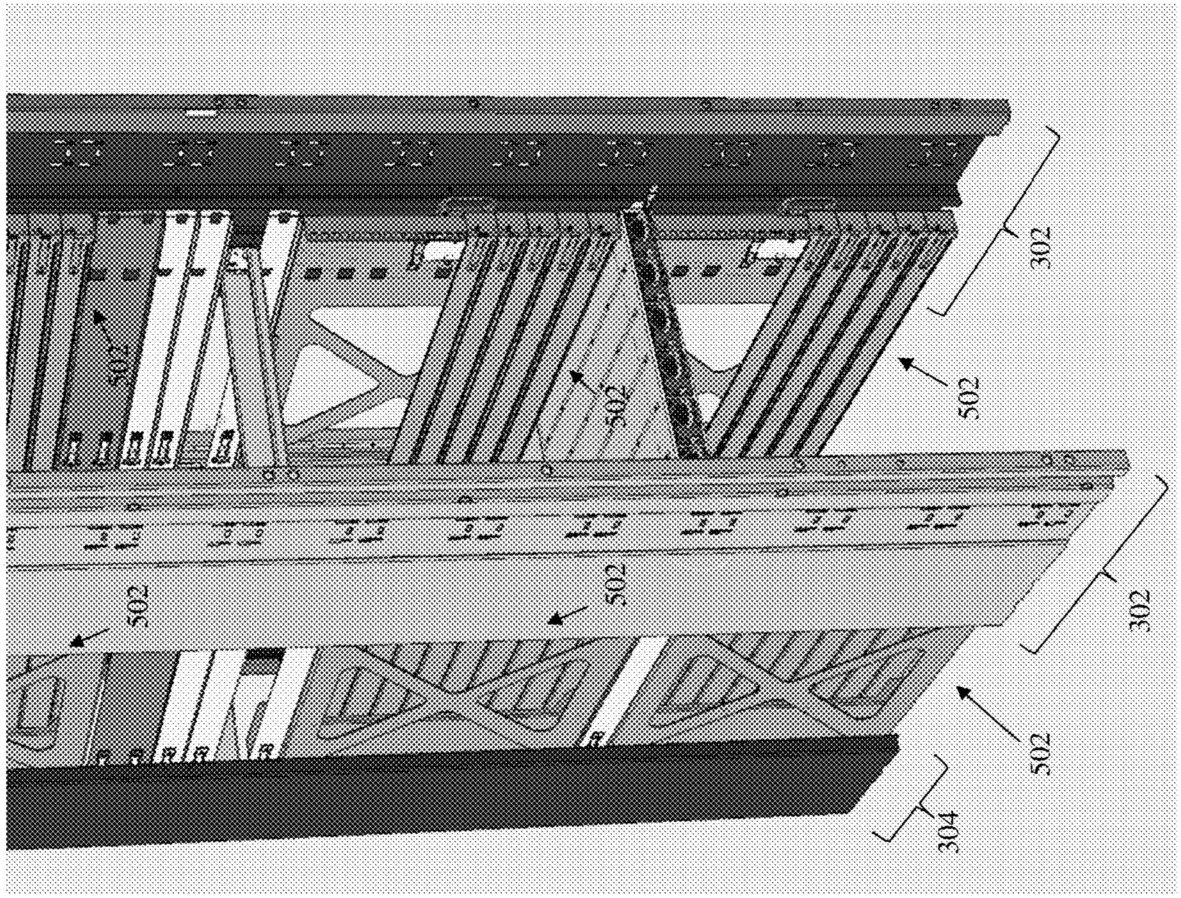
FIG. 12 is a perspective view illustrating an embodiment of a plurality of the multi-device rack width adapter systems of FIG. 5D coupled to the rack of FIGS. 2A, 2B, and 2C with a subset of the single-device adapter rails of FIGS. 5A, 5B, and 5C removed.
Figure 13:
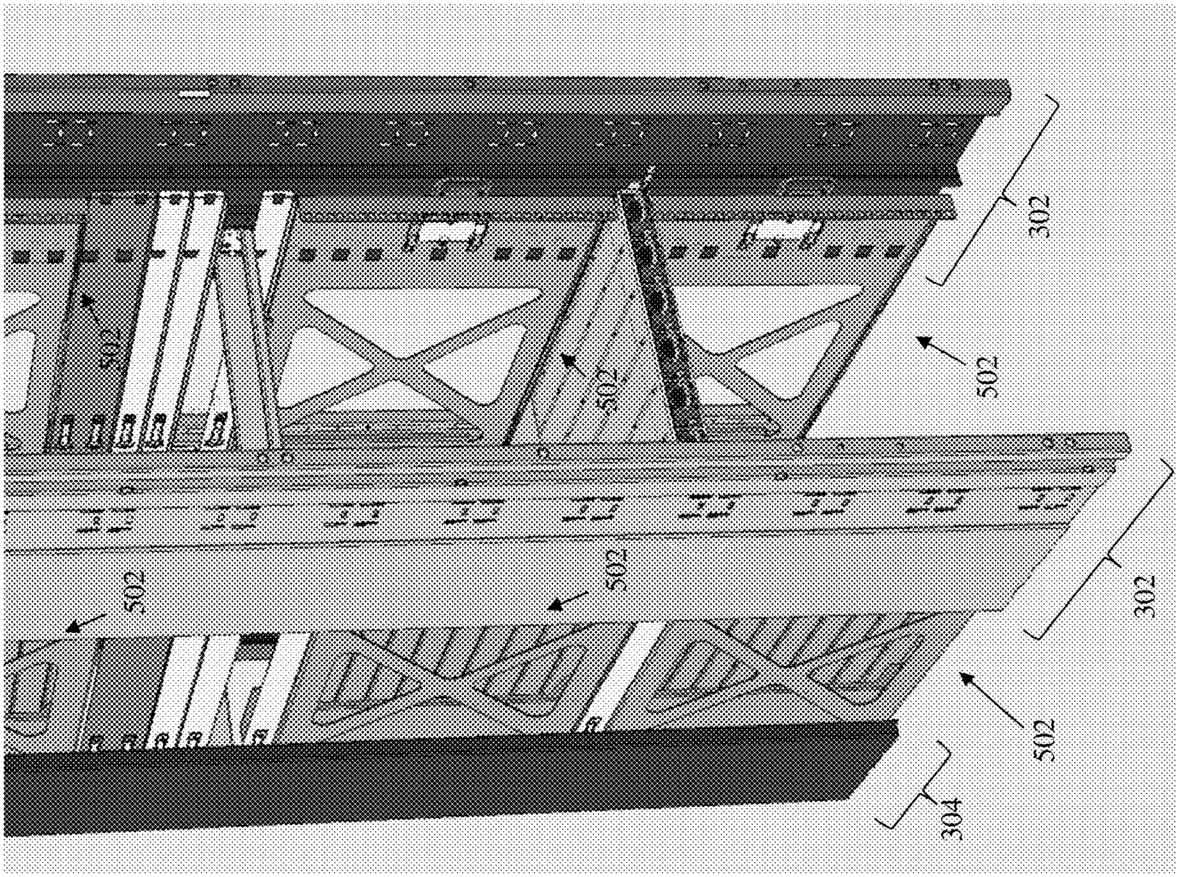
FIG. 13 is a perspective view illustrating an embodiment of a plurality of the multi-device rack width adapter systems of FIG. 5D coupled to the rack of FIGS. 2A, 2B, and 2C with all of the single-device adapter rails of FIGS. 5A, 5B, and 5C removed.

For example, FIG. 12 illustrates how five of the ten single-device adapter rails 500 may be removed from each pair of multi-device rack width adapter subsystems 502 that provide a multi-device rack width adapter system 504, while FIG. 13 illustrates how all ten single-device adapter rails 500 may be removed from each pair of multi-device rack width adapter subsystems 502 that provide a multi-device rack width adapter system 504. While not illustrated or described in detail, one of skill in the art in possession of the present disclosure will appreciate how other adapter rails (or the adapter rail systems 600 or 700 described above) may then be mounted to the multi-device rack width adapter subsystems 502 that provide a multi-device rack width adapter system 504 (e.g., via the conventional 19-inch width rack "square hole" mounting apertures described above) and used to couple devices to the rack 200 similarly as described above.

While not illustrated or described in detail, one of skill in the art in possession of the present disclosure will appreciate how cable management elements may be mounted to the cable management beams 306*a* on the vertical supports 208*a* and 210 via the cable management element mounting apertures 306*a* defined thereon, and may be used to route cables along the front and sides 208 and 210 of the rack 200.

Thus, systems and methods have been described that provide a multi-device rack width adapter system that mounts to a rack having a rack housing with a first housing width, that defines device housings having a second housing width that is smaller than the first housing width, and that is configured to coupled multiple devices to the rack in those device housings. For example, the multi-device rack-width-adapted rack system of the present disclosure may include a multi-device rack width adapter system mounted to a rack having first and second sides defining a rack housing having a first housing width. The multi-device rack width adapter system includes a first multi-device rack width adapter subsystem in the rack housing mounted to the first side of the rack, a second multi-device rack width adapter subsystem in the rack housing mounted to the second side of the rack, and pairs of device coupling elements that each include a first device coupling element on the first multi-device rack width adapter subsystem and a second device coupling element on the second multi-device rack width adapter subsystem. Each pair of device coupling elements may couple a respective second device to the rack in a second device housing defined by that pair of device coupling elements with a second housing width that is smaller than the first housing width. As such, multiple devices that are configured to mount to relatively smaller width racks may be quickly and easily coupled to relatively larger width racks.

Figure 14:
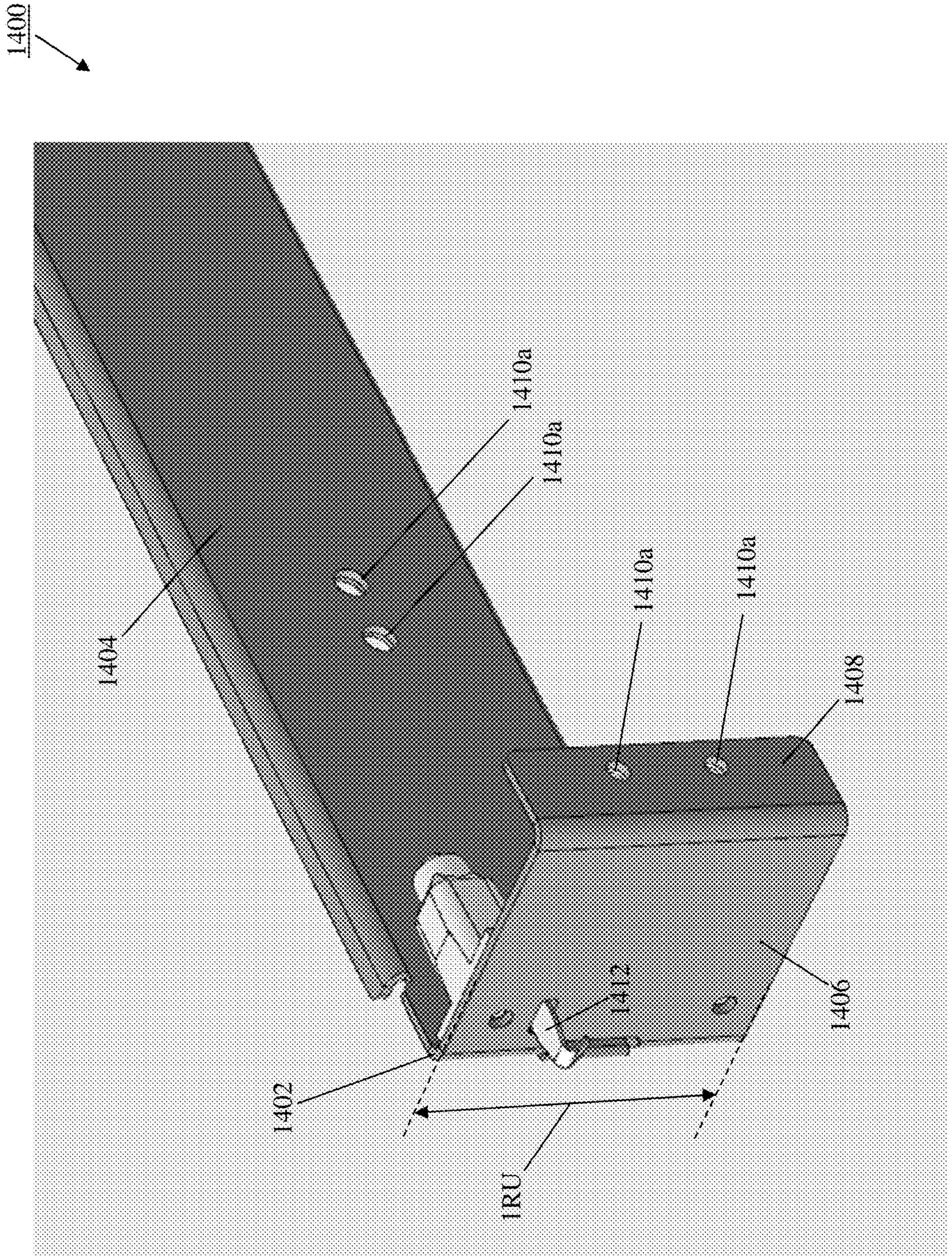
(PRIOR ART) FIG. 14
FIG. 14 is a perspective view illustrating an embodiment of a conventional 1RU rack rail.

With reference to FIG. 14, an embodiment of a conventional 1RU rack rail 1400 is illustrated for purposes of discussion below and comparison to the multi-rack-unit-device rack coupling subsystems provided in the multi-rack-unit-device rack coupling system of the present disclosure. As will be appreciated by one of skill in the art in possession of the present disclosure, the conventional 1RU rack rail 1400 may provide any of the single-device adapter rails 500 discussed above that are utilized with the multi-device rack width adapter base 400, may be utilized directly with conventional racks such as the EIA-310-D racks discussed above, and/or may be utilized directly with the rack 200 discussed above (e.g., the ORv3 rack in the specific examples provided above). In the illustrated embodiment, the conventional 1RU rack rail 1400 includes a base 1402 having a 1RU height, with a rail member 1404 that may be configured to receive corresponding device rails mounted to devices as described above, a front plate 1406 that extends substantially perpendicularly from the rail member 1404, and a mounting plate 1408 that extends substantially perpendicularly from the front plate 1406 and parallel to the rail member 1404.

The base 1402 includes a rack coupling system that is provided by a plurality of rack coupling apertures 1410*a* defined by the rail member 1404 and the mounting plate 1408, and one of skill in the art in possession of the present disclosure will recognize how the rack coupling apertures 1410*a* may be utilized to mount and secure the base 1402 to the multi-device rack width adapter base 400 discussed above in order be coupled to the rack 200, may be mounted directly to conventional racks such as the EIA-310-D racks discussed above, or may be mounted directly to the rack 200 discussed above (e.g., the ORv3 rack in the specific examples provided above). A static securing hook 1412 extends from the front plate 1406, and may be utilized to secure devices to a rack as described in further detail below.

Figure 15:
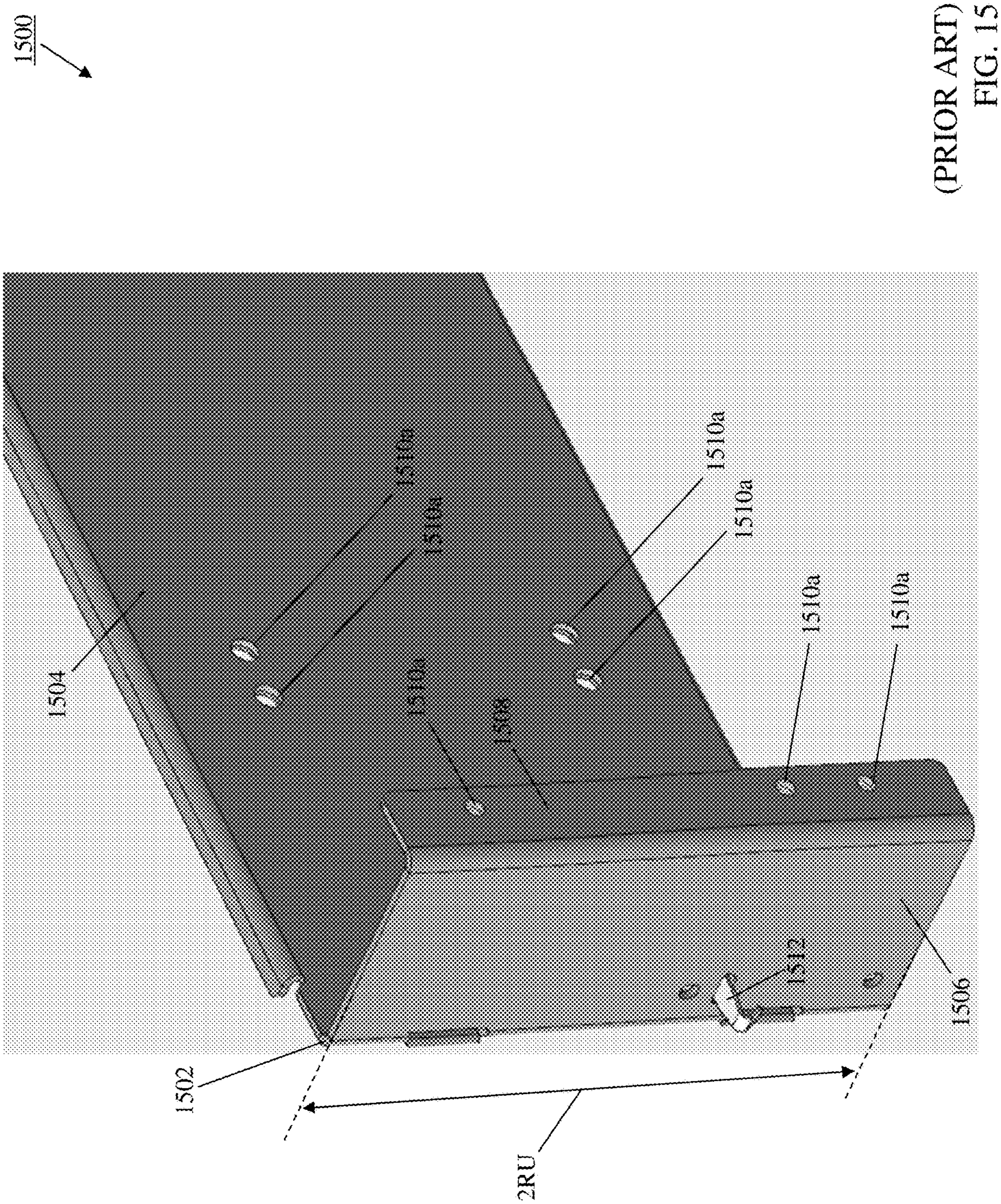
(PRIOR ART) FIG. 15
FIG. 15 is a perspective view illustrating an embodiment of a conventional 2RU rack rail.

With reference to FIG. 15, an embodiment of a conventional 2RU rack rail 1500 is illustrated for purposes of discussion below and comparison to the multi-rack-unit-device rack coupling subsystems of the multi-rack-unit-device rack coupling system of the present disclosure. As will be appreciated by one of skill in the art in possession of the present disclosure, the conventional 2RU rack rail 1500 may be utilized with the multi-device rack width adapter base 400, may be utilized directly with conventional racks such as the EIA-310-D racks discussed above, and/or may be utilized directly with the rack 200 discussed above (e.g., the ORv3 rack in the specific examples provided above). In the illustrated embodiment, the conventional 2RU rack rail 1500 includes a base 1502 having a 2RU height, with a rail member 1504 that may be configured to receive corresponding device rails mounted to devices as described above, a front plate 1506 that extends substantially perpendicularly from the rail member 1504, and a mounting plate 1508 that extends substantially perpendicularly from the front plate 1506 and parallel to the rail member 1504.

The base 1502 includes a rack coupling system that, in the illustrated embodiment, is provided by a plurality of rack coupling apertures 1510*a* defined by the rail member 1504 and the mounting plate 1508, and one of skill in the art in possession of the present disclosure will recognize how the rack coupling apertures 1510*b* may be utilized to mount and secure the base 1502 to the multi-device rack width adapter base 400 discussed above in order be coupled to the rack 200, may be utilized directly with conventional racks such as the EIA-310-D racks discussed above, and/or may be utilized directly with the rack 200 discussed above (e.g., the ORv3 rack in the specific examples provided above). A static securing hook 1512 extends from the front plate 1506, and may be utilized to secure devices to a rack as described in further detail below.

Figure 16A:
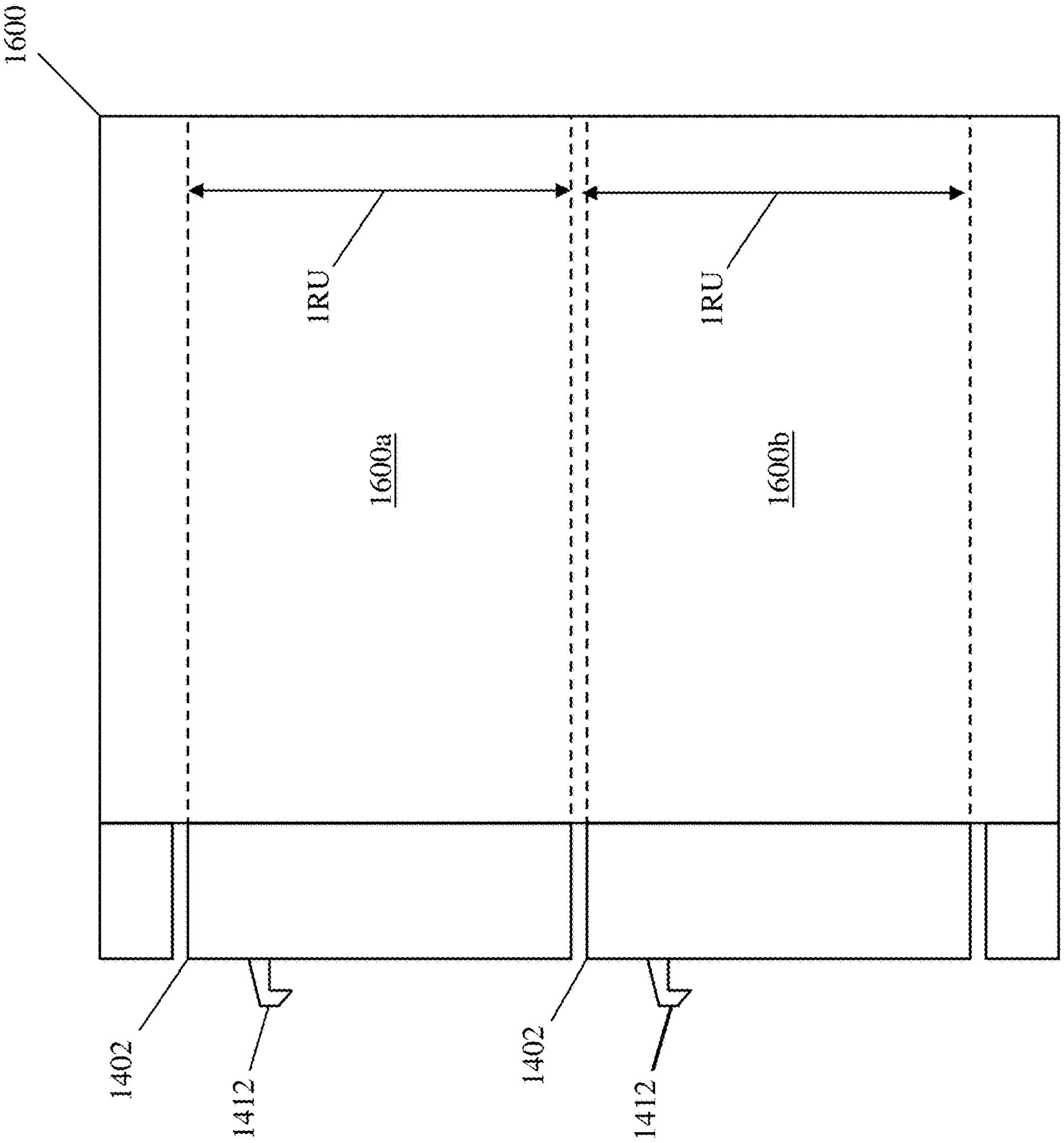
FIG. 16A (PRIOR ART)
FIG. 16A is a side view illustrating an embodiment of a plurality of the conventional 1RU rack rails of FIG. 14 provided on a rack.

As described above and in further detail below, the conventional 1RU rack rails 1400 described above are utilized to couple devices to a rack. For example, with reference to FIG. 16A, a rack 1600 defining a pair of adjacent device housings 1600*a* and 1600*b* that each include a 1RU height is illustrated, and one of skill in the art in possession of the present disclosure will appreciate how the rack 1600 may be provided by the rack 200 discussed above with reference to FIGS. 2A and 2B (e.g., the ORv3 rack in the specific examples provided above), the conventional racks such as the EIA-310-D racks discussed above, and/or other racks that would be apparent to one of skill in the art in possession of the present disclosure.

In the illustrated embodiment, a respective conventional 1RU rack rail 1400 is coupled to the rack 1600 adjacent each device housing 1600*a* and 1600*b*, and one of skill in the art in possession of the present disclosure will appreciate a pair of the conventional 1RU rack rails 1400 may be coupled to the rack 1600 on opposite sides of the device housing 1600*a*, and a pair of the conventional 1RU rack rails 1400 may be coupled to the rack 1600 on opposite sides of the device housing 1600*b*. As discussed above, in some embodiments each conventional 1RU rack rail 1400 may be mounted directly to the rack 200 discussed above with reference to FIGS. 2A and 2B (e.g., the ORv3 rack in the specific examples provided above). In other embodiments, each conventional 1RU rack rail 1400 may be mounted directly to a conventional rack such as the EIA-310-D racks discussed above. In yet another embodiment, each conventional 1RU rack rail 1400 may be mounted to the multi-device rack width adapter base 400 discussed above that is then mounted to the rack 200 discussed above with reference to FIGS. 2A and 2B (e.g., the ORv3 rack in the specific examples provided above) in order to couple each conventional 1RU rack rail 1400 to the rack 1600.

Figure 16B:
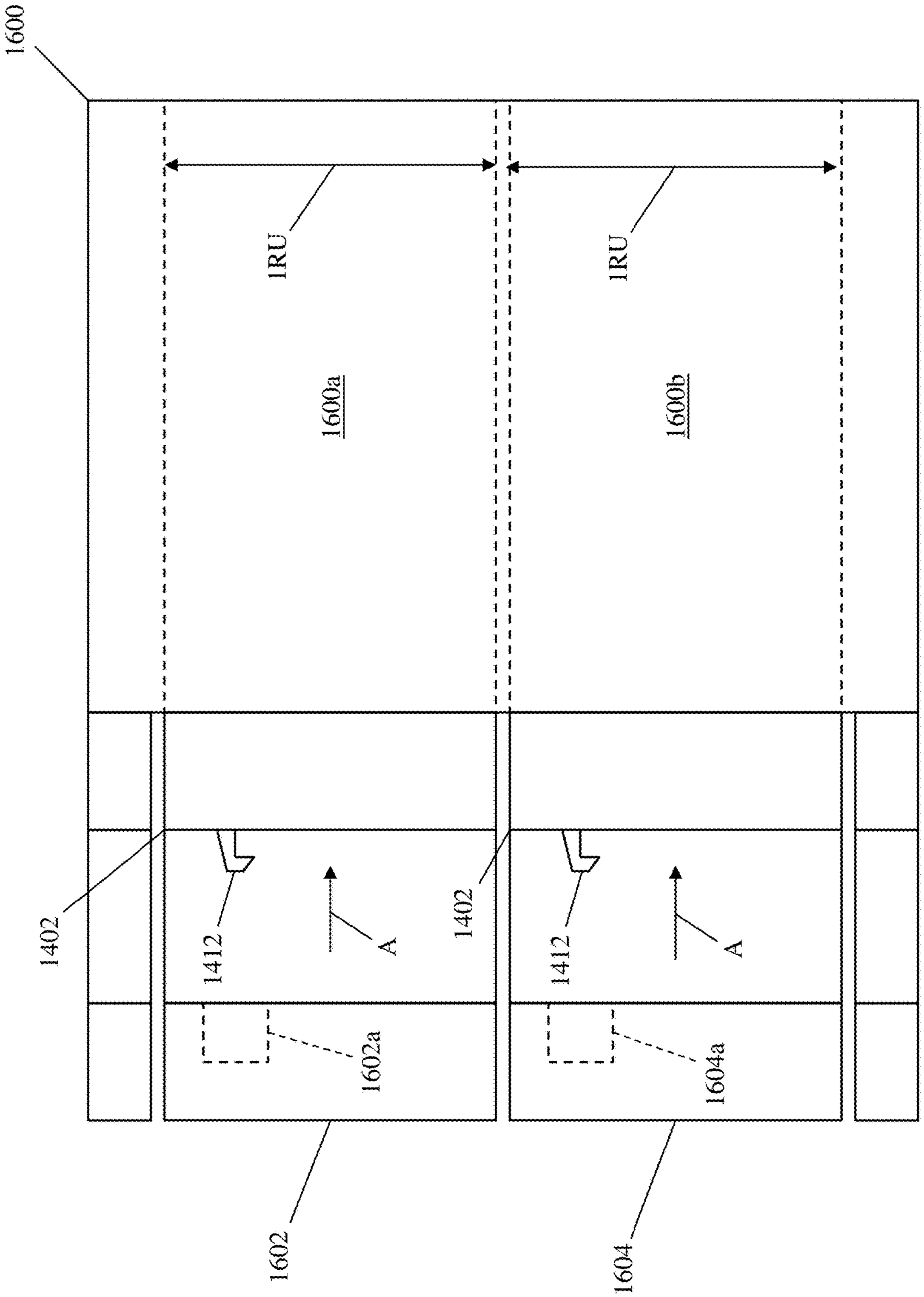
FIG. 16B (PRIOR ART)
FIG. 16B is a side view illustrating an embodiment of 1RU devices being secured to the rack of FIG. 16A via the plurality of the conventional 1RU rack rails.
Figure 16C:
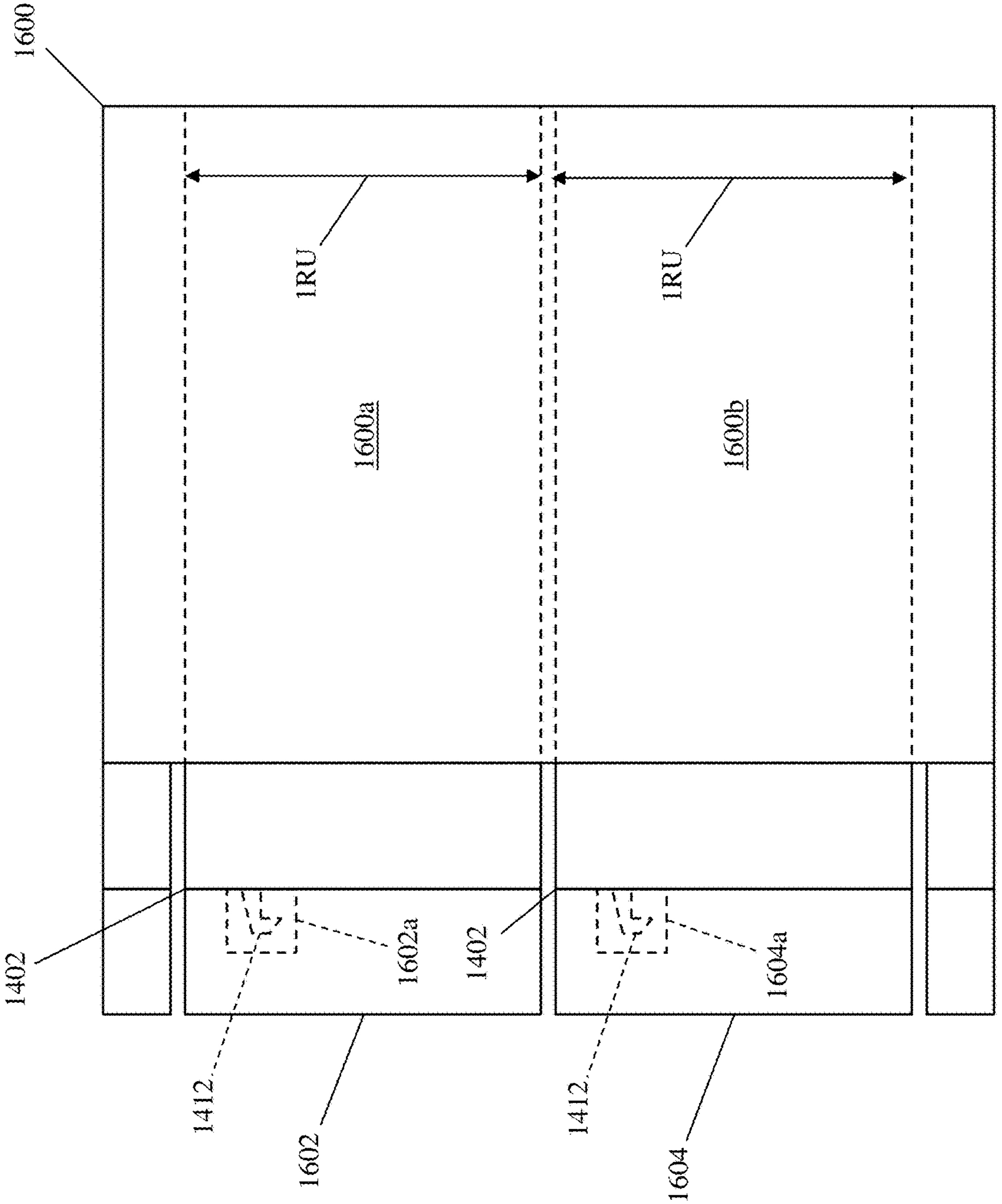
FIG. 16C (PRIOR ART)
FIG. 16C is a side view illustrating an embodiment of 1RU devices secured to the rack of FIG. 16A via the plurality of the conventional 1RU rack rails.

With reference to FIGS. 16B and 16C, a 1RU device 1602 may be positioned adjacent the conventional 1RU rack rail 1400 provided for the device housing 1600*a*, and then may be moved in a direction A and into the device housing 1600*a* such that device rails (not illustrated) on the 1RU device 1602 engage the conventional 1RU rack rail 1400 provided for the device housing 1600*a*, with continued movement of the 1RU device 1602 in the direction A causing a securing subsystem 1602*a* (e.g., a "slam latch") on the 1RU device 1602 to engage the static securing hook 1412 on the conventional 1RU rack rail 1400 provided for the device housing 1600*a* in order to secure the 1RU device 1602 to the rack 1600. Similarly, a 1RU device 1604 may be positioned adjacent the conventional 1RU rack rail 1400 provided for the device housing 1600*b*, and then may be moved in the direction A and into the device housing 1600*b* such that device rails (not illustrated) on the 1RU device 1604 engage the conventional 1RU rack rail 1400 provided for the device housing 1600*b*, with continued movement of the 1RU device 1604 in the direction A causing a securing subsystem 1604*a* (e.g., a "slam latch") on the 1RU device 1604 to engage the static securing hook 1412 on the conventional 1RU rack rail 1400 provided for the device housing 1600*b* in order to secure the 1RU device 1604 to the rack 1600.

Figure 17A:
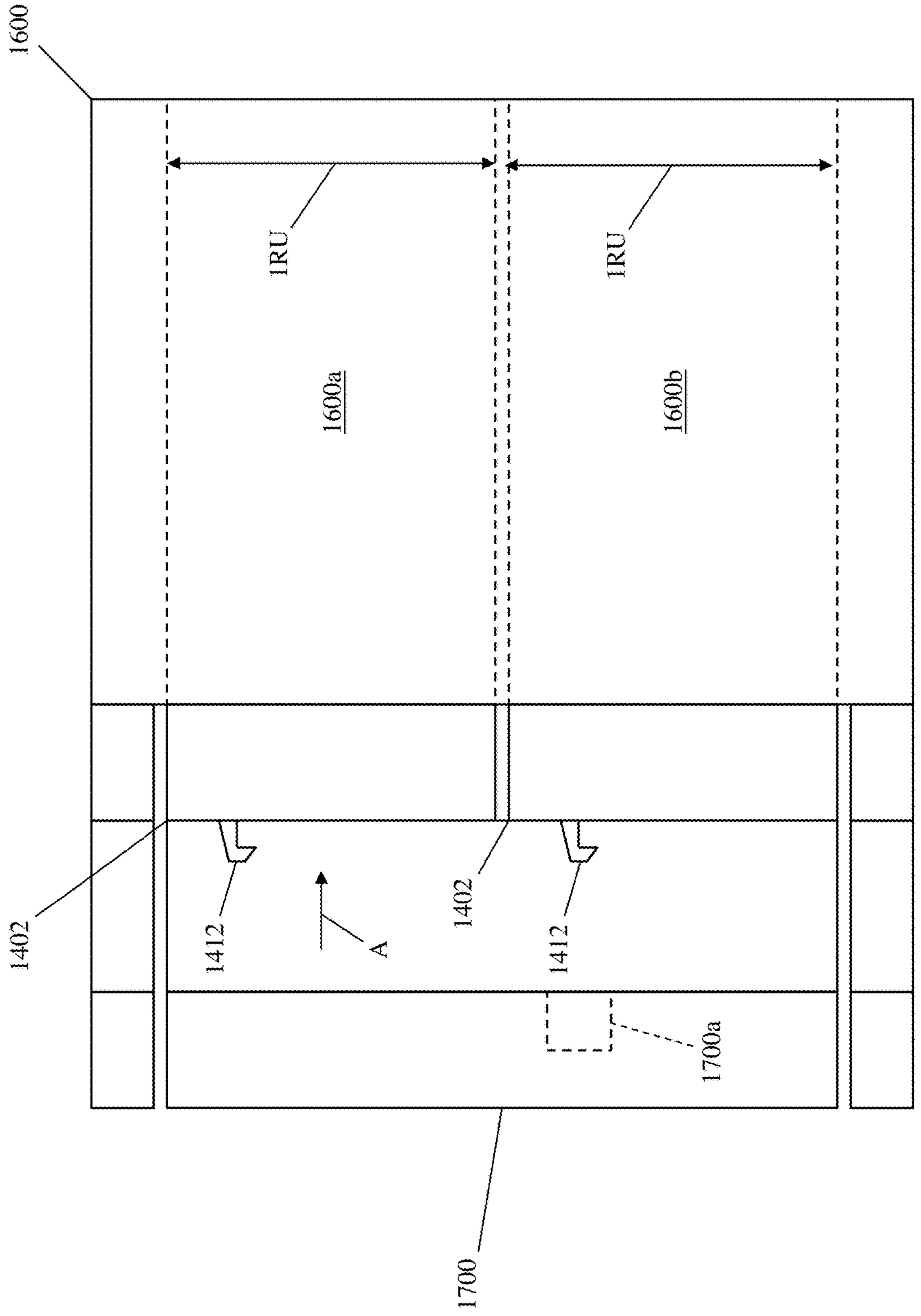
(PRIOR ART) FIG. 17A
FIG. 17A is a side view illustrating an embodiment of a 2RU device attempting to be secured to the rack of FIG. 16A via the plurality of the conventional 1RU rack rails.
Figure 17B:
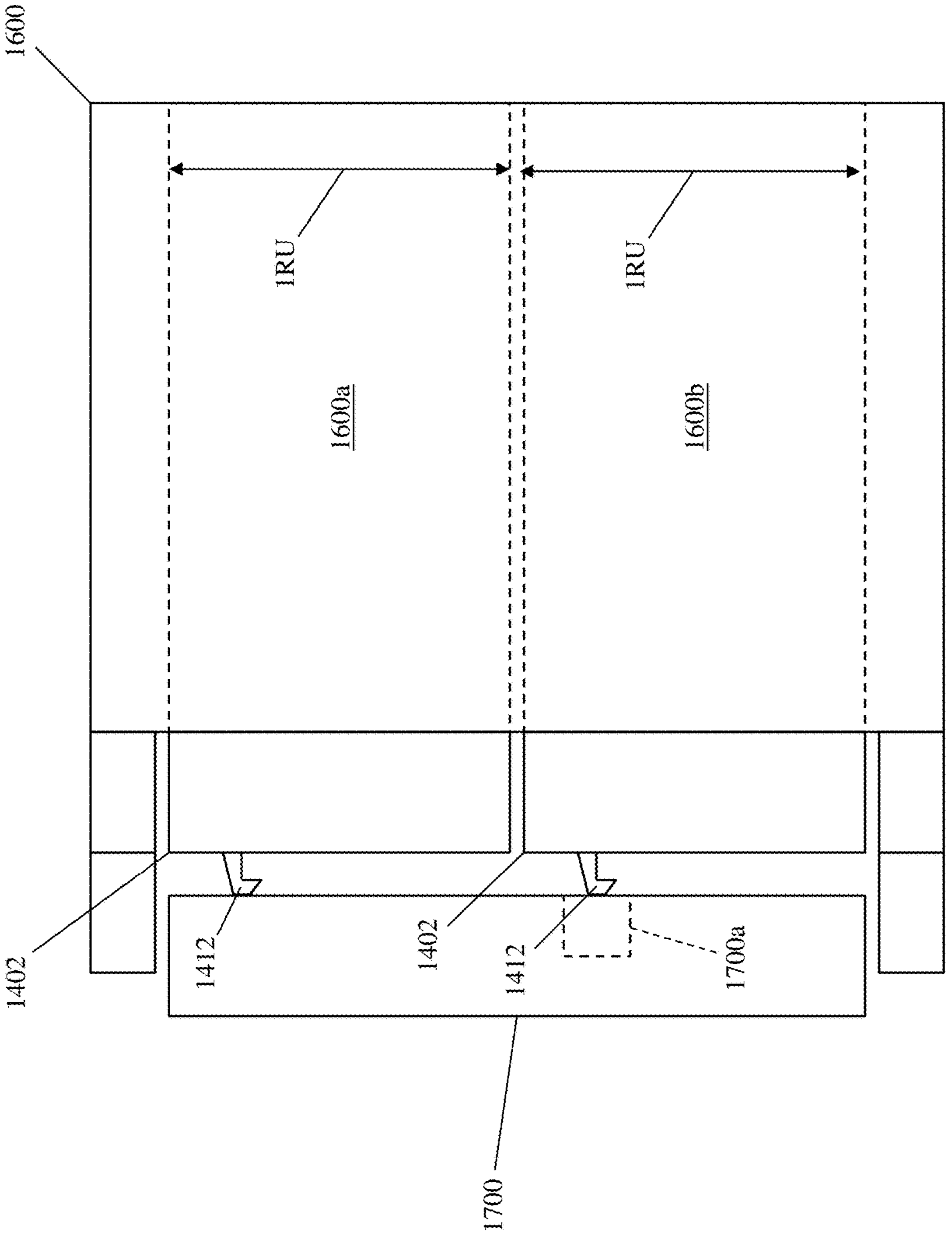
FIG. 17B (PRIOR ART)
FIG. 17B is a side view illustrating an embodiment of the plurality of the conventional 1RU rack rails on the rack of FIG. 16A preventing the securing of the 2RU device to the rack.

As described above, in situations where a 2RU device must be coupled to the rack 1600, the 1RU devices 1602 and 1604 discussed above with reference to FIGS. 16B and 16C may be removed from the rack 1600 by releasing their securing subsystems 1602*a* and 1604*a*, respectively, from the static securing hook 1412 on the conventional 1RU rack rail 1400 provided for the device housings 1600*a* and 1600*b*, respectively (e.g., via a securing subsystem release mechanism, not illustrated), in order to "free up" a 2RU device housing in the rack 1600 provided by the device housings 1600*a* and 1600*b*. However, as can be seen in FIGS. 17A and 17B, if a 2RU device 1700 is positioned adjacent the 1RU rack rails 1400 provided for the device housings 1600*a* and 1600*b*, and then moved in the direction A and into the device housings 1600*a* and 1600*b* such that device rails (not illustrated) on the 2RU device 1700 engage the 1RU rack rails 1400 provided for the device housings 1600*a* and 1600*b*, the static securing hook 1412 on the conventional 1RU rack rail 1400 provided for the device housing 1600*a* will not have a securing subsystem on the 2RU device 1700 to engage.

As such, while a securing subsystem 1700*a* (e.g., a "slam latch") on the 2RU device 1700 is aligned with the static securing hook 1412 on the conventional 1RU rack rail 1400 provided for the device housing 1600*b*, the static securing hook 1412 on the conventional 1RU rack rail 1400 provided for the device housing 1600*a* will engage the 2RU device 1700 and prevent the movement of the 2RU device 1700 further into the device housings 1600*a* and 1600*b* that would allow for the engagement of the securing subsystem 1700*a* on the 2RU device 1700 with the static securing hook 1412 on the conventional 1RU rack rail 1400 provided for the device housing 1600*b*, thus preventing the securing of the 2RU device 1700 to the rack 1600.

Figure 18A:
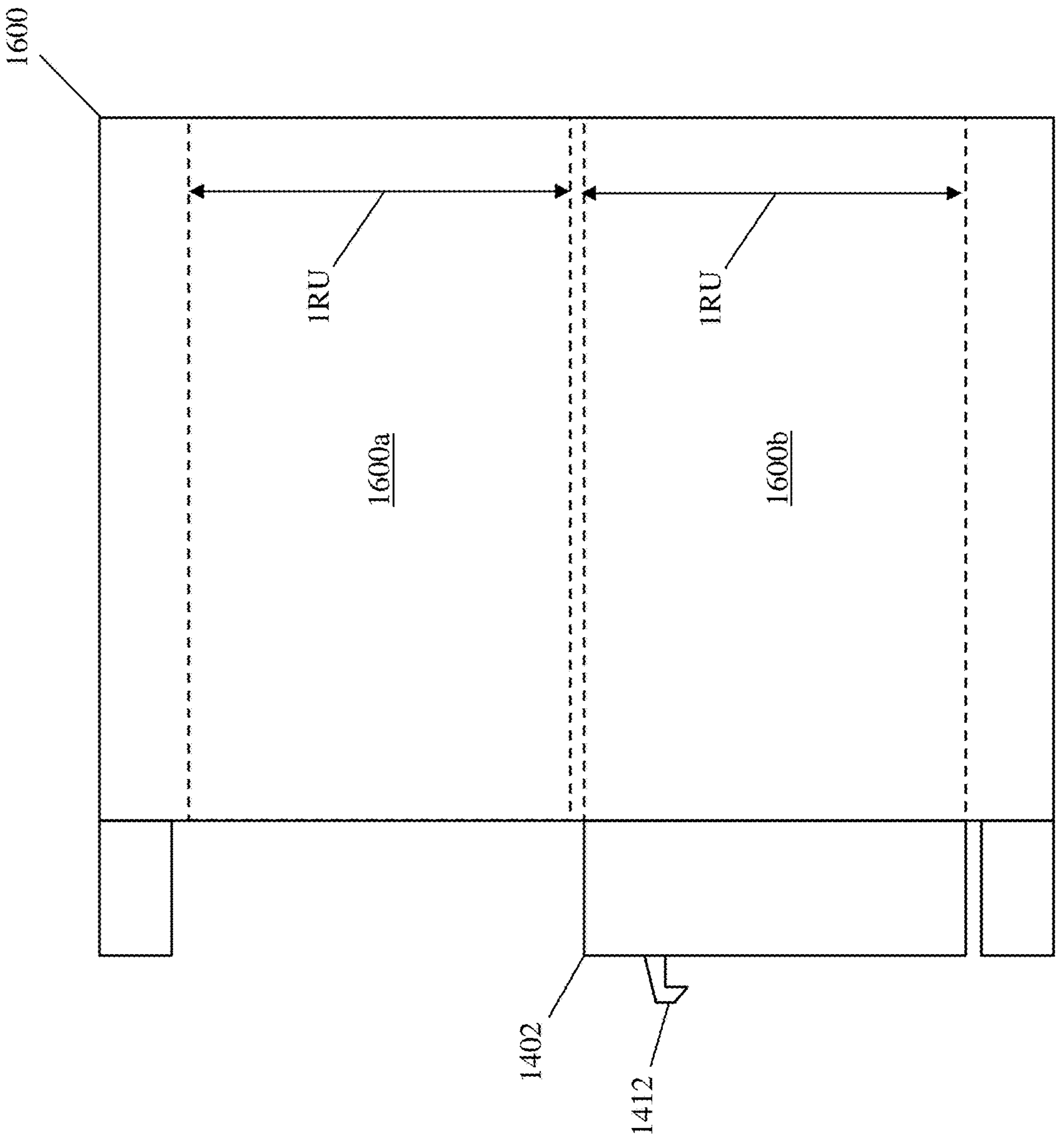
FIG. 18A (PRIOR ART)
FIG. 18A is a side view illustrating an embodiment of the removal of one of the plurality of the conventional 1RU rack rails provided on the rack of FIG. 16A to allow the 2RU device to be secured to the rack.
Figure 18B:
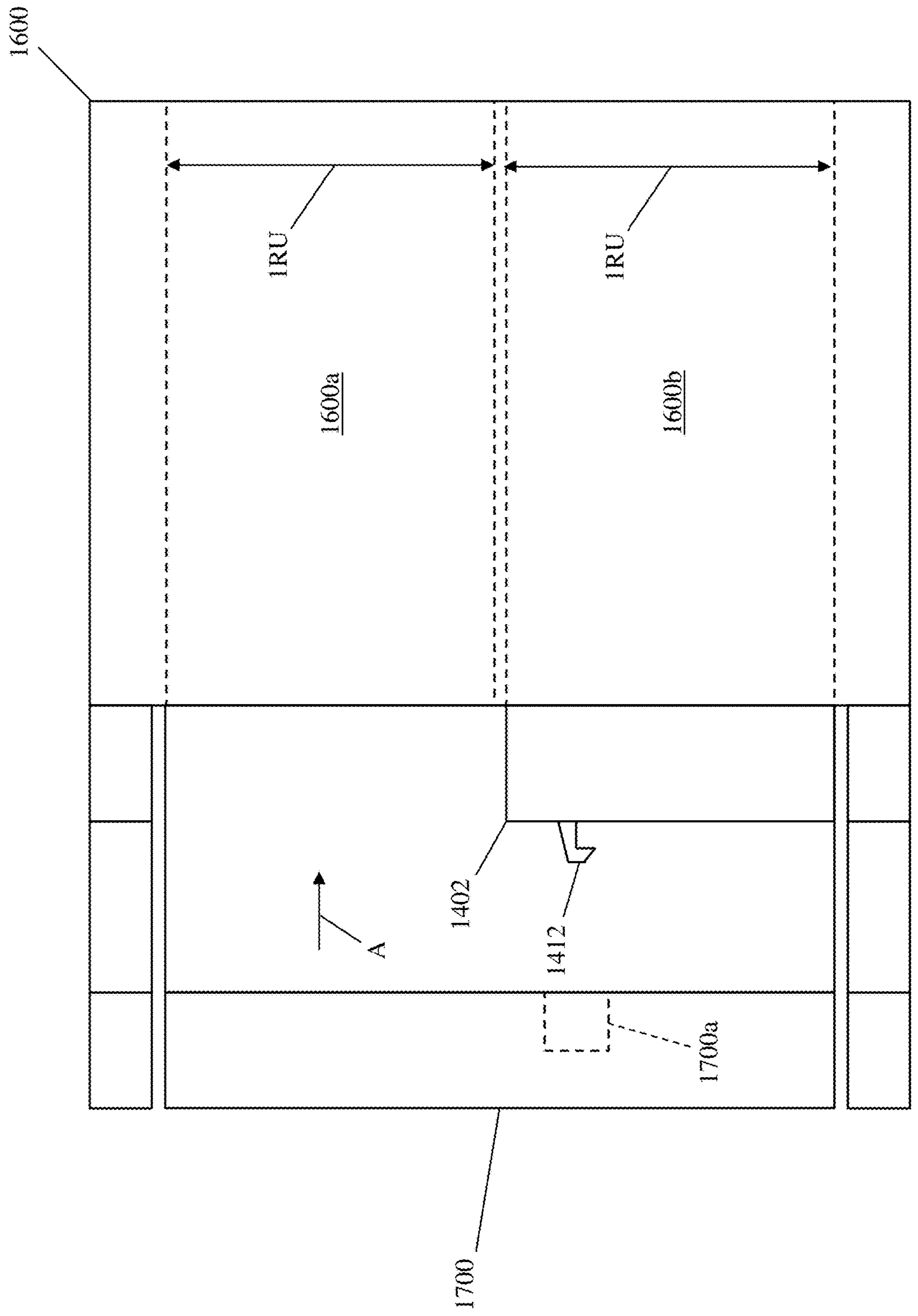
FIG. 18B (PRIOR ART)
FIG. 18B is a side view illustrating an embodiment of the 2RU device being secured to the rack of FIG. 18A via the remaining one of the plurality of the conventional 1RU rack rails.
Figure 18C:
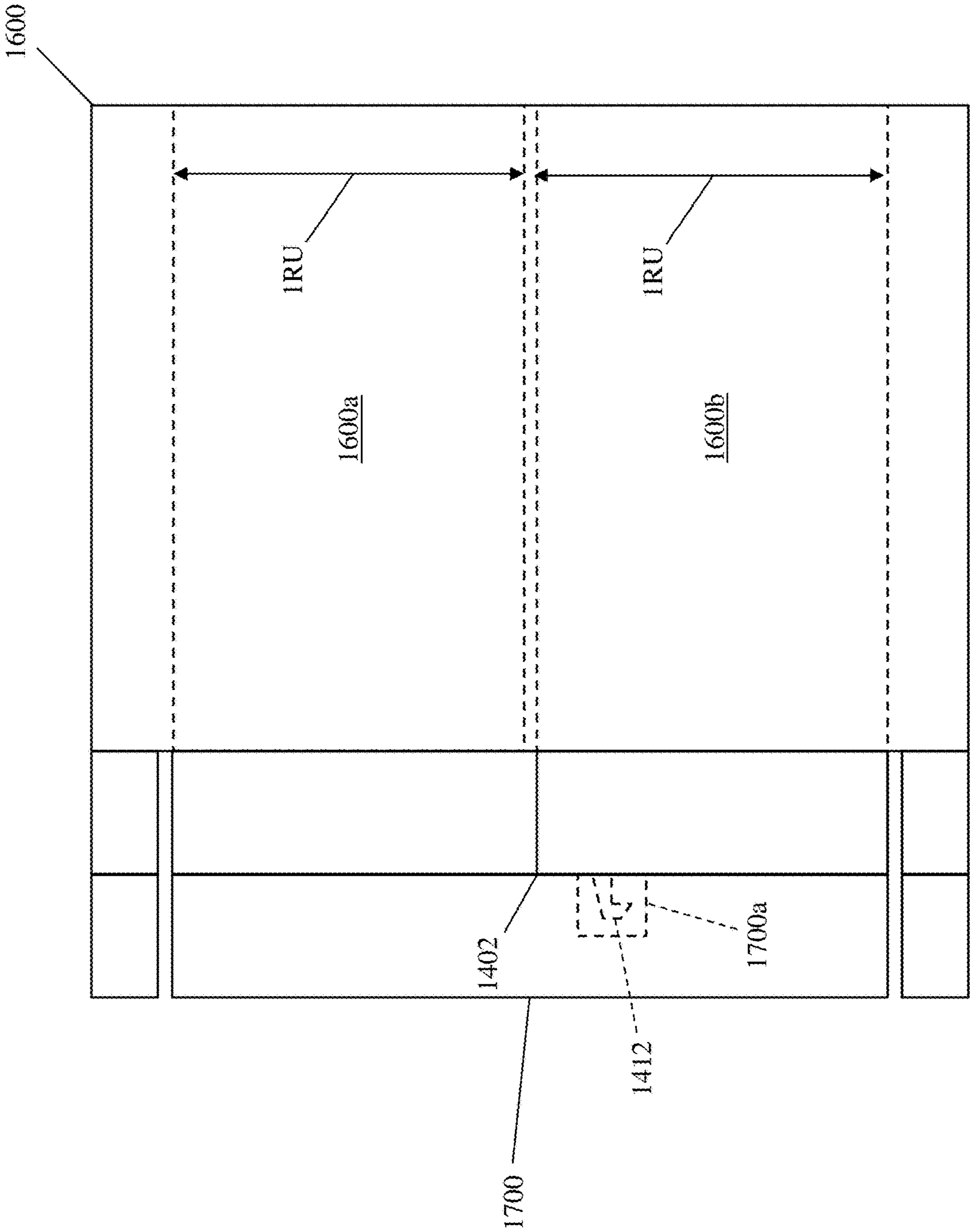
FIG. 18C (PRIOR ART)
FIG. 18C is a side view illustrating an embodiment of the 2RU device secured to the rack of FIG. 18A via the remaining one of the plurality of the conventional 1RU rack rails.

With reference to FIG. 18A, a conventional solution to the issues discussed above with coupling and securing the 2RU device 1700 to the rack 1600 include removing the 1RU rack rail 1400 that was provided for the 1RU device housing 1600*a* from the rack 1600. With reference to FIGS. 18B and 18C, the 2RU device 1700 may then be positioned adjacent the conventional 1RU rack rail 1400 provided for the device housing 1600*b* (and the device housing 1600*a* that has had its conventional 1RU rack rail removed), and then moved in the direction A and into the device housings 1600*a* and 1600*b* such that device rails (not illustrated) on the 2RU device 1700 engage the conventional 1RU rack rail 1400 provided for the device housing 1600*b*, with continued movement of the 2RU device 1700 in the direction A causing the securing subsystem 1700*a* (e.g., a "slam latch") on the 2RU device 1700 to engage the static securing hook 1412 on the conventional 1RU rack rail 1400 provided for the device housing 1600*b* in order to secure the 2RU device 1700 to the rack 1600. However, as discussed above, such conventional solutions are time consuming in that they require the removal of conventional 1RU rack rails 1400 from the rack, are aesthetically unpleasing (e.g., they result in the introduction of "gaps" like that provided by the removal of the conventional 1RU rack rail 1400 for the device housing 1600*a*), and can result in loss or misplacement of conventional 1RU rack rails (e.g., the loss or misplacement of the conventional 1RU rack rail 1400 that was removed from the device housing 1600*a* on the rack 1600).

Figure 19A:
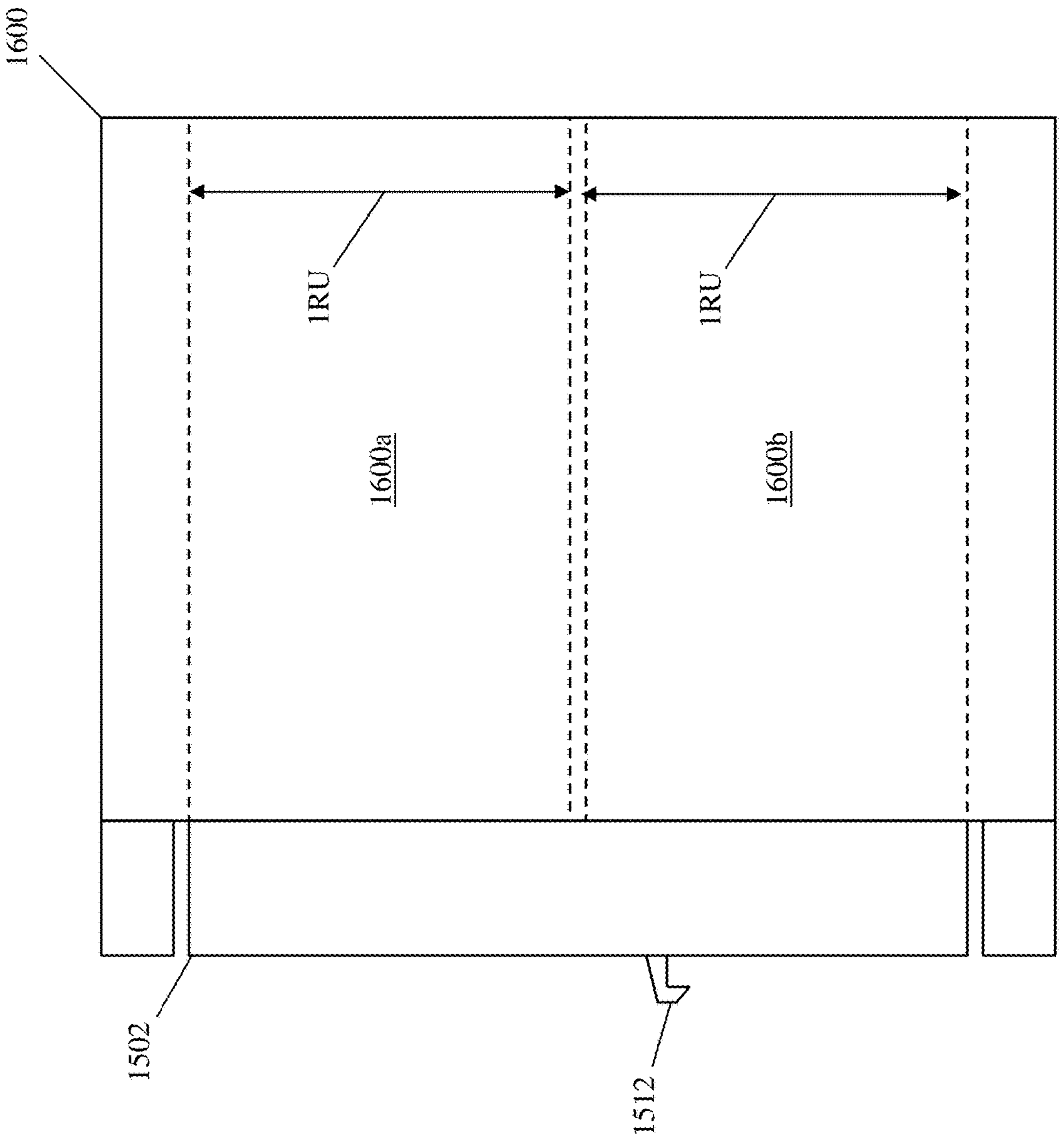
FIG. 19A (PRIOR ART)
FIG. 19A is a side view illustrating an embodiment of the conventional 2RU rack rail of FIG. 15 provided on a rack.

Another conventional solution to the issues discussed above with coupling and securing the 2RU device 1700 to the rack 1600 include removing the conventional 1RU device rails 1400 that were provided for the 1RU device housings 1600*a* and 1600*b* from the rack 1600, and replacing them with the conventional 2RU device rails 1500 discussed above with reference to FIG. 15. As illustrated in FIG. 19A, the conventional 2RU rack rail 1500 is coupled to the rack 1600 adjacent each device housing 1600*a* and 1600*b*, and one of skill in the art in possession of the present disclosure will appreciate a pair of the conventional 2RU rack rails 1500 may be coupled to the rack 1600 on opposite sides of the device housings 1600*a* and 1600*b*. As discussed above, in some embodiments each conventional 2RU rack rail 1500 may be mounted directly to the rack 200 discussed above with reference to FIGS. 2A and 2B (e.g., the ORv3 rack in the specific examples provided above). In other embodiments, each conventional 2RU rack rail 1500 may be mounted directly to a conventional rack such as the EIA-310-D racks discussed above. In yet another embodiment, each conventional 2RU rack rail 1500 may be mounted to the multi-device rack width adapter base 400 discussed above that is then mounted to the rack 200 discussed above with reference to FIGS. 2A and 2B (e.g., the ORv3 rack in the specific examples provided above) in order to couple the conventional 2RU rack rail 1500 to the rack 1600.

Figure 19B:
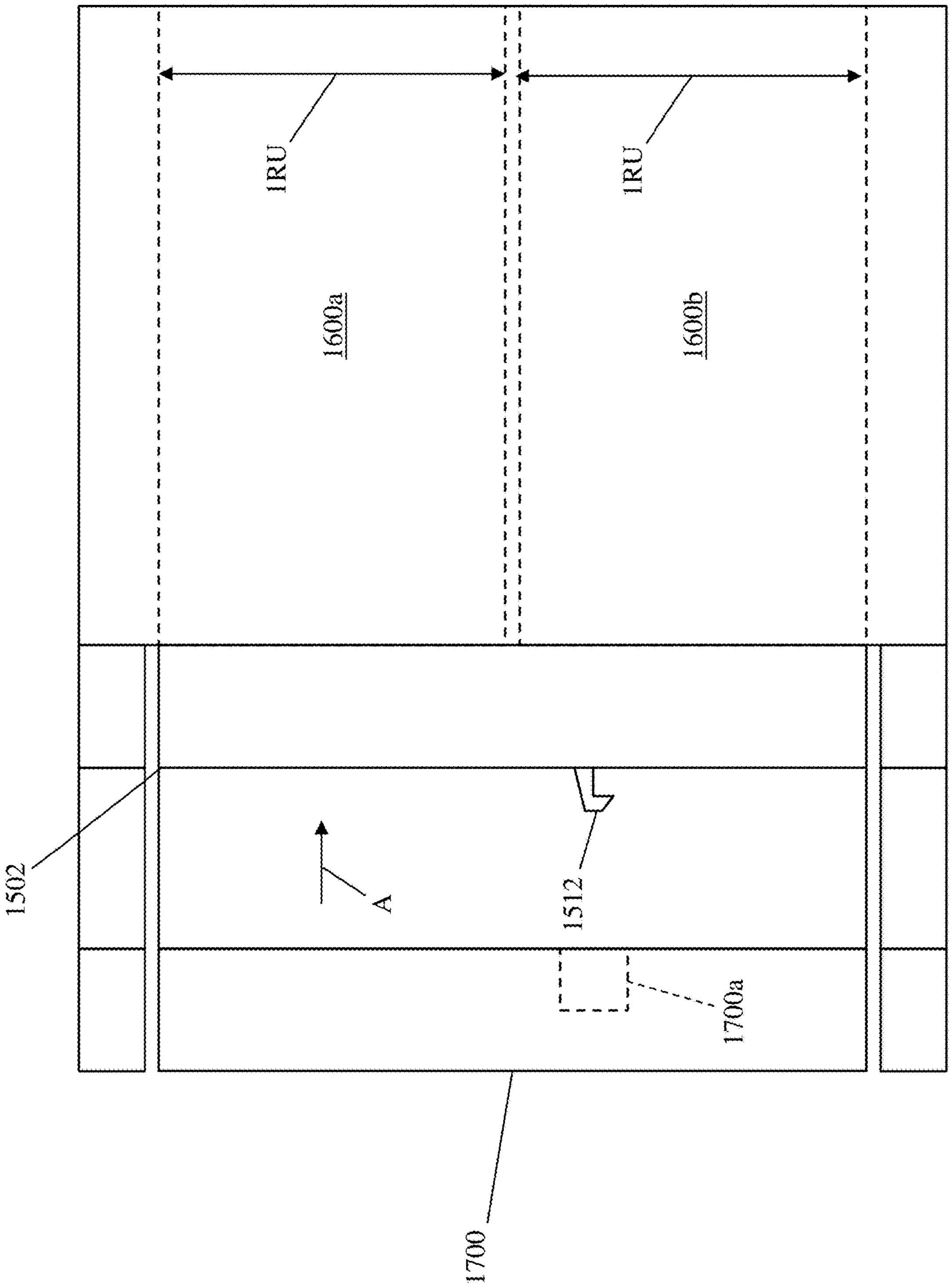
(PRIOR ART) FIG. 19B
FIG. 19B is a side view illustrating an embodiment of a 2RU device being secured to the rack of FIG. 19A via the conventional 2RU rack rail.
Figure 19C:
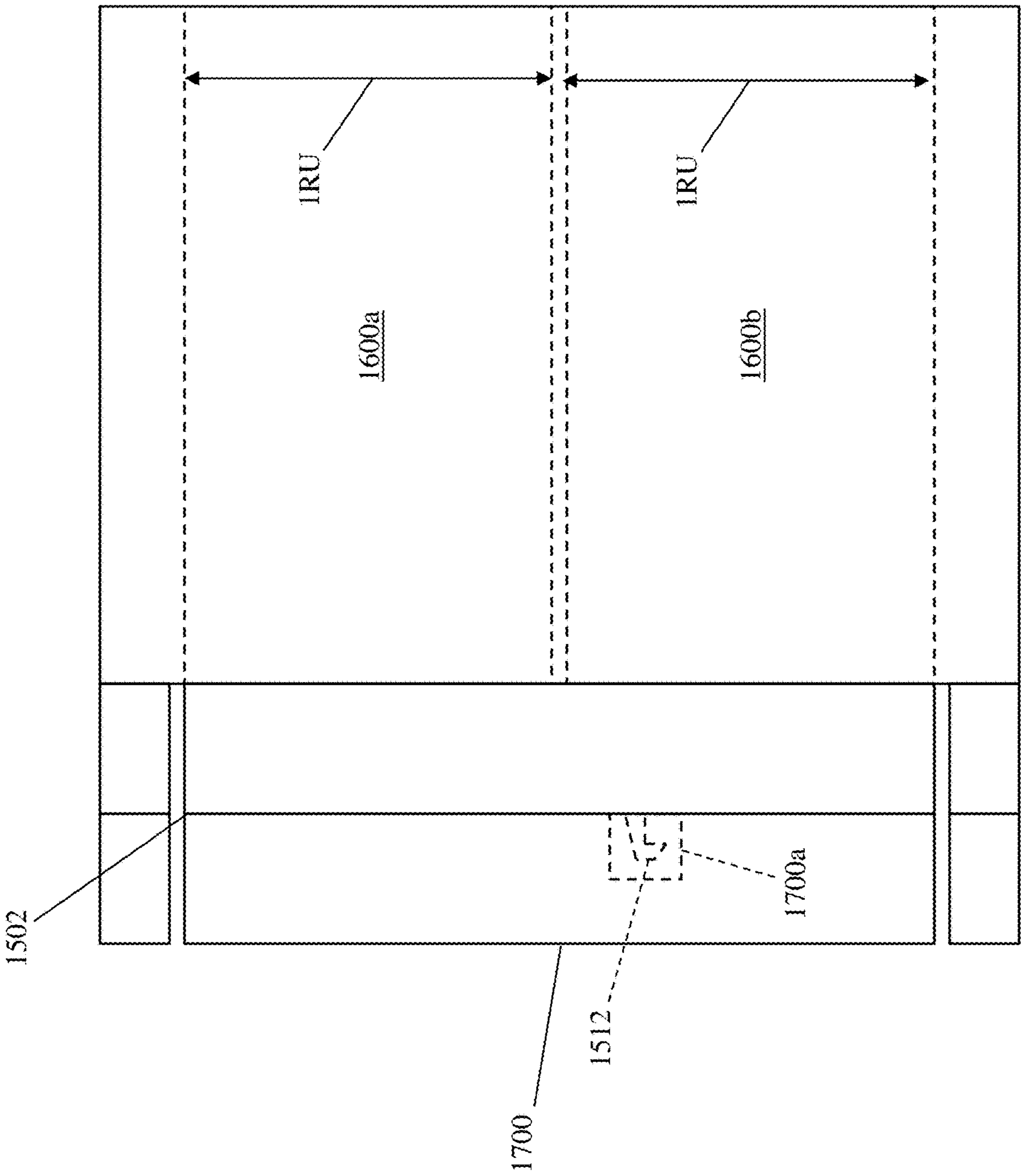
FIG. 19C (PRIOR ART)
FIG. 19C is a side view illustrating an embodiment of the 2RU device secured to the rack of FIG. 19A via the conventional 2RU rack rail.

With reference to FIGS. 19B and 19C, the 2RU device 1700 may then be positioned adjacent the conventional 2RU rack rail 1500 provided for the device housings 1600*a* and 1600*b*, and then moved in the direction A and into the device housings 1600*a* and 1600*b* such that device rails (not illustrated) on the 2RU device 1700 engage the conventional 2RU rack rail 1500 provided for the device housings 1600*a* and 1600*b*, with continued movement of the 2RU device 1700 in the direction A causing the securing subsystem 1700*a* (e.g., a "slam latch") on the 2RU device 1700 to engage the static securing hook 1512 on the conventional 2RU rack rail 1500 provided for the device housings 1600*a* and 1600*b* in order to secure the 2RU device 1700 to the rack 1600. However, as discussed above, such conventional solutions that require different rack rails for each RU height device that will be used in the rack are costly, and the need to swap out different RU height rack rails for different RU devices is time consuming.

The inventors of the present disclosure have developed a multi-rack-unit-device rack coupling system that addresses the issues discussed above via the use of multi-rack-unit-device rack coupling subsystems that each include a moveable device securing member. As described below, the moveable device securing member on any multi-rack-unit-device rack coupling subsystem provided in a rack adjacent a corresponding device housing is configured to 1) engage a securing subsystem on a device to secure that device to the rack when that device is positioned in that corresponding device housing with that securing subsystem located in that corresponding device housing, and 2) to move when a device is positioned in that corresponding device housing with its securing subsystem located in a different device housing in order to allow a securing subsystem on a different multi-rack-unit-device rack coupling subsystem provided in the rack adjacent that different device housing to secure the device to the rack.

Figure 20A:
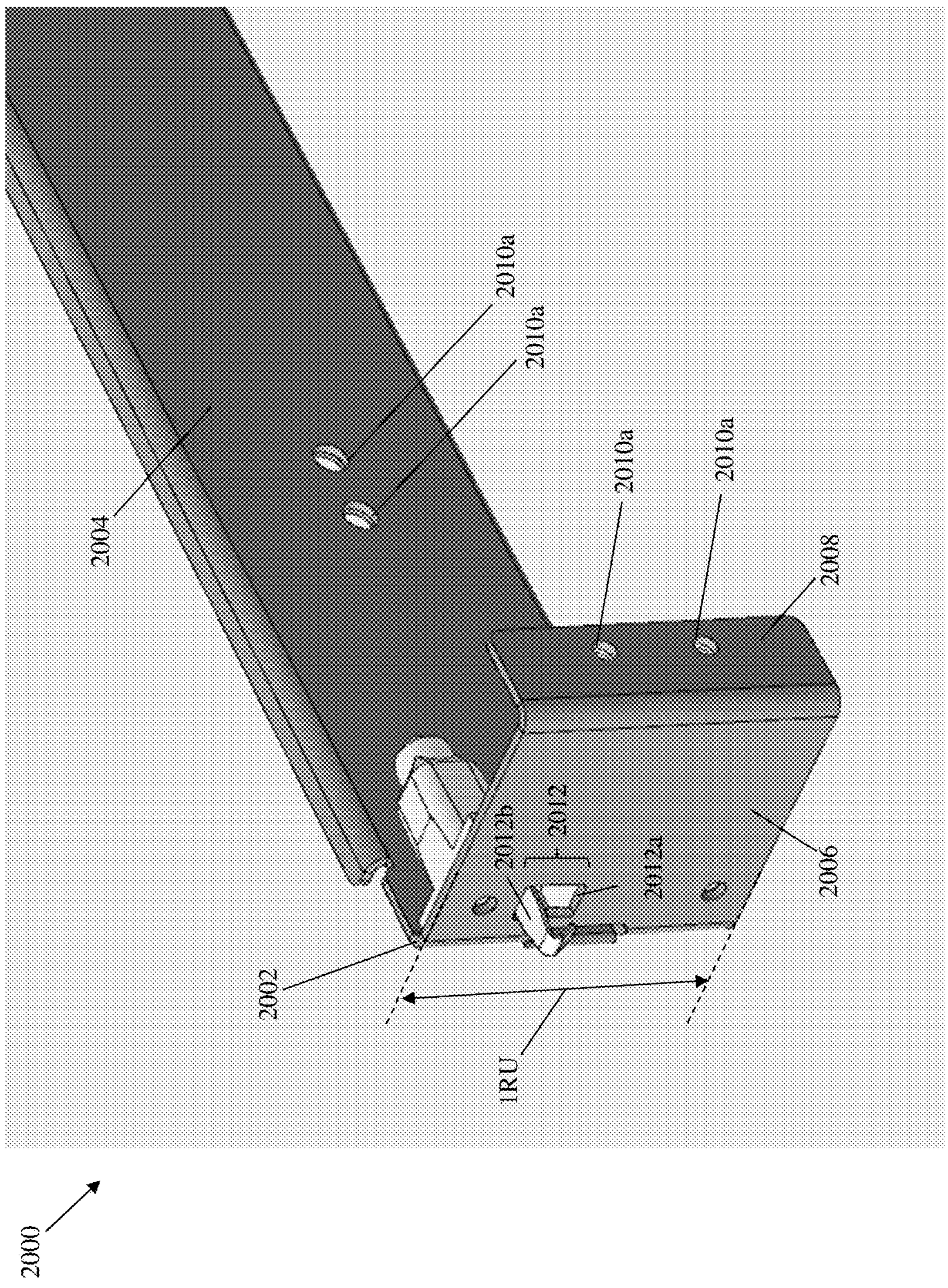
FIG. 20A is a perspective view illustrating an embodiment of multi-rack-unit-device rack coupling subsystem that may be included in the multi-rack-unit-device rack coupling system of the present disclosure.

With reference to FIG. 20A, an embodiment of a multi-rack-unit-device rack coupling subsystem 2000 that may be included in the multi-rack-unit-device rack coupling system of the present disclosure is illustrated. As will be appreciated by one of skill in the art in possession of the present disclosure, the multi-rack-unit-device rack coupling subsystem 2000 may provide any of the single-device adapter rails 500 discussed above that are utilized with the multi-device rack width adapter base 400, may be utilized directly with conventional racks such as the EIA-310-D racks discussed above, and/or may be utilized directly with the rack 200 discussed above (e.g., the ORv3 rack in the specific examples provided above).

In the illustrated embodiment, the multi-rack-unit-device rack coupling subsystem 2000 includes a base 2002 having a 1RU height, with the specific examples of the base 2002 provided herein including a rail member 2004 that may be configured to receive corresponding device rails mounted to devices, a front plate 2006 that extends substantially perpendicularly from the rail member 2004, and a mounting plate 2008 that extends substantially perpendicularly from the front plate 2006 and parallel to the rail member 2004. However, while described as using rails for device/rack coupling, one of skill in the art in possession of the present disclosure will appreciate how the teachings of the present disclosure may be utilized with other device/rack coupling techniques while remaining within the scope of the present disclosure as well.

The base 2002 includes a rack coupling system that, in the illustrated embodiment, is provided by a plurality of rack coupling apertures 2010*a* defined by the rail member 2004 and the mounting plate 2008, and one of skill in the art in possession of the present disclosure will recognize how the rack coupling apertures 2010*b* may be utilized to mount and secure the base 2002 to the multi-device rack width adapter base 2000 discussed above in order be coupled to the rack 200, or may be mounted directly to conventional racks such as the EIA-310-D racks discussed above, or directly to the rack 200 discussed above (e.g., the ORv3 rack in the specific examples provided above).

In the illustrated embodiment, a moveable device securing system 2012 is included on the front plate 2006 of the base 2002, and in the specific examples provided herein includes a moveable device securing member aperture 2012*a* that is defined by the front plate 2006 and extends through the front plate 2006, and a moveable device securing member 2012*b* that may extend through the moveable device securing member aperture 2012*a* and from a surface of the front plate 2006 as illustrated in FIG. 20A. In the specific examples provided herein the moveable device securing member 2012*b* is illustrated and described as being provided by a moveable securing hook, but one of skill in the art in possession of the present disclosure will recognize how the moveable device securing member 2012*b* may be provided using other securing components that will fall within the scope of the present disclosure. As illustrated and described in further detail below, the moveable device securing member 2012*b* may be configured to move relative to the front plate 2006 of the base 2002 and through the moveable device securing member aperture 2012*a* such that the moveable device securing member 2012*b* no longer extends from the surface of the front plate 2006.

Figure 20B:
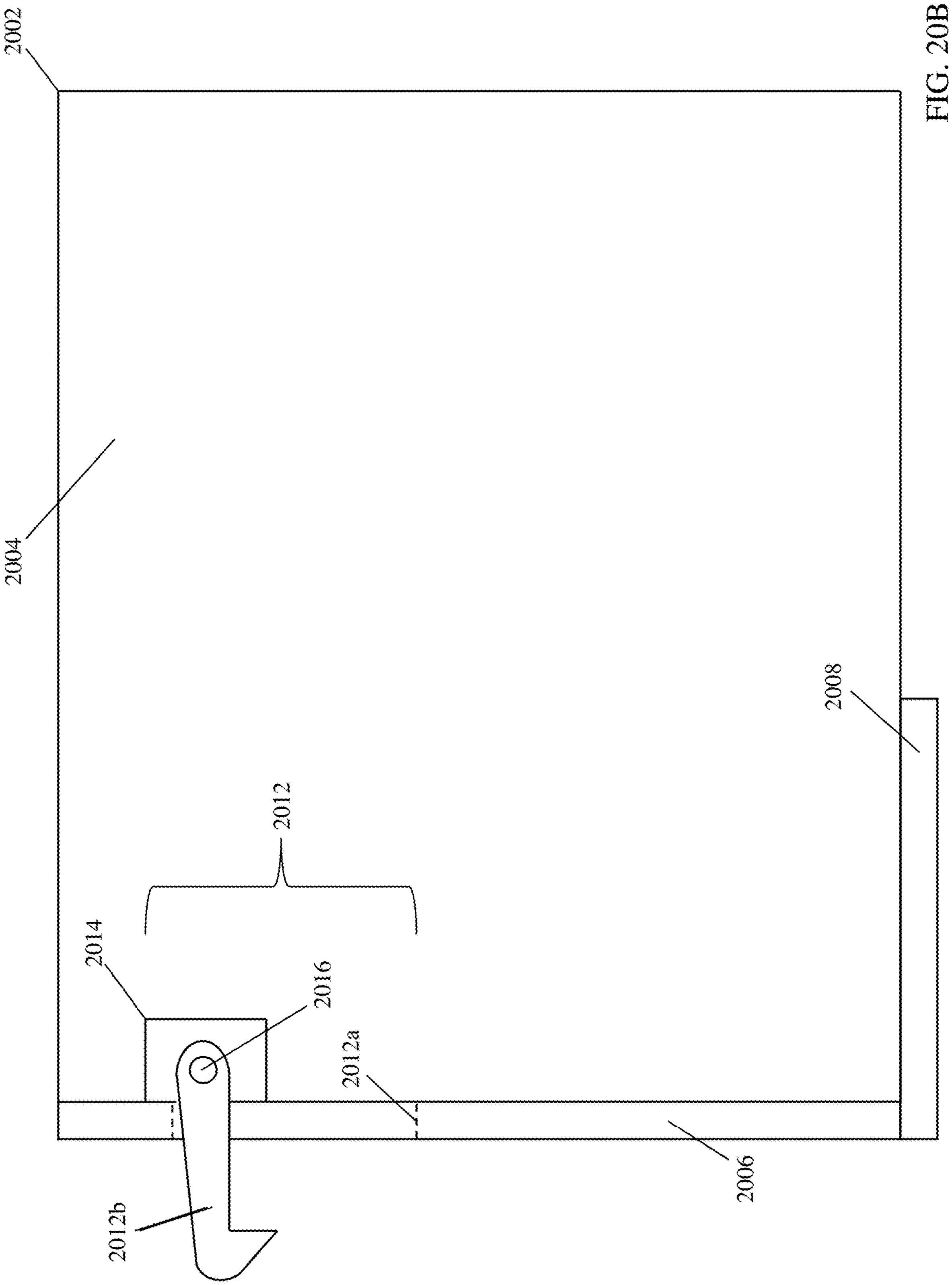
FIG. 20B is a side view illustrating an embodiment of a moveable device securing member on the multi-rack-unit-device rack coupling subsystem of FIG. 20A.

For example, with reference to FIG. 20B, the moveable device securing system 2012 may also include a moveable device securing member support 2014 that may be mounted to the rail member 2004 and/or front plate 2006 of the base 2002, and a rotatable coupling element 2016 that rotatably couples the moveable device securing member 2012*b* to the moveable device securing member support 2014 and allows the moveable device securing member 2012*b* to rotate relative to the front plate 2006 of the base 2002 as discussed in further detail below. In a specific example, the rotatable coupling element 2016 may include a torsion spring that is configured to bias the moveable device securing member 2012*b* into an extended orientation in which the moveable device securing member 2012*b* extends through the moveable device securing member aperture 2012*a* and from the surface of front plate 2006 as illustrated in FIGS. 20A and 20B.

Figure 20C:
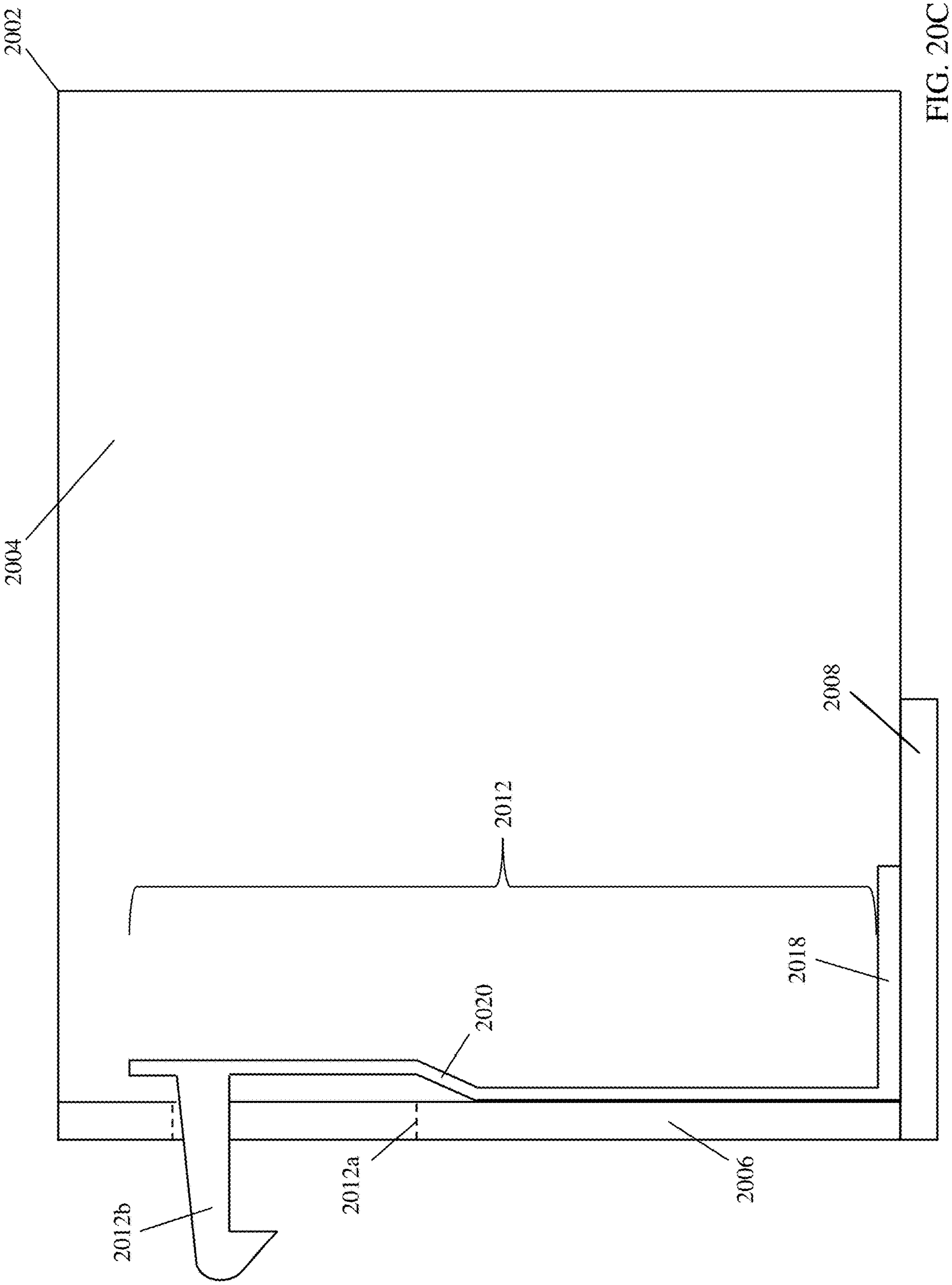
FIG. 20C is a side view illustrating an embodiment of a moveable device securing member on the multi-rack-unit-device rack coupling subsystem of FIG. 20A.

In another example, with reference to FIG. 20C, the moveable device securing system 2012 may also include a moveable device securing member support 2018 that may be mounted to the mounting plate 2008 and/or front plate 2006 of the base 2002, and a deflectable coupling element 2020 that deflectably couples the moveable device securing member 2012*b* to the moveable device securing member support 2018 and allows the moveable device securing member 2012*b* to deflect relative to the front plate 2006 of the base 2002 as discussed in further detail below. In a specific example, the deflectable coupling element 2020 may include a flat spring that is configured to bias the moveable device securing member 2012*b* into an extended orientation in which the moveable device securing member 2012*b* extends through the moveable device securing member aperture 2012*a* and from the surface of the front plate 2006 as illustrated in FIGS. 20A and 20C. However, while a few specific examples of moveable device securing systems have been described, one of skill in the art in possession of the present disclosure will appreciate how the moveable device securing member of the present disclosure may be provided in a variety of manners that will fall within the scope of the present disclosure.

Figure 21:
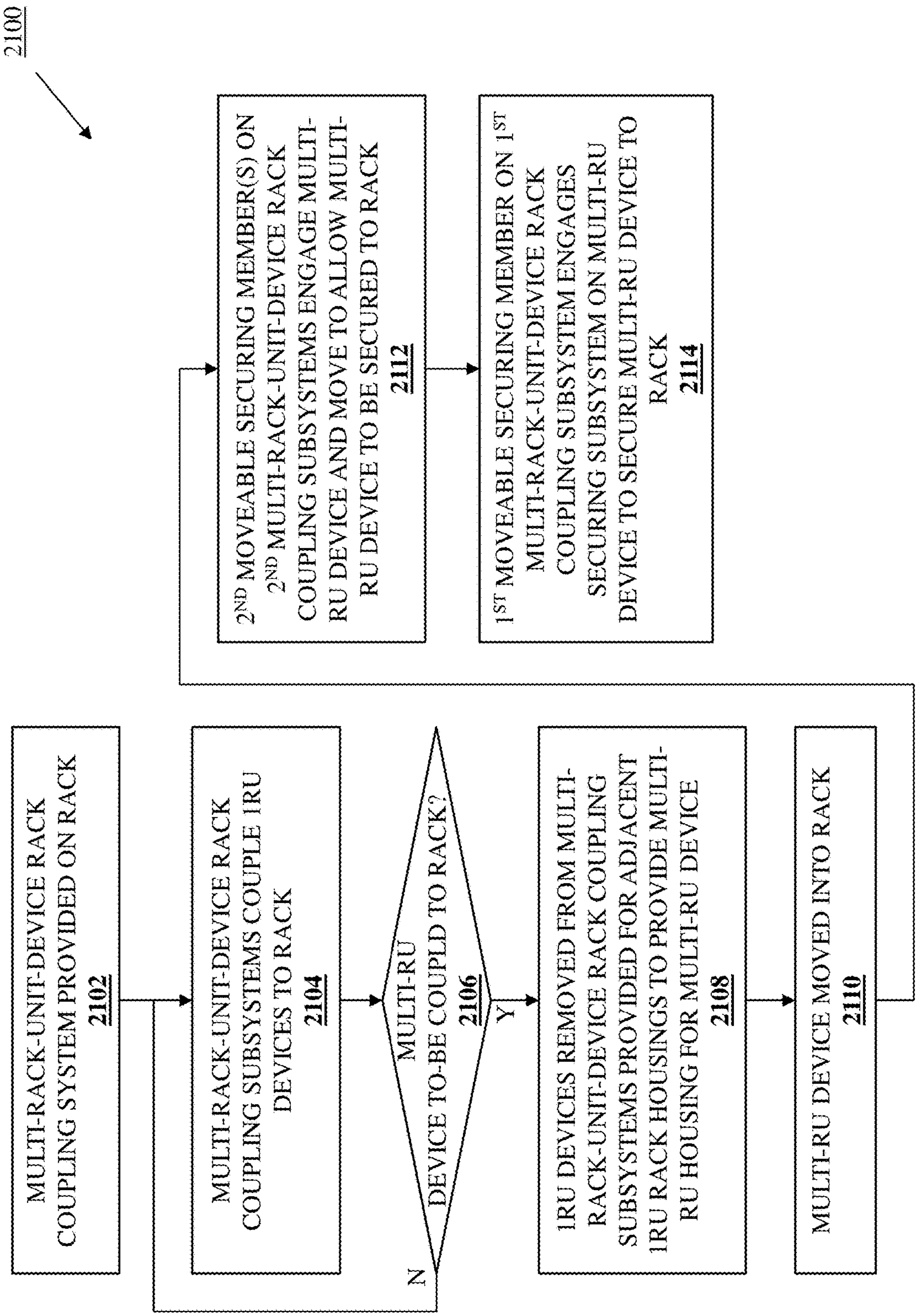
FIG. 21 is a flow chart illustrating an embodiment of a method for coupling multiple-rack-unit-devices to a rack.

With reference to FIG. 21, an embodiment of a method 2100 for coupling multiple-rack-unit-devices to a rack is illustrated. As discussed below, the systems and methods of the present disclosure provide securing members on rack coupling subsystems that are configured to move in response to engagement with multi-rack-unit devices, thus allowing any securing member on a rack coupling subsystem provided for a first device housing in a rack to engage a securing subsystem on a 1RU device to secure that 1RU device to the rack in that first device housing, and move in response to engagement with a multi-RU device when that multi-RU device is configured to be secured to the rack by a securing member on a rack coupling subsystem provided for a second device housing in the rack. As such, a rack provided with a plurality of the multi-rack-unit-device rack coupling subsystems of the present disclosure may have 1RU or multi-RU devices secured thereto without requiring the removal of any of the multi-rack-unit-device rack coupling subsystems.

Figure 22A:
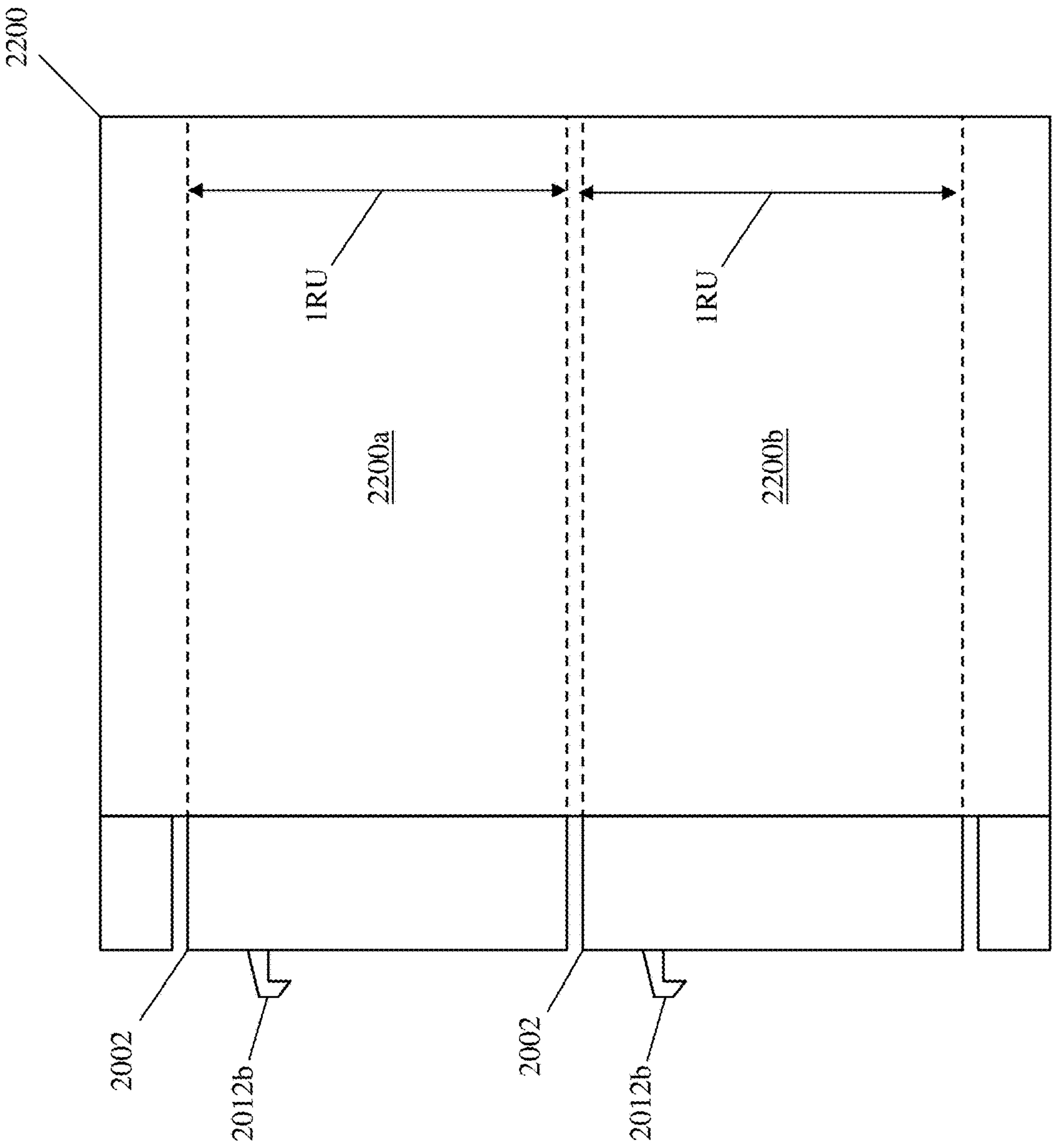
FIG. 22A is a side view illustrating an embodiment of a plurality of the multi-rack-unit-device rack coupling subsystems of FIG. 20A provided on a rack.

The method 2100 begins at block 2102 where a multi-rack-unit-device rack coupling system is provided on a rack. With reference to FIG. 22A, in an embodiment of block 2102, a rack 2200 defining a pair of adjacent device housings 2200*a* and 2200*b* that each include a 1RU height is illustrated, and one of skill in the art in possession of the present disclosure will appreciate how the rack 2200 may be provided by the rack 200 discussed above with reference to FIGS. 2A and 2B (e.g., the ORv3 rack in the specific examples provided above), the conventional racks such as the EIA-310-D racks discussed above, and/or other racks that would be apparent to one of skill in the art in possession of the present disclosure.

In the illustrated embodiment, a respective multi-rack-unit-device rack coupling subsystem 2000 is coupled to the rack 2200 adjacent each device housing 2200*a* and 2200*b*, and one of skill in the art in possession of the present disclosure will appreciate a pair of the multi-rack-unit-device rack coupling subsystems 2000 may be coupled to the rack 2200 on opposite sides of the device housing 2200*a*, and a pair of the multi-rack-unit-device rack coupling subsystems 2000 may be coupled to the rack 2200 on opposite sides of the device housing 2200*b*. Furthermore, while only two 1RU device housings are illustrated and described in detail herein, one of skill in the art in possession of the present disclosure will appreciate how a pair of the multi-rack-unit-device rack coupling subsystems 2000 may be coupled to the rack 2200 on opposite sides of any device housing defined by the rack 2200 while remaining within the scope of the present disclosure as well.

As discussed above, in some embodiments each multi-rack-unit-device rack coupling subsystem 2000 may be mounted directly to the rack 200 discussed above with reference to FIGS. 2A and 2B (e.g., the ORv3 rack in the specific examples provided above). In other embodiments, each multi-rack-unit-device rack coupling subsystem 2000 may be mounted directly to a conventional rack such as the EIA-310-D racks discussed above. In yet another embodiment, each multi-rack-unit-device rack coupling subsystem 2000 may be mounted to the multi-device rack width adapter base 400 discussed above that is then mounted to the rack 200 discussed above with reference to FIGS. 2A and 2B (e.g., the ORv3 rack in the specific examples provided above) in order to couple each multi-rack-unit-device rack coupling subsystem 2000 to the rack 1600.

As such, in embodiments that utilize the multi-device rack width adapter base 400 discussed above, each multi-device rack width adapter base 400 may be provided to a user with a plurality of the multi-rack-unit-device rack coupling subsystems 2000 mounted thereto (e.g., the multi-device rack width adapter base 400 with ten multi-rack-unit-device rack coupling subsystems 2000 mounted thereto in the specific example provided above), allowing those multi-device rack width adapter bases 400 to be quickly and easily mounted to the rack 200 to allow any devices to be quickly and easily coupled to the rack 200 as described in further detail below.

Figure 22B:
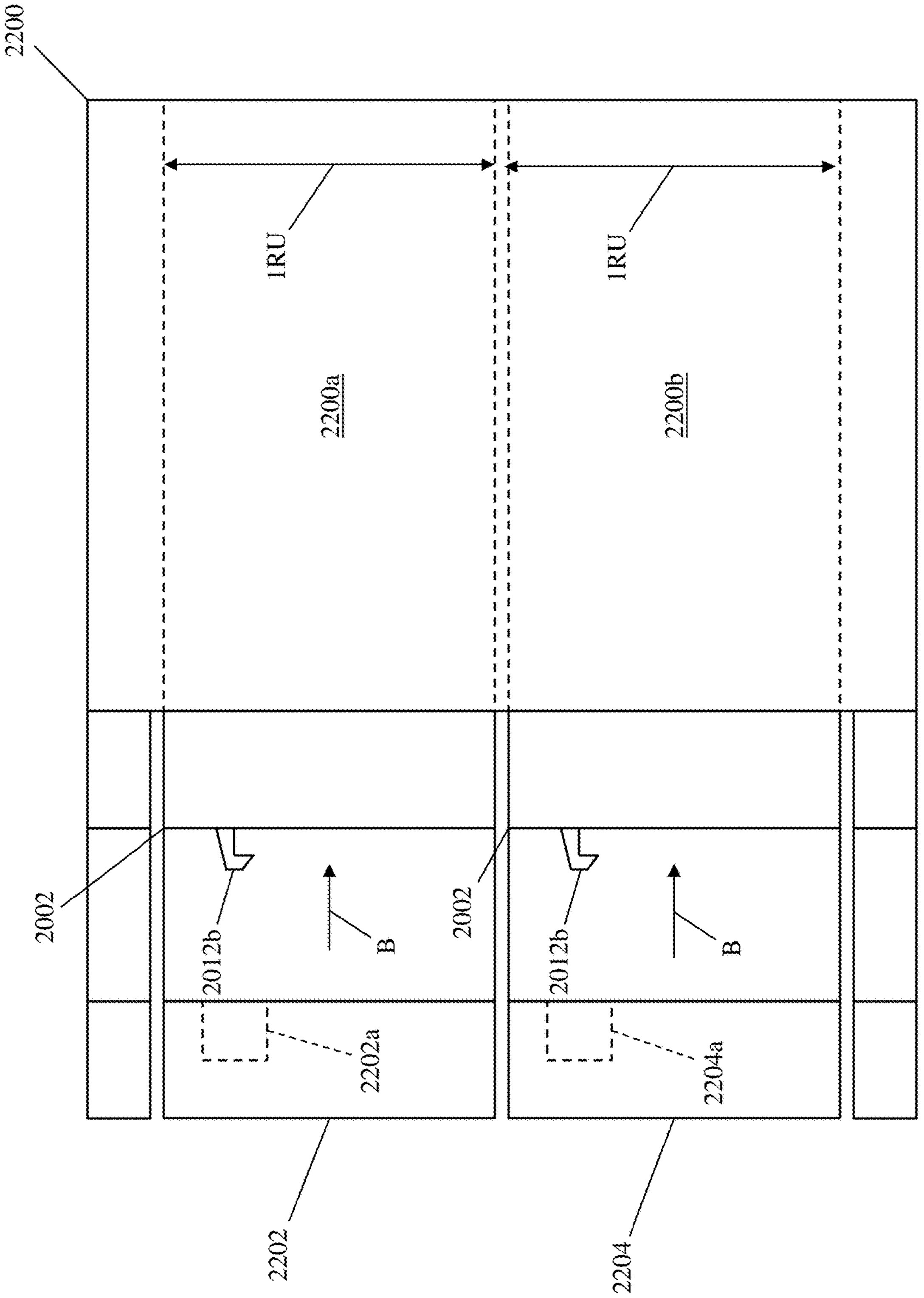
FIG. 22B is a side view illustrating an embodiment of 1RU devices being secured to the rack of FIG. 22A via the plurality of the multi-rack-unit-device rack coupling subsystems.
Figure 22C:
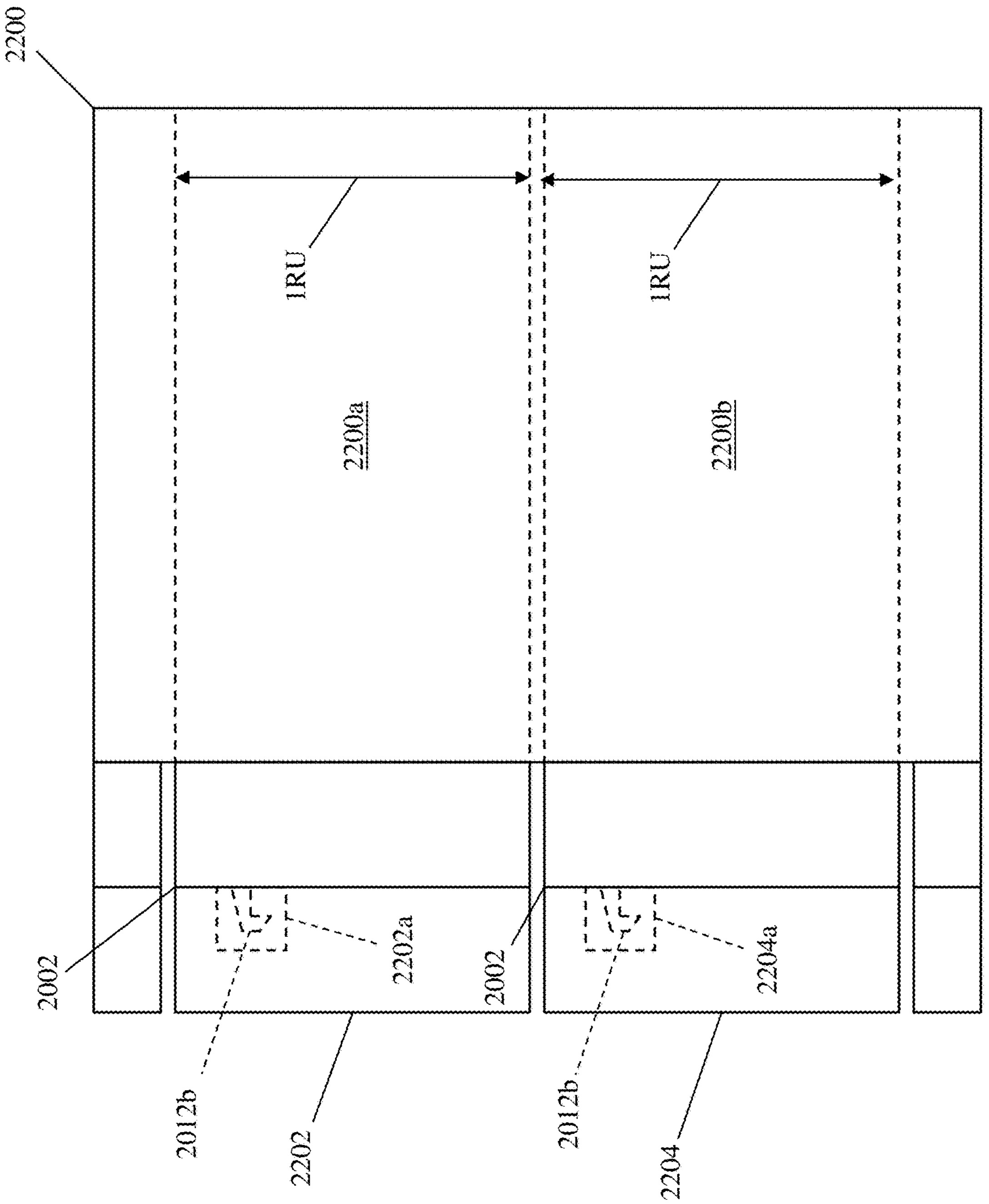
FIG. 22C is a side view illustrating an embodiment of 1RU devices secured to the rack of FIG. 22A via the plurality of the multi-rack-unit-device rack coupling subsystems.

The method 2100 then proceeds to block 2104 where multi-rack-unit-device subsystems couple 1RU devices to the rack. With reference to FIGS. 22B and 22C, in an embodiment of block 2104, a 1RU device 2202 may be positioned adjacent the multi-rack-unit-device rack coupling subsystem 2000 provided for the device housing 2200*a*, and then may be moved in a direction B and into the device housing 2200*a* such that device rails (not illustrated) on the 1RU device 2202 engage the rail member 2004 on the multi-rack-unit-device rack coupling subsystem 2000 provided for the device housing 2200*a*, with continued movement of the 1RU device 2202 in the direction B causing a securing subsystem 2202*a* (e.g., a "slam latch") on the 1RU device 2202 to engage the moveable device securing member 2012*b* on the multi-rack-unit-device rack coupling subsystem 2000 provided for the device housing 2200*a* in order to secure the 1RU device 2202 to the rack 2200. As will be appreciated by one of skill in the art in possession of the present disclosure, the securing subsystem 2202*a* on the 1RU device 2202 and the moveable device securing member

2012*b* on the multi-rack-unit-device rack coupling subsystem 2000 may be configured to engage each other without substantial movement of the moveable device securing member 2012*b* that would prevent the securing of the 1RU device 2202 to the rack 2200.

Similarly, a 1RU device 2204 may be positioned adjacent the multi-rack-unit-device rack coupling subsystem 2000 provided for the device housing 2200*b*, and then may be moved in the direction B and into the device housing 2200*b* such that device rails (not illustrated) on the 1RU device 2204 engage the rail member 204 on the multi-rack-unit-device rack coupling subsystem 2000 provided for the device housing 2200*b*, with continued movement of the 1RU device 2204 in the direction B causing a securing subsystem 2204*a* (e.g., a "slam latch") on the 1RU device 2204 to engage the moveable device securing member 2012*b* on the multi-rack-unit-device rack coupling subsystem 2000 provided for the device housing 2200*b* in order to secure the 1RU device 2204 to the rack 2200. Similarly as described above, one of skill in the art in possession of the present disclosure will recognize how the securing subsystem 2204*a* on the 1RU device 2204 and the moveable device securing member 2012*b* on the multi-rack-unit-device rack coupling subsystem 2000 may be configured to engage each other without substantial movement of the moveable device securing member 2012*b* that would prevent the securing of the 1RU device 2204 to the rack 2200.

As such, one of skill in the art in possession of the present disclosure will appreciate how each pair of multi-rack-unit-device rack coupling subsystems 2000 provided in the rack for a device housing may be used to couple a 1RU device to, and secure that 1RU device in, the rack 2200 similarly as described above. However, as discussed in further detail below, while 1RU devices are illustrated and described as being coupled to and secured in the rack 2200 in respective 1RU devices housings that are later used for a multi-RU device, one of skill in the art in possession of the present disclosure will appreciate how a multi-RU device may be provided in multiple 1RU device housings that do not currently have 1RU devices housed therein while remaining within the scope of the present disclosure as well.

The method 2100 then proceeds to decision block 2106 where the method 2100 may proceed depending on whether a multi-RU device is to be coupled to the rack. In this embodiment in which 1RU devices 2202 and 2204 are coupled to and secured in the rack 2200 in adjacent device housings 2200*a* and 2200*b* that are subsequently used to house a 2RU device, at decision block 2106 the method 2100 may proceed depending on whether a multi-RU device is to-be coupled to the rack 2200 (and those device housings 2200*a* and 2200*b* will be used to couple that multi-RU device to the rack 2200). If, at decision block 2106, no multi-RU device is to be coupled to the rack, the method 2100 returns to block 2104. As such, the method 2100 may loop such that the 1RU devices 2202 and 2204 remain in the device housings 2200*a* and 2200*b*, respectively, in the rack 2200 until those device housings 2200*a* and 2200*b* will be used to couple a multi-RU device to the rack 2200.

If, at decision block 2106, a multi-RU device is to be coupled to the rack, the method 2100 proceeds to block 2108 where the 1RU devices are removed from the multi-rack-unit-device rack coupling subsystems provided for adjacent 1RU rack housings to provide a multi-RU housing for the multi-RU device. In an embodiment, at block 2108, the 1RU devices 2202 and 2204 discussed above with reference to FIGS. 22B and 22C may be removed from the rack 2200 by releasing their securing subsystems 2202*a* and 2204*a*, respectively, from the moveable device securing member 2012*b* on the multi-rack-unit-device rack coupling subsystems 2000 provided for the device housings 2200*a* and 2200*b*, respectively (e.g., via a securing subsystem release mechanism, not illustrated), in order to "free up" a 2RU device housing in the rack 2200 provided by the device housings 2200*a* and 2200*b*.

Figure 23A:
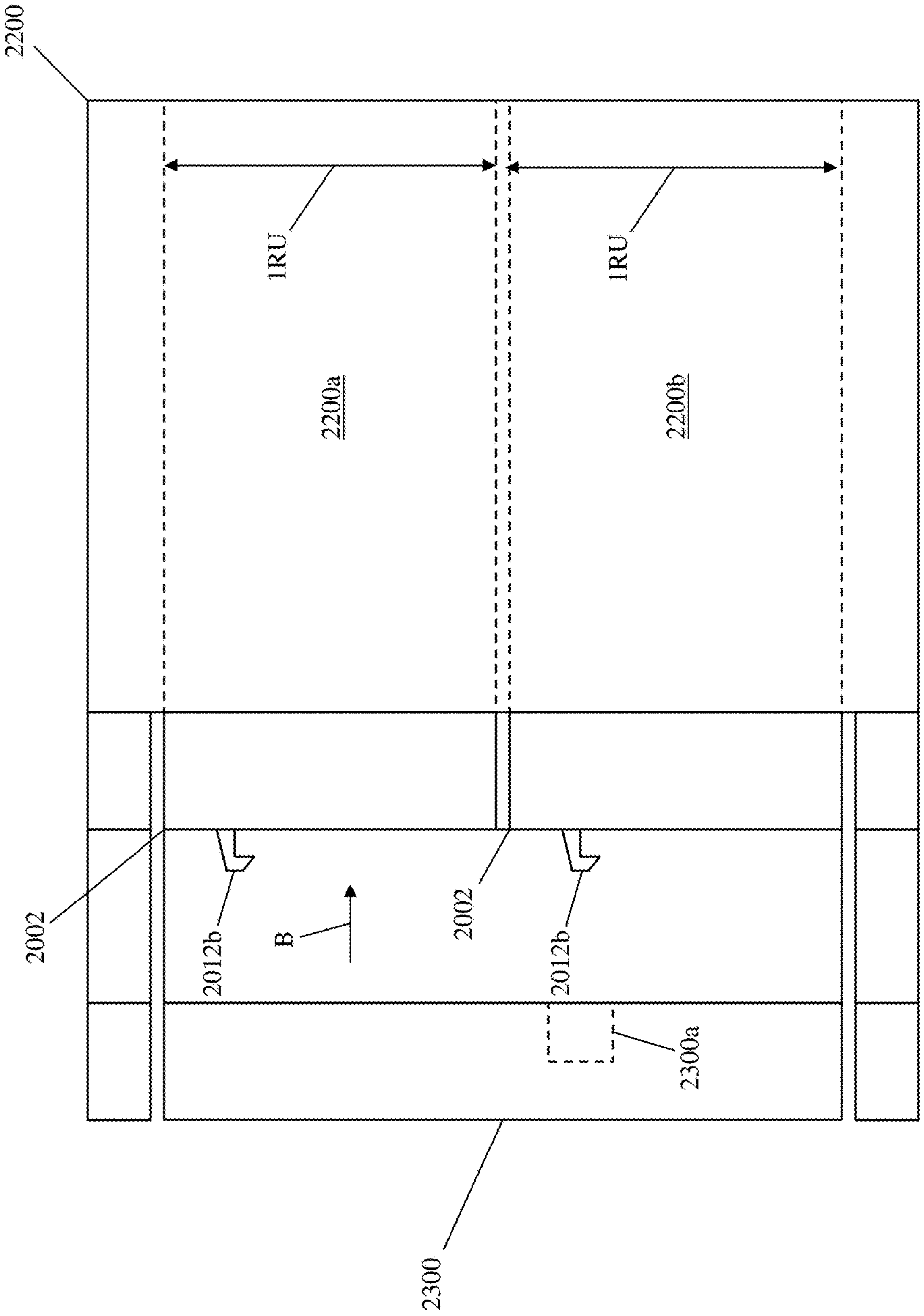
FIG. 23A is a side view illustrating an embodiment of a 2RU device being secured to the rack of FIG. 22A via one of the multi-rack-unit-device rack coupling subsystems.

The method 2100 then proceeds to block 2110 where the multi-RU device is moved into the rack. With reference to FIG. 23A, in an embodiment of block 2110, a 2RU device 2300 may be positioned adjacent the multi-rack-unit-device rack coupling subsystems 2000 provided for the device housings 2200*a* and 2200*b*, and then may be moved in the direction B and into the device housings 2200*a* and 2200*b* such that device rails (not illustrated) on the 2RU device 2300 engage the rail member 2004 on the multi-rack-unit-device rack coupling subsystems 2000 provided for the device housings 2200*a* and 2200*b*. However, while the multi-RU device is illustrated and described in the specific examples provided herein as a 2RU device, one of skill in the art in possession of the present disclosure will appreciate how the multi-RU device may include different RU devices heights (e.g., 3RU, 4RU, or more), and how additional multi-rack-unit-device rack coupling subsystems 2000 coupled to the rack 2200 in such situations may operate similarly to the multi-rack-unit-device rack coupling subsystem 2000 provided for the device housing 2200*a* (i.e., when those additional multi-rack-unit-device rack coupling subsystems 2000 are provided for device housings that are "above" the device housing 2200*a* illustrated in FIG. 23A) while remaining within the scope of the present disclosure as well.

Figure 23B:
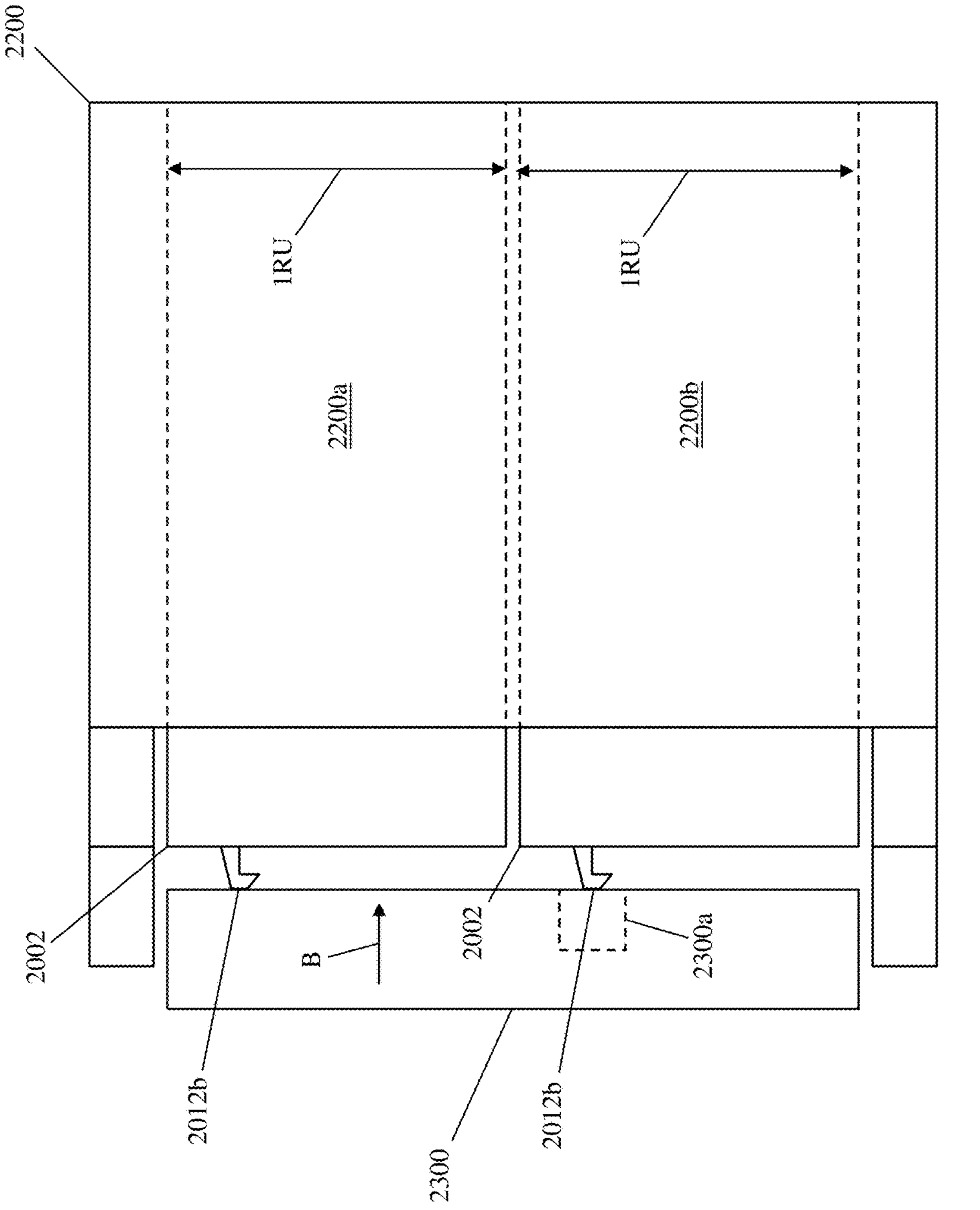
FIG. 23B is a side view illustrating an embodiment of a 2RU device being secured to the rack of FIG. 22 via one of the multi-rack-unit-device rack coupling subsystems.

The method 2100 then proceeds to block 2112 where one or more second moveable securing members on second multi-rack-unit-device rack coupling subsystems engage the multi-RU device and move to allow the multi-RU device to be secured to the rack. With reference to FIGS. 23A and 23B, in an embodiment of block 2112, continued movement of the 2RU device 2300 in the direction B may cause a securing subsystem 2300*a* (e.g., a "slam latch") on the 2RU device 2300 to be positioned immediately adjacent the moveable device securing member 2012*b* on the multi-rack-unit-device rack coupling subsystem 2000 provided for the device housing 2200*b* when the moveable device securing member 2012*b* on the multi-rack-unit-device rack coupling subsystem 2000 provided for the device housing 2200*a* engages the 2RU device 2300.

Furthermore, as described above, one of skill in the art in possession of the present disclosure will appreciate how multi-RU devices greater than 2RU will engage a moveable device securing member 2012*b* on multi-rack-unit-device rack coupling subsystem(s) 2000 provided for device housings that are "above" the device housing 2200*a* on the rack 2200 in FIG. 23B, with a 3RU device engaging a moveable device securing member 2012*b* on a single multi-rack-unit-device rack coupling subsystem 2000 provided for a single device housing that is "above" the device housing 2200*a* on the rack 2200 in FIG. 23B, a 4RU device engaging respective moveable device securing members 2012*b* on a pair of multi-rack-unit-device rack coupling subsystems 2000 provided for a respective pair of device housings that are "above" the device housing 2200*a* on the rack 2200 in FIG. 23B, and so on.

Figure 24A:
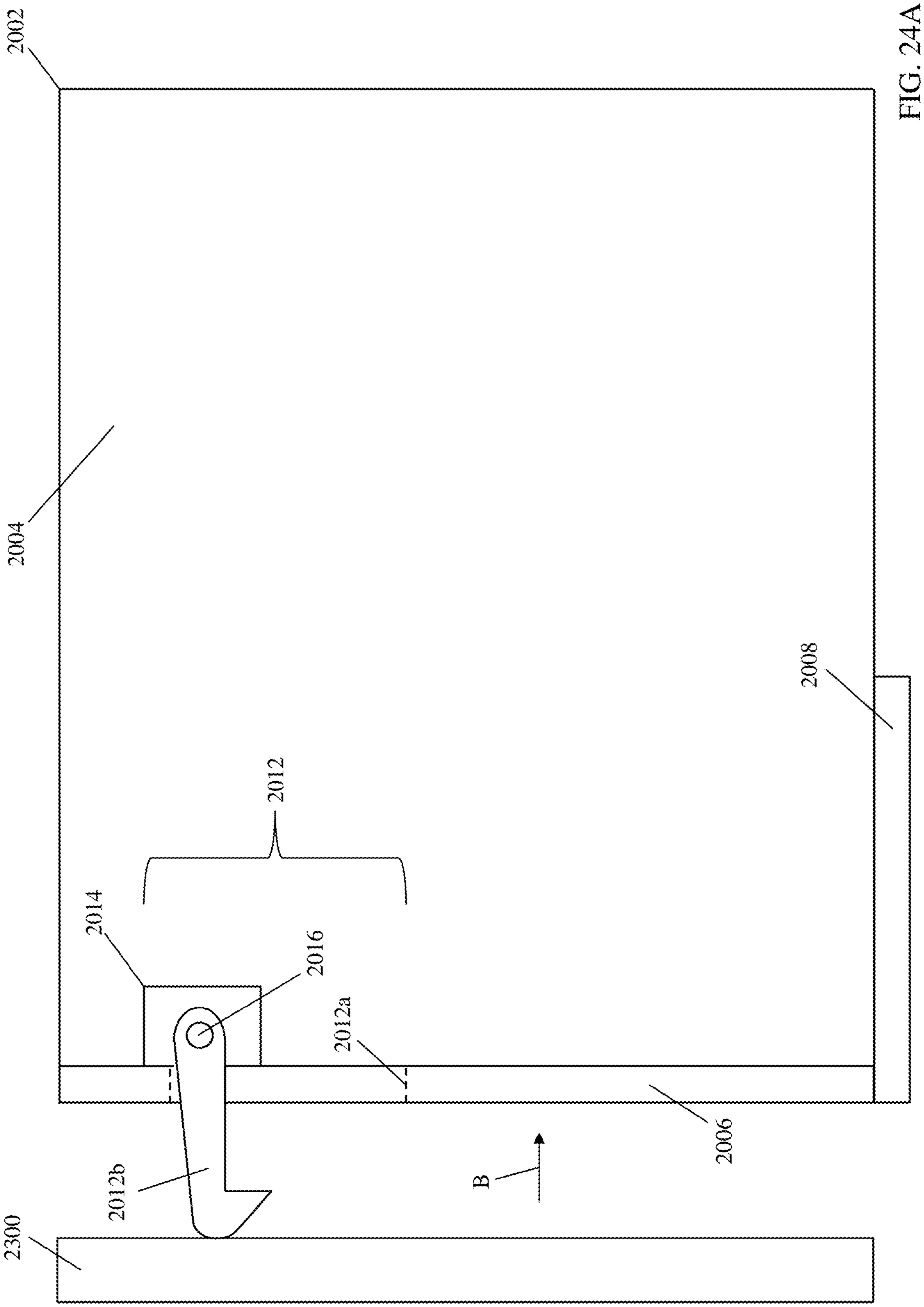
FIG. 24A is a side view illustrating an embodiment of the moveable device securing member of FIG. 20B being engaged by the 2RU device that is being secured to the rack in FIGS. 23A and 23B.
Figure 24B:
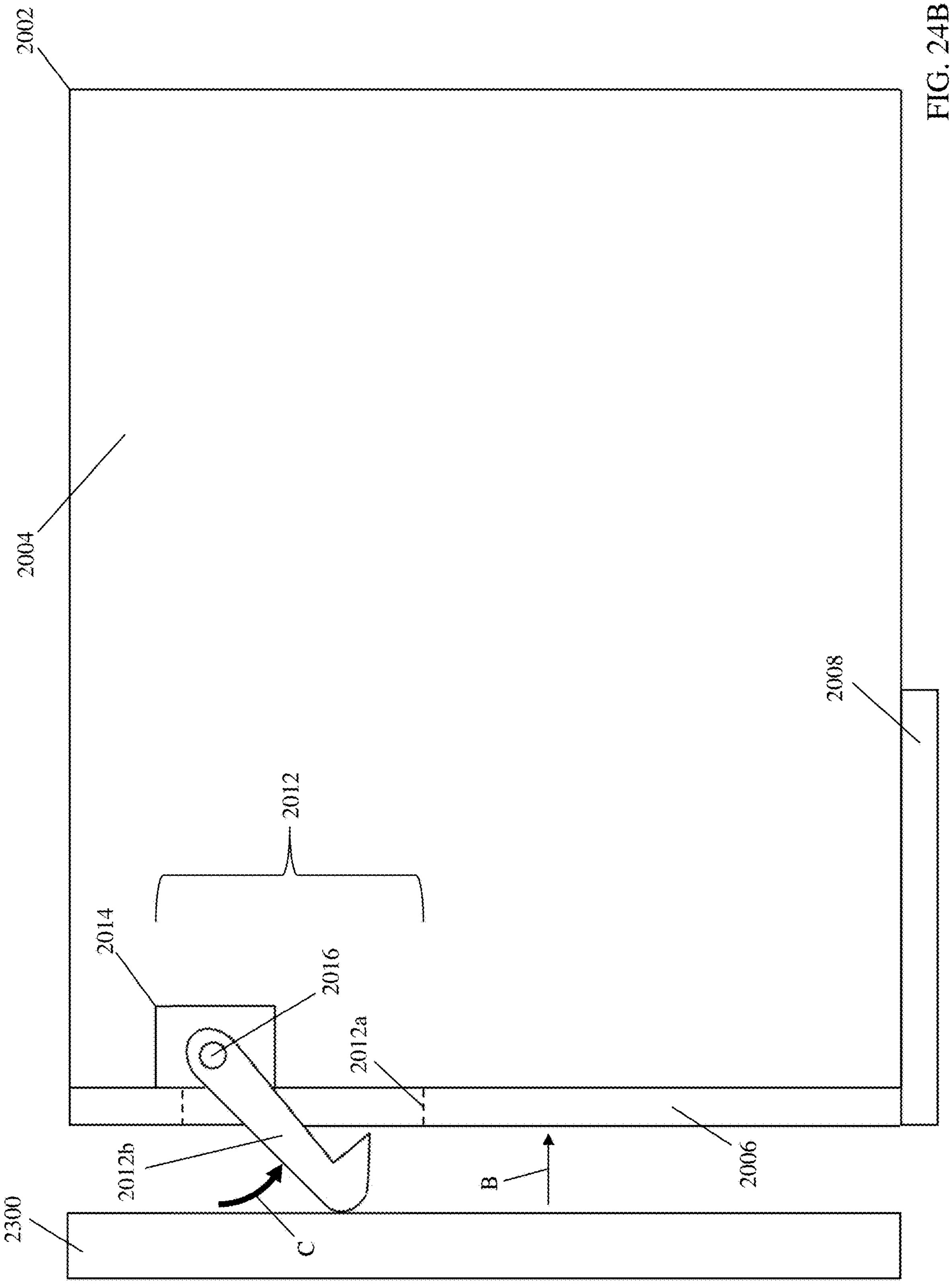
FIG. 24B is a side view illustrating an embodiment of the moveable device securing member of FIG. 20B moving in response to engagement with the 2RU device that is being secured to the rack in FIGS. 23A and 23B.
Figure 25A:
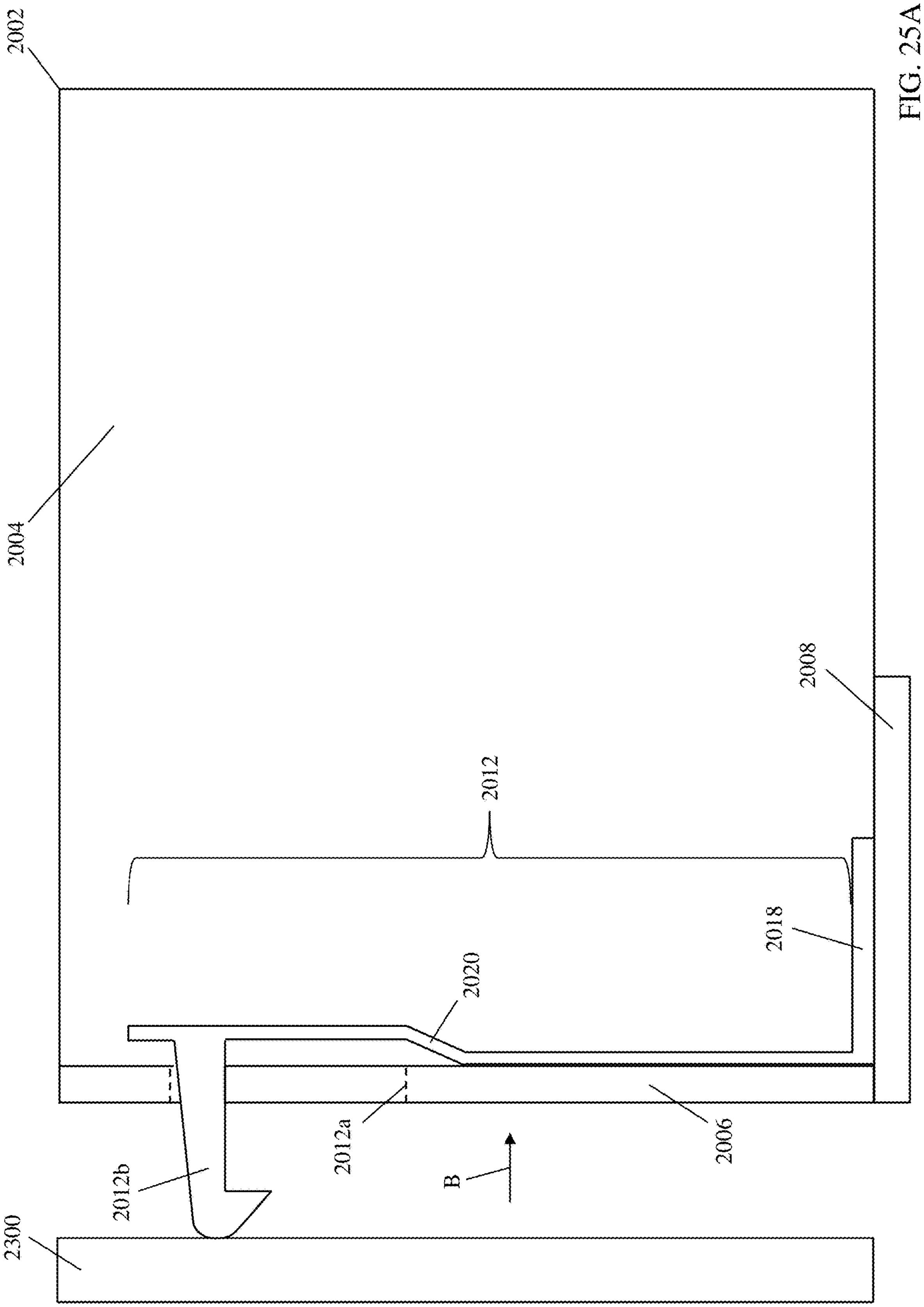
FIG. 25A is a side view illustrating an embodiment of the moveable device securing member of FIG. 20C being engaged by the 2RU device that is being secured to the rack in FIGS. 23A and 23B.
Figure 25B:
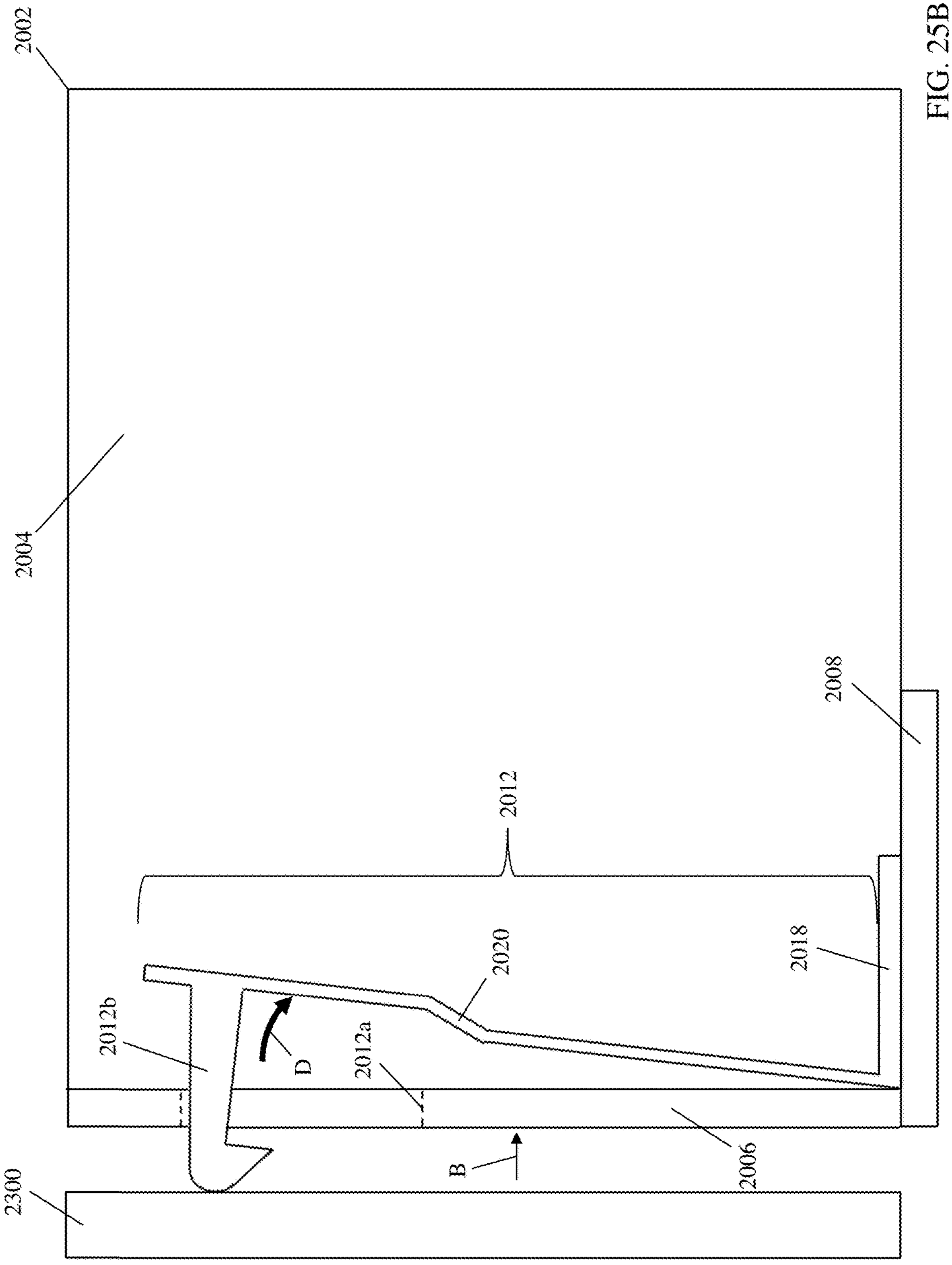
FIG. 25B is a side view illustrating an embodiment of the moveable device securing member of FIG. 20*c* moving in response to engagement with the 2RU device that is being secured to the rack in FIGS. 23A and 23B.

With reference to FIGS. 23B, 24A, and 24B, in an embodiment of block 2112, the engagement of the 2RU device 2300 with the moveable device securing member 2012*b* on the multi-rack-unit-device rack coupling subsystem 2000 provided for the device housing 2200*a*, along with the continued movement of the 2RU device 2300 in the direction B, will cause that moveable device securing member 2012*b* to rotate about the rotatable coupling element 2016 in a direction C and into the moveable device securing member aperture 2012*a*. Similarly, with reference to FIGS. 23B, 25A, and 25B, in an embodiment of block 2112, the engagement of the 2RU device 2300 with the moveable device securing member 2012*b* on the multi-rack-unit-device rack coupling subsystem 2000 provided for the device housing 2200*a*, along with the continued movement of the 2RU device 2300 in the direction B, will cause the moveable device securing member 2012*b* to deflect via the deflectable coupling element 2020 in a direction D and into the moveable device securing member aperture 2012*a*. However, while two specific examples have been provided, one of skill in the art in possession of the present disclosure will appreciate how the moveable device securing member 2012*b* on the multi-rack-unit-device rack coupling subsystem 2000 provided for the device housing 2200*a* may be configured to move in response to engagement with the 2RU device 2300 in a variety of manners that will fall within the scope of the present disclosure as well.

Figure 26:
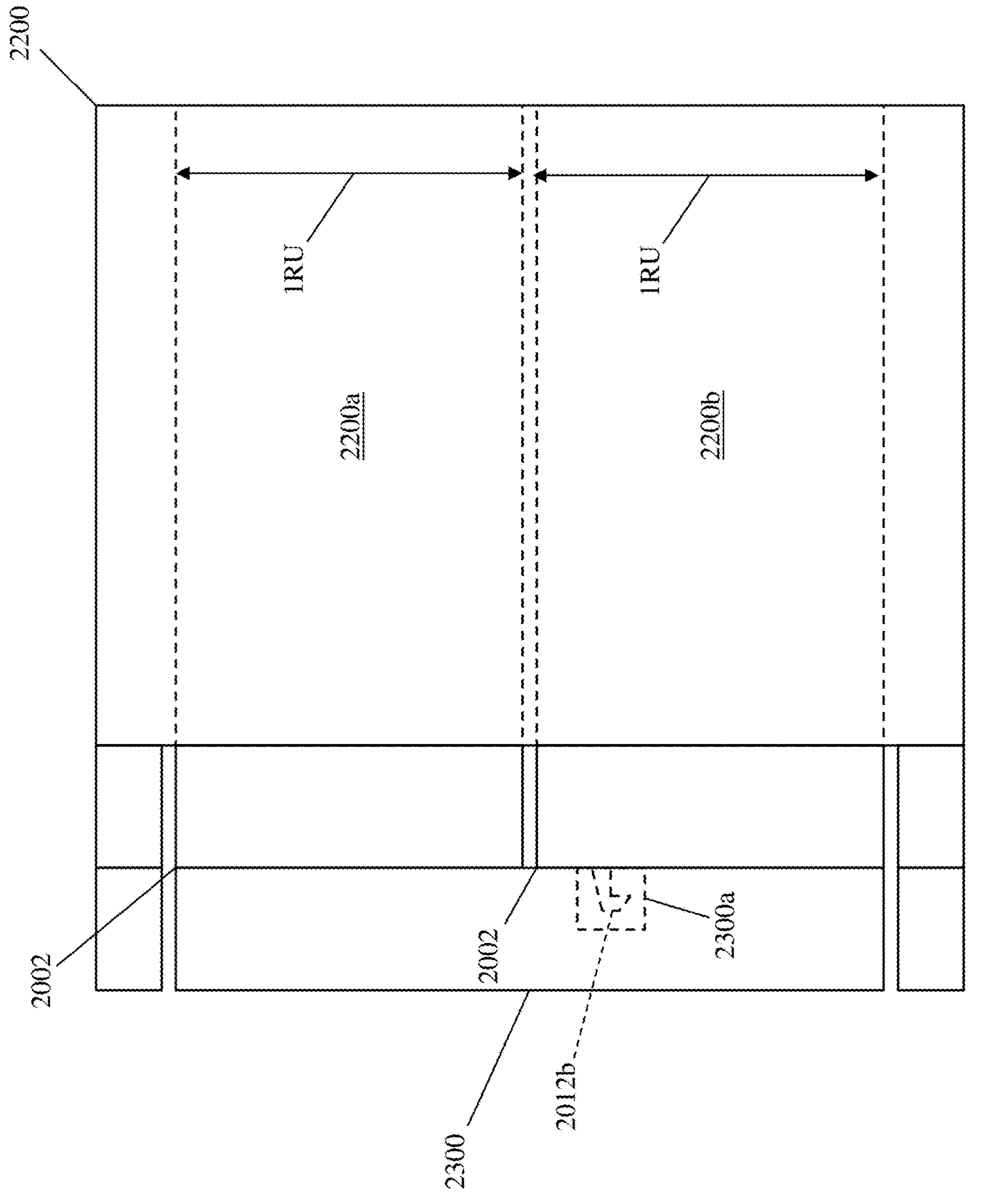
FIG. 26 is a side view illustrating an embodiment of a 2RU device secured to the rack of FIG. 22 via one of the multi-rack-unit-device rack coupling subsystems.

The method 2100 then proceeds to block 2114 where a first moveable securing member on a first multi-rack-unit-device rack coupling subsystem engages a securing subsystem on the multi-RU device to secure the multi-RU device to the rack. With reference to FIG. 26, in an embodiment of block 2114 and in response to continued movement of the 2RU device 2300 in the direction B, the moveable device securing member 2012*b* on the multi-rack-unit-device rack coupling subsystem 2000 provided for the device housing 2200*b* will engage the securing subsystem 2300*a* (e.g., a “slam latch”) on the 2RU device 2300 to secure the 2RU device 2300 to the rack 2200.

Figure 27:
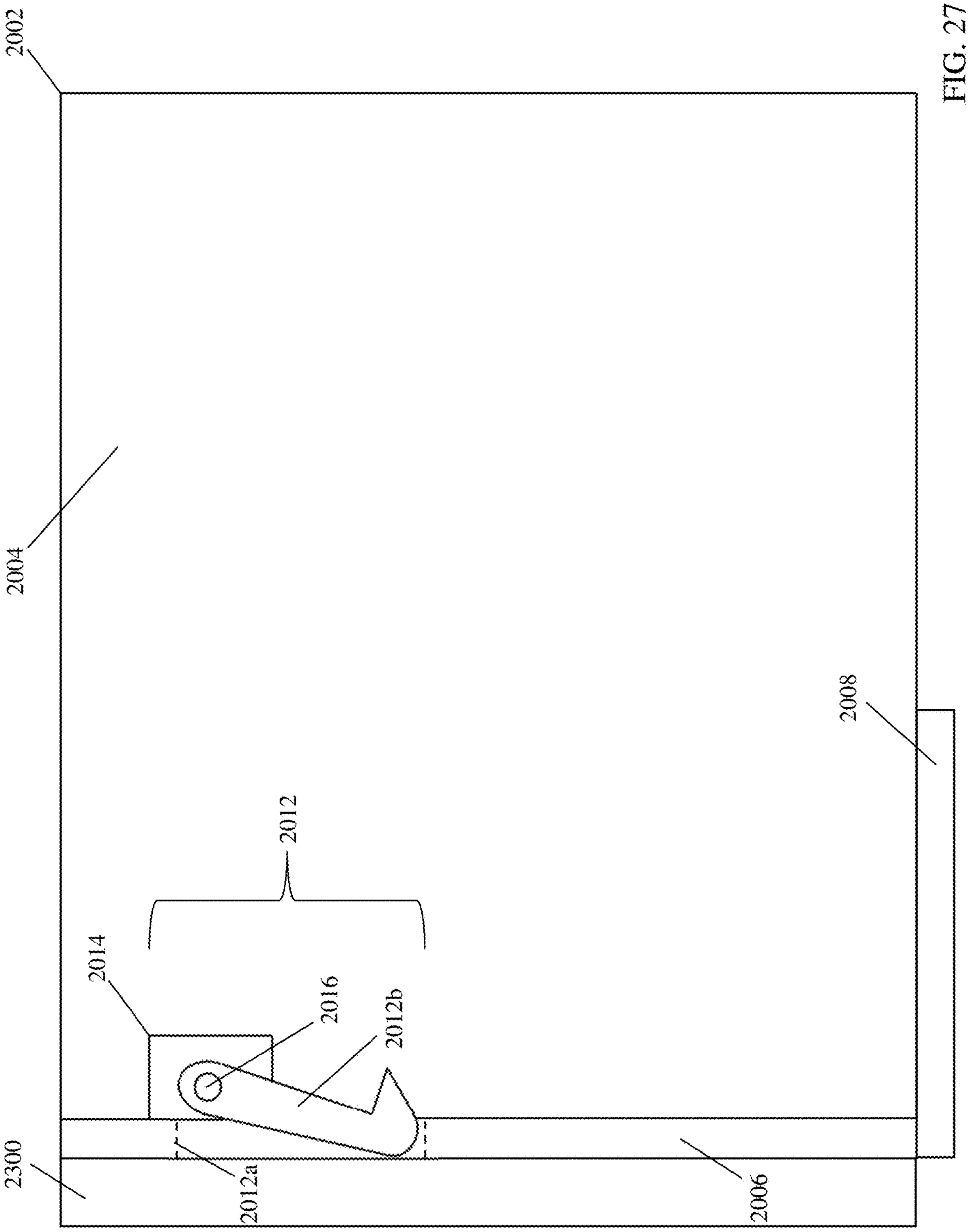
FIG. 27 is a side view illustrating an embodiment of the moveable device securing member of FIG. 20B moved in response to engagement with the 2RU device that is secured to the rack in FIG. 26.

Furthermore, as can be seen in FIGS. 26 and 27, the engagement of the 2RU device 2300 with the moveable device securing member 2012*b* on the multi-rack-unit-device rack coupling subsystem 2000 provided for the device housing 2200*a* will continue to move that moveable device securing member 2012*b* (e.g., via rotation about the rotatable coupling element 2016) through the moveable device securing member aperture 2012*a* (until that moveable device securing member 2012*b* is flush with a surface of the front plate 2006 in the illustrated example) such that the 2RU device 2300 may be secured to the rack 2200 by the moveable device securing member 2012*b* on the multi-rack-unit-device rack coupling subsystem 2000 provided for the device housing 2200*b* as described above.

Figure 28:
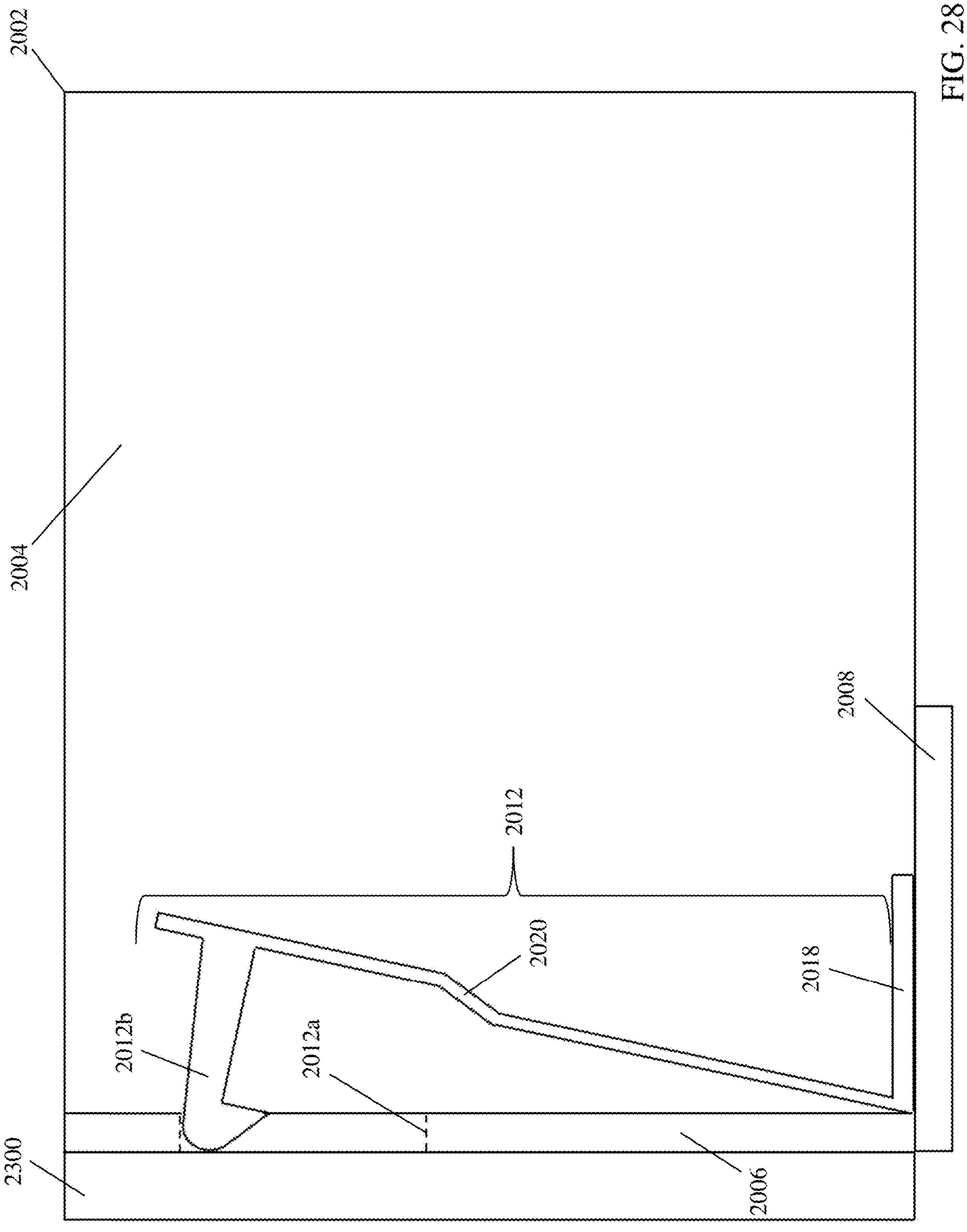
FIG. 28 is a side view illustrating an embodiment of the moveable device securing member of FIG. 20C moved in response to engagement with the 2RU device that is secured to the rack in FIG. 26.

Similarly, as can be seen in FIGS. 26 and 28, the engagement of the 2RU device 2300 with the moveable device securing member 2012*b* on the multi-rack-unit-device rack coupling subsystem 2000 provided for the device housing 2200*a* will continue move that moveable device securing member 2012*b* (e.g., via deflection of the deflectable coupling element 2020) through the moveable device securing member aperture 2012*a* (until that moveable device securing member 2012*b* is flush with a surface of the front plate 2006 in the illustrated example) such that the 2RU device 2300 may be secured to the rack 2200 by the moveable device securing member 2012*b* on the multi-rack-unit-device rack coupling subsystem 2000 provided for the device housing 2200*b* as described above. However, while two specific examples of the movement of the moveable device securing member 2012*b* to allow the 2RU device 2300 to be secured to the rack 2200 have been illustrated and described, one of skill in the art in possession of the present disclosure will appreciate how multi-RU devices may be allowed to be secured to a rack according to the teachings of the present disclosure via a variety of moveable device securing member movement while remaining within the scope of the present disclosure as well.

As will be appreciated by one of skill in the art in possession of the present disclosure, following the securing of the 2RU device 2300 to the rack 2200, the 2RU device 2300 may be removed from the rack 2200 by releasing its securing subsystem 2300*a* from the moveable device securing member 2012*b* on the multi-rack-unit-device rack coupling subsystems 2000 provided for the device housing 2200*b* (e.g., via a securing subsystem release mechanism, not illustrated) and moving it opposite the direction B and out of the device housings 2200*a* and 2200*b*. As will be appreciated by one of skill in the art in possession of the present disclosure, the biasing of the moveable device securing member 2012*b* on the multi-rack-unit-device rack coupling subsystem 2000 into the extended orientation discussed above will cause the moveable device securing member 2012*b* on the multi-rack-unit-device rack coupling subsystem 2000 provided for the device housing 2200*b* to extend back through the moveable device securing member aperture 2012*a* and from the front plate 2006 as illustrated in FIGS. 20A, 20B, and 20C when the 2RU device is removed from the rack 2200. As such, 1RU devices, 2RU devices, and/or larger rack height devices (e.g., 3RU devices, 4RU devices, etc.) may subsequently be coupled to and secured in the rack 2300 similarly as described above.

Thus, systems and methods have been described that provide securing members on rack coupling subsystems that are configured to move in response to engagement with multi-rack-unit devices, thus allowing any securing member on a rack coupling subsystem provided for a first device housing in a rack to engage a securing subsystem on a 1RU device to secure that 1RU device to the rack in that first device housing, and move in response to engagement with a multi-RU device when that multi-RU device is configured to be secured to the rack by a securing member on a rack coupling subsystem provided for a second device housing in the rack. As such, a rack provided with a plurality of the multi-rack-unit-device rack coupling subsystems of the present disclosure may have 1RU or multi-RU devices secured thereto without requiring the removal of any of the multi-rack-unit-device rack coupling subsystem. To provide a specific example, the multi-device rack width adapter base 400 discussed above may be provided to a user with a plurality of the multi-rack-unit-device rack coupling subsystems 2000 discussed above mounted thereto, allowing the user to quickly and easily mount that multi-device rack width adapter base 400 to the rack 200, and then couple 1RU or multi-RU devices to the rack 200 using those multi-rack-unit-device rack coupling subsystems 2000, eliminating the time and effort needed to configure the rack to house different height devices, and eliminating the need have different rack coupling systems (e.g., the 1RU rack rails and 2RU rack rails described above) for different height devices.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A multi-rack-unit-device rack coupling system, comprising:
  a rack defining a first 1 Rack Unit (1RU) device housing and a second 1RU device housing that is located immediately adjacent the first 1RU device housing;
  a first multi-rack-unit-device rack coupling subsystem that is coupled to the rack adjacent the first 1RU device housing, wherein the first multi-rack-unit-device rack coupling subsystem includes:
    a first moveable latching member; and
    a first spring subsystem that biases a first latching portion of the first moveable latching member to extend from the first multi-rack-unit-device rack coupling subsystem, wherein the first latching portion of the first moveable latching member is configured to engage a securing subsystem on a multi-Rack Unit (multi-RU) device to latch the multi-RU device to the rack when the multi-RU device is moved into the first 1RU device housing and the second 1RU device housing; and
  a second multi-rack-unit-device rack coupling subsystem that is coupled to the rack adjacent the second 1RU device housing, wherein the second multi-rack-unit-device rack coupling subsystem includes:
    a second moveable latching member; and
    a second spring subsystem that biases a second latching portion of the second moveable latching member to extend from the second multi-rack-unit-device rack coupling subsystem, wherein the second moveable latching member is configured, in response to engagement of the second latching portion with the multi-RU device when the multi-RU device is moved into the first 1RU device housing and the second 1RU device housing, to move such that the second latching portion no longer extends from the second multi-rack-unit-device rack coupling subsystem and allow the multi-RU device to be latched to the rack via the first moveable latching member on the first multi-rack-unit-device rack coupling subsystem.

2. The multi-rack-unit-device rack coupling system of claim 1, wherein the multi-RU device is a 2 Rack Unit (2RU) device.

3. The multi-rack-unit-device rack coupling system of claim 1, wherein the rack defines a third 1RU device housing that is located immediately adjacent the second 1RU device housing and the multi-RU device includes a device height that is greater than 2RU, and wherein the multi-rack-unit-device rack coupling system further comprises:
  a third multi-rack-unit-device rack coupling subsystem that is coupled to the rack adjacent the third 1RU device housing, wherein the third multi-rack-unit-device rack coupling subsystem includes:
    a third moveable device securing member; and
    a third spring subsystem that biases a third latching portion of the third moveable latching member to extend from the third multi-rack-unit-device rack coupling subsystem, wherein the third moveable latching member is configured, in response to engagement of the third latching portion with the multi-RU device when the multi-RU device is moved into the first 1RU device housing, the second 1RU device housing, and the third 1RU device housing, to move such that the third latching portion no longer extends from the third multi-rack-unit-device rack coupling subsystem and allow the multi-RU device to be latched to the rack via the first moveable latching member on the first multi-rack-unit-device rack coupling subsystem.

4. The multi-rack-unit-device rack coupling system of claim 1, wherein the second latching portion of the second moveable device securing member on the second multi-rack-unit-device rack coupling subsystem is configured, following the removal of the multi-RU device from the first 1RU device housing and the second 1RU device housing, to engage a securing subsystem on a 1RU device to latch the 1RU device to the rack when the 1RU device is moved into the second 1RU device housing.

5. The multi-rack-unit-device rack coupling system of claim 1, wherein the first multi-rack-unit-device rack coupling subsystem provides a first slam-latch, and the second multi-rack-unit-device rack coupling subsystem provides a second slam-latch.

6. The multi-rack-unit-device rack coupling system of claim 1, wherein the first spring system and the second spring system each includes a torsion spring.

7. The multi-rack-unit-device rack coupling system of claim 1, wherein the first spring system and the second spring system each includes a flat spring.

8. A multi-rack-unit-device rack coupling subsystem, comprising:
  a base;
  a rack coupling subsystem that is provided on the base and that is configured to couple the base to a rack;
  a latching member aperture defined by the base;
  a moveable latching member that extends from the base via the latching member aperture; and
  a spring subsystem that biases a latching portion of the moveable latching member to extend from the latching member aperture, wherein the moveable latching member is configured, when the base is coupled to the rack adjacent a first 1 Rack Unit (1RU) device housing that is defined by the rack immediately adjacent a second 1RU device housing that is defined by the rack, to:
    engage and latch to a securing subsystem on a 1RU device to secure the 1RU device to the rack when the 1RU device is moved into the first 1RU device housing;
    engage and latch to a securing subsystem on a first multi-Rack Unit (multi-RU) device to secure the first multi-RU device to the rack when the first multi-RU device is moved into the first 1RU device housing and the second 1RU device housing with the securing subsystem on the first multi-RU device located in the first 1RU device housing; and
    move, in response to engagement of the latching portion with a second multi-RU device when the second multi-RU device is moved into the first 1RU device housing and the second 1RU device housing with a securing subsystem on the second multi-RU device located in the second 1RU device housing, such that the latching portion no longer extends from the base via the latching member aperture and allows the second multi-RU device to be latched to the rack.

9. The multi-rack-unit-device rack coupling subsystem of claim 8, wherein the multi-RU device is a 2 Rack Unit (2RU) device.

10. The multi-rack-unit-device rack coupling subsystem of claim 8, wherein the moveable latching member provides a slam-latch.

11. The multi-rack-unit-device rack coupling subsystem of claim 8, wherein the spring system includes a torsion spring.

12. The multi-rack-unit-device rack coupling subsystem of claim 8, wherein the spring system includes a flat spring.

13. The multi-rack-unit-device rack coupling subsystem of claim 8, wherein the base includes a rack rail that is configured to receive a device rail on the 1RU device.

14. A method for coupling multiple-rack-unit-devices to a rack, comprising:

engaging and latching, by a first latching portion of a first moveable latching member that is biased by a first spring system to extend from a first multi-rack-unit-device rack coupling system that is coupled to a rack adjacent a first 1 Rack Unit (1RU) device housing defined by the rack immediately adjacent a second 1RU device housing defined by the rack, to a securing subsystem on a 1RU device to secure the 1RU device to the rack when the 1RU device is moved into the first 1RU device housing;

disengaging, by the first latching portion of the first moveable latching member that is biased by the first spring system to extend from the first multi-rack-unit-device rack coupling system, the securing subsystem on the 1RU device to release the 1RU device from the rack to allow the 1RU device to be removed from the first 1RU device housing; and moving, by the first moveable latching member on the first multi-rack-unit-device rack coupling system in response to engagement of the first latching portion with a multi-RU device when the multi-RU device is moved into the first 1RU device housing and the second 1RU device housing with a securing subsystem on the multi-RU device located in the second 1RU device housing, such that first latching portion of the first moveable latching member no longer extends from the first multi-rack-unit-device rack coupling system and allows the multi-RU device to be latched to the rack.

15. The method of claim 14, further comprising:

engaging and latching, by a second latching portion of a second moveable latching member that is biased by a second spring system to extend from a second multi-rack-unit-device rack coupling system that is coupled to a rack adjacent the second 1RU device housing defined by the rack, to the securing subsystem on the multi-RU device to secure the multi-RU device to the rack when the multi-RU device is moved into the first 1RU device housing and the second 1RU device housing with the securing subsystem on the multi-RU device located in the second 1RU device housing.

16. The method of claim 14, wherein the multi-RU device is a 2 Rack Unit (2RU) device.

17. The method of claim 14, wherein the first moveable latching member provides a slam-latch.

18. The method of claim 17, wherein the spring system includes a torsion spring.

19. The method of claim 17, wherein the spring system includes a flat spring.

20. The method of claim 14, wherein the first multi-rack-unit-device rack coupling system includes a rack rail that is configured to receive a device rail on the 1RU device.

* * * * *